(12) United States Patent
Son et al.

(10) Patent No.: US 11,158,716 B2
(45) Date of Patent: Oct. 26, 2021

(54) SEMICONDUCTOR DEVICE AND METHOD FOR MANUFACTURING THE SAME

(71) Applicant: SAMSUNG ELECTRONICS CO., LTD., Suwon-si (KR)

(72) Inventors: Nakjin Son, Suwon-si (KR); Seungjoon Lee, Suwon-si (KR); Bong Seob Yang, Suwon-si (KR); Doyoung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/901,207

(22) Filed: Jun. 15, 2020

(65) Prior Publication Data

US 2021/0126102 A1 Apr. 29, 2021

(30) Foreign Application Priority Data

Oct. 25, 2019 (KR) .................. 10-2019-0133518

(51) Int. Cl.
*H01L 29/49* (2006.01)
*H01L 27/092* (2006.01)
(Continued)

(52) U.S. Cl.
CPC .... *H01L 29/4908* (2013.01); *H01L 21/02194* (2013.01); *H01L 21/02532* (2013.01);
(Continued)

(58) Field of Classification Search
CPC ............ H01L 29/4908; H01L 29/067; H01L 29/42364; H01L 29/42376; H01L 29/42392; H01L 29/512; H01L 29/517; H01L 29/66545; H01L 29/66553; H01L 29/66742; H01L 29/78696; H01L 27/092; H01L 21/02194; H01L 21/02532; H01L 21/02603; H01L 21/28185; H01L 21/823807; H01L 21/823857; H01L 21/823864
(Continued)

(56) References Cited

U.S. PATENT DOCUMENTS 7,867,839 B2 1/2011 Chen et al.
7,972,950 B2 7/2011 Na et al.
(Continued)

*Primary Examiner* — Tong-Ho Kim
(74) *Attorney, Agent, or Firm* — F. Chau & Associates, LLC

(57) ABSTRACT

A semiconductor device include a substrate including a peripheral region, a first active pattern provided on the peripheral region of the substrate, the first active pattern having an upper portion including first semiconductor patterns and second semiconductor patterns which are alternately stacked, a first gate electrode intersecting the first active pattern, a pair of first source/drain patterns provided at both sides of the first gate electrode, respectively, and a first gate insulating layer disposed between the first gate electrode and the first active pattern. The first gate insulating layer includes a first insulating layer formed on the first active pattern, a second insulating layer formed on the first insulating layer, and a high-k dielectric layer formed on the second insulating layer. The first gate insulating layer contains a first dipole element including lanthanum (La), aluminum (Al), or a combination thereof.

20 Claims, 51 Drawing Sheets

(51) Int. Cl.
H01L 29/06 (2006.01)
H01L 29/423 (2006.01)
H01L 29/51 (2006.01)
H01L 29/786 (2006.01)
H01L 21/02 (2006.01)
H01L 21/28 (2006.01)
H01L 21/8238 (2006.01)
H01L 29/66 (2006.01)

(52) U.S. Cl.
CPC .. *H01L 21/02603* (2013.01); *H01L 21/28185* (2013.01); *H01L 21/823807* (2013.01); *H01L 21/823857* (2013.01); *H01L 21/823864* (2013.01); *H01L 27/092* (2013.01); *H01L 29/0673* (2013.01); *H01L 29/42364* (2013.01); *H01L 29/42376* (2013.01); *H01L 29/42392* (2013.01); *H01L 29/516* (2013.01); *H01L 29/517* (2013.01); *H01L 29/66545* (2013.01); *H01L 29/66553* (2013.01); *H01L 29/66742* (2013.01); *H01L 29/78696* (2013.01)

(58) Field of Classification Search
USPC .......................................................... 257/295
See application file for complete search history.

(56) References Cited

U.S. PATENT DOCUMENTS

| | | | |
|---|---|---|---|
| 8,293,599 B2 | 10/2012 | Na et al. | |
| 8,785,267 B2 | 7/2014 | Baek et al. | |
| 9,281,310 B2 | 3/2016 | Ji et al. | |
| 10,243,054 B1 | 3/2019 | Cheng et al. | |
| 2010/0327366 A1* | 12/2010 | Manabe | H01L 21/823842 257/369 |
| 2010/0327396 A1* | 12/2010 | Park | H01L 27/11526 257/506 |
| 2019/0148237 A1* | 5/2019 | Wang | H01L 29/4966 257/288 |
| 2021/0057288 A1* | 2/2021 | Jeon | H01L 29/78696 |
| 2021/0066289 A1* | 3/2021 | Noh | H01L 23/53238 |

* cited by examiner

SEMICONDUCTOR DEVICE AND METHOD FOR MANUFACTURING THE SAME

CROSS-REFERENCE TO RELATED APPLICATION

This U.S. non-provisional patent application claims priority under 35 U.S.C. § 119 to Korean Patent Application No. 10-2019-0133518, filed on Oct. 25, 2019, in the Korean Intellectual Property Office, the disclosure of which is herein incorporated by reference in its entirety.

TECHNICAL FIELD

Exemplary embodiments of the present inventive concept relate to a semiconductor device and a method for manufacturing the same, and more particularly, to a semiconductor device including a field effect transistor and a method for manufacturing the same.

DISCUSSION OF RELATED ART

Metal-oxide-semiconductor field effect transistors (MOSFETs) are widely used semiconductor devices in very large scale integrated circuits. As the semiconductor devices become increasingly integrated with the advancement of the electronic industry, the MOSFETs have been scaled down in accordance with the reduced design rule of the semiconductor devices. Operating characteristics of the semiconductor devices may be deteriorated by the reduction in size of the MOSFETs. Accordingly, various methods for forming semiconductor devices which have excellent performance while overcoming limitations by the high integration have been studied.

SUMMARY

Exemplary embodiments of the present inventive concept may provide a semiconductor device with enhanced electrical characteristics and a method for manufacturing the same.

In an aspect, a semiconductor device may include a substrate including a peripheral region, a first active pattern provided on the peripheral region of the substrate, the first active pattern having an upper portion including first semiconductor patterns and second semiconductor patterns which are alternately stacked, a first gate electrode intersecting the first active pattern, a pair of first source/drain patterns provided at both sides of the first gate electrode, respectively, and a first gate insulating layer disposed between the first gate electrode and the first active pattern. The first gate insulating layer may include a first insulating layer formed on the first active pattern, a second insulating layer formed on the first insulating layer, and a high-k dielectric layer formed on the second insulating layer. The first gate insulating layer may contain a first dipole element including lanthanum (La), aluminum (Al), or a combination thereof. A concentration of the first dipole element in the first gate insulating layer may increase from an interface between the first gate electrode and the high-k dielectric layer toward the second insulating layer, may reach a maximum value, and then, may decrease toward an interface between the first insulating layer and an adjacent one of the first semiconductor patterns.

In an aspect, a semiconductor device may include a substrate including a first region and a second region, a first active pattern and a second active pattern provided on the first region and the second region of the substrate, respectively, a first gate electrode and a second gate electrode intersecting the first active pattern and the second active pattern, respectively, a first gate insulating layer disposed between the first gate electrode and the first active pattern, and a second gate insulating layer disposed between the second gate electrode and the second active pattern. The first gate insulating layer may contain a first dipole element including lanthanum (La), aluminum (Al), or a combination thereof. The second gate insulating layer may contain a second dipole element including lanthanum (La) or aluminum (Al). A thickness of the first gate insulating layer may be greater than a thickness of the second gate insulating layer. A maximum concentration of the first dipole element in the first gate insulating layer may be greater than a maximum concentration of the second dipole element in the second gate insulating layer.

In an aspect, a semiconductor device may include a substrate including a peripheral region, a device isolation layer provided on the peripheral region of the substrate to define a first active pattern, a pair of first source/drain patterns provided on the first active pattern, first semiconductor patterns and second semiconductor patterns provided between the first source/drain patterns, wherein the first and second semiconductor patterns are alternately stacked on the first active pattern, and a bottom surface of a lowermost one of the second semiconductor patterns is higher than a top surface of the device isolation layer, a first gate electrode intersecting the first and second semiconductor patterns on the first active pattern, a first gate insulating layer disposed between the first gate electrode and the first and second semiconductor patterns, a pair of gate spacers provided on both sidewalls of the first gate electrode, respectively, a gate capping pattern disposed on the first gate electrode, a first interlayer insulating layer disposed on the gate capping pattern, an active contact penetrating the first interlayer insulating layer and being electrically connected to at least one of the first source/drain patterns, a second interlayer insulating layer disposed on the first interlayer insulating layer, and a first metal layer provided in the second interlayer insulating layer and electrically connected to the active contact. The first gate insulating layer may include a first insulating layer formed on the first and second semiconductor patterns, a second insulating layer formed on the first insulating layer, and a high-k dielectric layer formed on the second insulating layer. The high-k dielectric layer may be disposed between the second insulating layer and the first gate electrode. The first gate insulating layer may contain a dipole element. A concentration of the dipole element at an interface between the first gate electrode and the high-k dielectric layer may be less than a concentration of the dipole element at an interface between the first insulating layer and an adjacent one of the first semiconductor patterns.

In an aspect, a method for manufacturing a semiconductor device may include forming first semiconductor layers and second semiconductor layers which are alternately stacked on a substrate, patterning the first and second semiconductor layers to form an active pattern including first and second semiconductor patterns, sequentially forming a first insulating layer and a first metal oxide layer on the active pattern, the first metal oxide layer containing a first dipole element selected from lanthanum (La) and aluminum (Al), performing a first annealing process on the first metal oxide layer to diffuse the first dipole element into the first insulating layer, forming a source/drain pattern on the active pattern after the performing of the first annealing process, and forming a gate electrode intersecting the active pattern.

BRIEF DESCRIPTION OF THE DRAWINGS

The present inventive concept will become more apparent and more readily appreciated from the following description of the exemplary embodiments, taken in conjunction with the accompanying drawings, in which.

Figure 1:
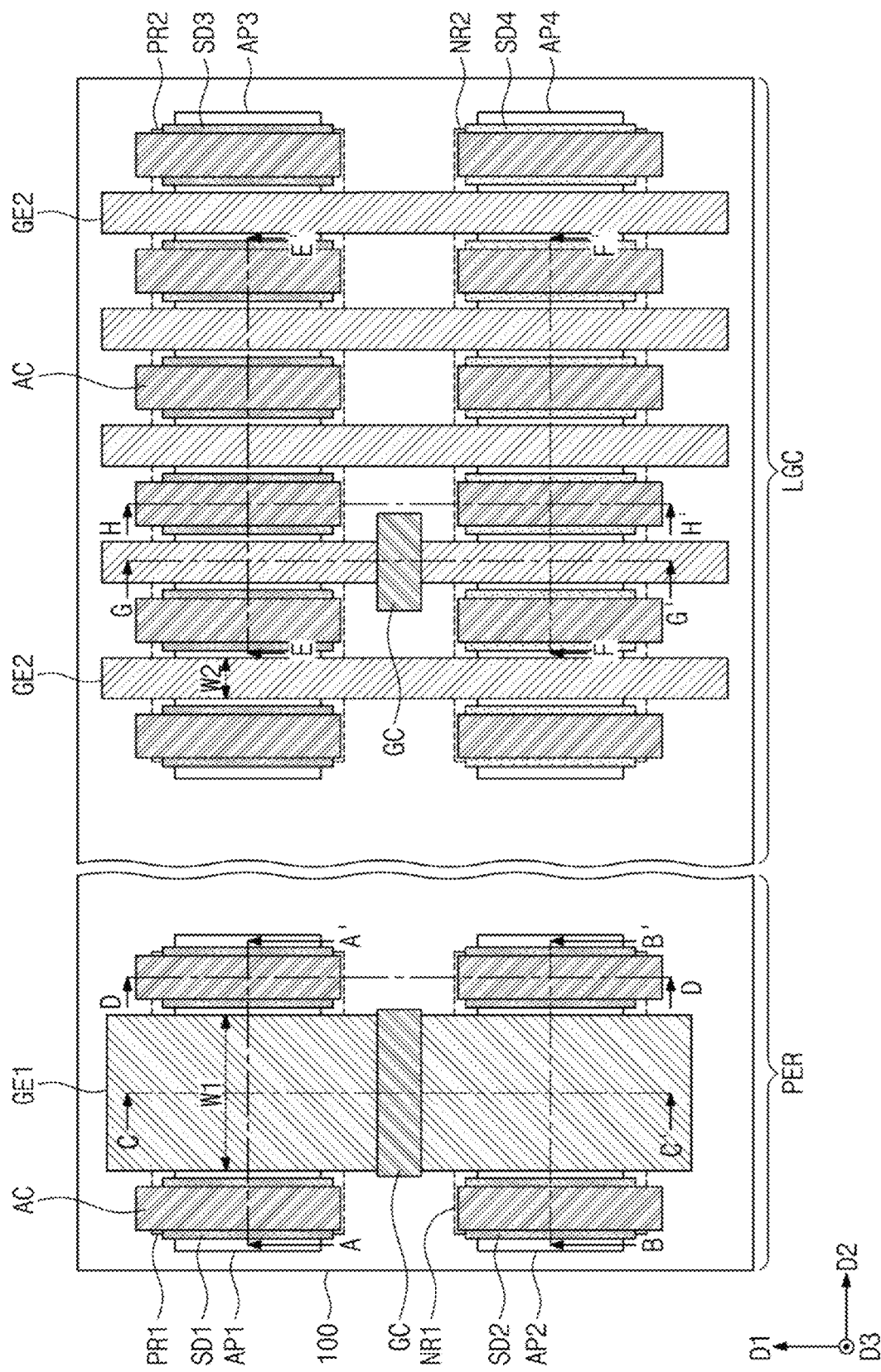
FIG. 1 is a plan view illustrating a semiconductor device according to an exemplary embodiment of the present inventive concept.

Since the drawings in FIGS. 1-17C are intended for illustrative purposes, the elements in the drawings are not necessarily drawn to scale. For example, some of the elements may be enlarged or exaggerated for clarity purpose.

DETAILED DESCRIPTION OF THE EMBODIMENTS

FIG. 1 is a plan view illustrating a semiconductor device according to an exemplary embodiment of the present inventive concept. FIGS. 2A to 2H are cross-sectional views taken along lines A-A', B-B', C-C', D-D', E-E', F-F', G-G' and H-H' of FIG. 1, respectively.

Referring to FIG. 1, a substrate 100 including a peripheral region PER and a logic cell region LGC may be provided. The substrate 100 may be a semiconductor substrate including, for example, silicon (Si), germanium (Ge), or silicon-germanium (SiGe) or may be a compound semiconductor substrate. In an exemplary embodiment of the present inventive concept, the substrate 100 may be a silicon (Si) substrate including silicon (Si), for example, single crystalline silicon (Si), polycrystalline silicon (p-Si), amorphous silicon (a-Si), or a combination thereof, and/or may include other materials such as silicon germanium (SiGe), silicon germanium on insulator (SGOI), indium antimonide (InSb), a lead tellurium compound (PbTe), gallium phosphide (GaP), indium arsenide (InAs), indium phosphide (InP), gallium arsenide (GaAs), or gallium antimonide (GaSb). The peripheral region PER may be a region on which transistors constituting a processor core or an input/output (I/O) terminal are disposed. The logic cell region LGC may be a region on which a standard cell constituting a logic circuit is disposed. The peripheral region PER may surround the logic cell region LGC, but the present inventive concept is not limited thereto. The processor core may be formed in the peripheral region PER to control the functions of, for example, the logic circuit formed in the logic cell region LGC. The operating power of the transistors of the peripheral region PER may be higher than the operating power of transistors of the logic cell region LGC. Hereinafter, the transistors of the peripheral region PER will be described in detail with reference to FIGS. 1 and 2A to 2D.

The peripheral region PER may include a first P-type MOSFET (PMOSFET) region PR1 and a first N-type MOSFET (NMOSFET) region NR1. The first PMOSFET region PR1 and the first NMOSFET region NR1 may be defined by a second trench TR2 formed in an upper portion of the substrate 100. In other words, the second trench TR2 may be disposed between the first PMOSFET region PR1 and the first NMOSFET region NR1 and may separate the first PMOSFET region PR1 and the first NMOSFET region NR1. The first PMOSFET region PR1 and the first NMOSFET region NR1 may be spaced apart from each other in a first direction D1 with the second trench TR2 interposed therebetween.

A first active pattern AP1 and a second active pattern AP2 may be defined by a first trench TR1 formed in the upper portion of the substrate 100, and may be provided on the first PMOSFET region PR1 and the first NMOSFET region NR1, respectively. The first trench TR1 may be shallower than the second trench TR2. The first and second active patterns AP1 and AP2 may have a line shape or a bar shape extending in a second direction D2 crossing the first direction D1. However, the present inventive concept is not limited thereto. For example, the first and second active patterns AP1 and AP2 may each be disposed in an oblique bar shape extending in a direction other than the first and second directions D1 and D2. The first and second active patterns AP1 and AP2 may be portions of the substrate 100, which vertically protrude.

A device isolation layer ST may fill the first and second trenches TR1 and TR2, and may include a silicon oxide ($SiO_2$) layer. Upper portions of the first and second active patterns AP1 and AP2 may vertically protrude upward from the device isolation layer ST (see FIG. 2C). The device isolation layer ST may not cover the upper portions of the first and second active patterns AP1 and AP2, and may cover sidewalls of lower portions of the first and second active patterns AP1 and AP2.

The upper portion of each of the first and second active patterns AP1 and AP2 may include first semiconductor patterns SP1 and second semiconductor patterns SP2, which are alternately stacked. The first semiconductor patterns SP1 adjacent to each other may be spaced apart from each other in a vertical direction (i.e., a third direction D3 which is perpendicular to the first and second directions D1 and D2) with the second semiconductor pattern SP2 interposed therebetween. The first and second semiconductor patterns SP1 and SP2 alternately stacked may vertically overlap with each other. In an exemplary embodiment of the present inventive concept, a bottom surface of a lowermost one of the second semiconductor patterns SP2 may be higher than a top surface of the device isolation layer ST.

The first semiconductor patterns SP1 may include one of silicon (Si), germanium (Ge), and silicon-germanium (SiGe), and the second semiconductor patterns SP2 may include another of silicon (Si), germanium (Ge), and silicon-germanium (SiGe) different from the one included in the first semiconductor patterns SP1. For example, the first semiconductor patterns SP1 may include silicon (Si), and the second semiconductor patterns SP2 may include silicon-germanium (SiGe).

A pair of first source/drain patterns SD1 may be provided in the upper portion of the first active pattern AP1. The first source/drain patterns SD1 may be dopant regions including dopants having a first conductivity type (e.g., a P-type). The P-type dopants may include, for example, boron (B), aluminum (Al), gallium (Ga), indium (In), or a combination thereof. A first channel pattern CH1 may be defined between the pair of first source/drain patterns SD1. The first channel pattern CH1 may include the first and second semiconductor patterns SP1 and SP2 disposed between the pair of first source/drain patterns SD1, and may connect the pair of first source/drain patterns SD1.

A pair of second source/drain patterns SD2 may be provided in the upper portion of the second active pattern AP2. The second source/drain patterns SD2 may be dopant regions including dopants having a second conductivity type (e.g., an N-type). The N-type dopant may include, for example, phosphorus (P), arsenic (As), antimony (Sb), bismuth (Bi), or a combination thereof. A second channel pattern CH2 may be defined between the pair of second source/drain patterns SD2. The second channel pattern CH2 may include the first and second semiconductor patterns SP1 and SP2 disposed between the pair of second source/drain patterns SD2, and may connect the pair of second source/drain patterns SD2.

The first and second source/drain patterns SD1 and SD2 may include epitaxial patterns formed by a selective epitaxial growth (SEG) process. In an exemplary embodiment of the present inventive concept, a top surface of each of the first and second source/drain patterns SD1 and SD2 may be disposed at a level substantially the same as that of a top surface of the uppermost one of the first semiconductor patterns SP1.

The first source/drain patterns SD1 may include a semiconductor element (e.g., SiGe) of which a lattice constant is greater than that of a semiconductor element of the substrate 100. Thus, the first source/drain patterns SD1 may provide compressive stress to the first channel pattern CH1. For example, silicon germanium (SiGe) may be used as the stressors for the first source/drain patterns SD1 in PMOSFET to introduce compressive stress to the channels and enhance hole mobility. For example, higher germanium (Ge) concentration and higher compressive stress both may help to enhance the hole mobility. The second source/drain patterns SD2 may include a semiconductor element (e.g., Si) the same as that of the substrate 100. Alternatively, the second source/drain patterns SD2 may include silicon carbide (SiC).

A first gate electrode GE1 may extend in the first direction D1, and may intersect the first and second active patterns AP1 and AP2 extending in the second direction D2 (see FIG. 1). The first gate electrode GE1 may vertically overlap with the first and second channel patterns CH1 and CH2.

Referring again to FIG. 2C, the first gate electrode GE1 may be provided on a top surface and both sidewalls of each of the first and second channel patterns CH1 and CH2. In other words, the transistors of the peripheral region PER according to the present exemplary embodiment may be three-dimensional (3D) field effect transistors in which the first gate electrode GE1 three-dimensionally surrounds channels.

Referring again to FIGS. 1 and 2A to 2D, a pair of gate spacers GS may be disposed on both sidewalls of the first gate electrode GE1, respectively, and may extend along the first gate electrode GE1 in the first direction D1. Top surfaces of the gate spacers GS may be higher than a top surface of the first gate electrode GE1. The top surfaces of the gate spacers GS may be coplanar with a top surface of a first interlayer insulating layer 110 to be described later. The gate spacers GS may include at least one of silicon carbonitride (SiCN), silicon carbon oxynitride (SiCON), or silicon nitride ($Si_3N_4$). In an exemplary embodiment of the present inventive concept, each of the gate spacers GS may have a multi-layered structure formed of at least two of silicon carbonitride (SiCN), silicon carbon oxynitride (SiCON), or silicon nitride ($Si_3N_4$).

A gate capping pattern GP may be provided on the first gate electrode GE1, and may extend along the first gate electrode GE1 in the first direction D1. The top surfaces of the gate spacers GS may be coplanar with a top surface of the gate capping pattern GP, and the gate spacers GS may cover the sidewalls of the gate capping pattern GP. The gate capping pattern GP may include a material having an etch selectivity with respect to first and second interlayer insulating layers 110 and 120 to be described later. For example, the gate capping patterns GP may include at least one of silicon oxynitride (SiON), silicon carbonitride (SiCN), silicon carbon oxynitride (SiCON), or silicon nitride ($Si_3N_4$).

A first gate insulating layer GI1 may be disposed between the first gate electrode GE1 and the first channel pattern CH1, between the first gate electrode GE1 and the gate spacer GS and between the first gate electrode GE1 and the second channel pattern CH2, and may extend along a bottom surface of the first gate electrode GE1 thereon. The first gate insulating layer GI1 may cover a top surface of the device isolation layer ST disposed under the first gate electrode GE1.

The first gate insulating layer GI1 may include a first insulating layer EG which directly covers the top surface and the both sidewalls of each of the first and second channel patterns CH1 and CH2. The first gate insulating layer GI1 may further include a second insulating layer IL formed on the first insulating layer EG, and a high-k dielectric layer HK formed on the second insulating layer IL. The second insulating layer IL may be disposed between the first insulating layer EG and the high-k dielectric layer HK.

In an exemplary embodiment of the present inventive concept, the high-k dielectric layer HK may be thicker than the second insulating layer IL. The first insulating layer EG may be thicker than the high-k dielectric layer HK. Each of the first and second insulating layers EG and IL may include a silicon oxide ($SiO_2$) layer or a silicon oxynitride (SiON) layer. For example, each of the first and second insulating layers EG and IL may include a silicon oxide ($SiO_2$) layer. In this case, since the first and second insulating layers EG and IL include the same material, an interface therebetween may not be checked or visible. In other words, the first and second insulating layers EG and IL may constitute a single silicon oxide ($SiO_2$) layer. The high-k dielectric layer HK may include a high-k dielectric material of which a dielectric constant is higher than that of silicon oxide (SiO$_2$). For example, the high-k dielectric material may include at least one of, for example, hafnium oxide (HfO$_2$), hafnium-silicon oxide (HfSiO$_4$), hafnium-zirconium oxide (HfZrO$_4$), hafnium-tantalum oxide (Hf$_2$Ta$_2$O$_9$), hafnium aluminum oxide (HfAlO$_3$), lanthanum oxide (La$_2$O$_3$), lanthanum aluminum oxide (LaAlO$_3$), zirconium oxide (ZrO$_2$), zirconium-silicon oxide (ZrSiO$_4$), tantalum oxide (Ta$_2$O$_5$), titanium oxide (TiO$_2$), barium-strontium-titanium oxide (BaSrTi$_2$O$_6$), barium-titanium oxide (BaTiO$_3$), strontium-titanium oxide (SrTiO$_3$), yttrium oxide (Y$_2$O$_3$), lithium oxide (Li$_2$O), aluminum oxide (Al$_2$O$_3$), lead-scandium-tantalum oxide (Pb(Sc,Ta)O$_3$), or lead-zinc niobate [Pb(Zn$_{1/3}$Nb$_{2/3}$)O$_3$].

The first gate electrode GE1 may include a first metal pattern and a second metal pattern formed on the first metal pattern. The first metal pattern may be provided on the first gate insulating layer GI1 and may be adjacent to the first and second channel patterns CH1 and CH2. The first metal pattern may include a work function metal for adjusting a threshold voltage of the transistor. A desired threshold voltage of the transistor may be obtained by adjusting a thickness and a composition of the first metal pattern.

The first metal pattern may include a metal nitride layer. For example, the first metal pattern may include nitrogen (N) and at least one metal selected from a group including, for example, titanium (Ti), tantalum (Ta), aluminum (Al), tungsten (W), and molybdenum (Mo). In addition, the first metal pattern may further include carbon (C). In an exemplary embodiment of the present inventive concept, the first metal pattern may control a work function, and may include one or more selected from, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), titanium aluminum carbonitride (TiAlCN), titanium aluminum carbide (TiAlC), titanium carbide (TiC), tantalum carbonitride (TaCN), niobium nitride (NbN), niobium carbide (NbC), molybdenum nitride (MoN), molybdenum carbide (MoC), tungsten carbide (WC), and a combination thereof. In an exemplary embodiment of the present inventive concept, the first metal pattern may include a plurality of stacked work function metal layers.

The second metal pattern may include a metal having a resistance lower than that of the first metal pattern. For example, the second metal pattern may include at least one metal selected from a group including, for example, tungsten (W), aluminum (Al), titanium (Ti), tantalum (Ta), ruthenium (Ru), titanium aluminum (TiAl), copper (Cu), cobalt (Co), nickel (Ni), platinum (Pt), nickel platinum (NiPt), niobium (Nb), molybdenum (Mo), rhodium (Rh), palladium (Pd), iridium (Ir), osmium (Os), silver (Ag), gold (Au), zinc (Zn), vanadium (V), and a combination thereof.

A first interlayer insulating layer 110 may be provided on the substrate 100, and may cover the gate spacers GS and the first and second source/drain patterns SD1 and SD2. A top surface of the first interlayer insulating layer 110 may be substantially coplanar with a top surface of the gate capping pattern GP and top surfaces of the gate spacers GS. A second interlayer insulating layer 120 may be disposed on the first interlayer insulating layer 110 and the gate capping pattern GP. For example, each of the first and second interlayer insulating layers 110 and 120 may include a silicon oxide (SiO$_2$) layer. Since the first and second interlayer insulating layers 110 and 120 may include the same material, an interface between the first and second interlayer insulating layers 110 and 120 may not be visible.

Active contacts AC may penetrate the second and first interlayer insulating layers 120 and 110 so as to be electrically connected to the first and second source/drain patterns SD1 and SD2, respectively. A pair of the active contacts AC may be provided at both sides of the first gate electrode GE1, respectively. The active contact AC may have a bar shape extending in the first direction D1 when viewed in a plan view (see FIG. 1). The bottom surface of the active contact AC may be lower than the top surfaces of the first and second source/drain patterns SD1 and SD2. However, the present inventive concept is not limited thereto. For example, in an exemplary embodiment of the present inventive concept, the bottom surface of the active contact AC may be formed on a plane the same as that of the top surface of the first and second source/drain patterns SD1 and SD2.

The active contact AC may include a conductive pattern FM and a barrier pattern BM surrounding the conductive pattern FM. For example, the conductive pattern FM may include at least one metal of, for example, aluminum (Al), copper (Cu), tungsten (W), molybdenum (Mo), or cobalt (Co). The barrier pattern BM may cover a bottom surface and sidewalls of the conductive pattern FM. The barrier pattern BM may include two layers such as a metal layer/a metal nitride layer. The metal layer may include a metal or a metal alloy including at least one of, for example, titanium (Ti), tantalum (Ta), tungsten (W), nickel (Ni), cobalt (Co), or platinum (Pt). The metal nitride layer may include at least one of, for example, a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

The active contact AC may be a self-aligned contact. In other words, the active contact AC may be formed to be self-aligned using the gate capping pattern GP and the gate spacer GS. For example, the active contact AC may cover at least a portion of a sidewall of the gate spacer GS. The active contact AC may cover a portion of the top surface of the gate capping pattern GP.

Silicide patterns SC may be disposed between the active contact AC and the first source/drain pattern SD1 and between the active contact AC and the second source/drain pattern SD2, respectively to provide reliable metal-semiconductor contact and reduce electrical resistance between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may include a metal silicide, and may include at least one of, for example, titanium silicide (TiSi), tantalum silicide (TaSi), tungsten silicide (WSi), nickel silicide (NiSi), or a cobalt silicide (CoSi).

A gate contact GC may penetrate the second interlayer insulating layer 120 and the gate capping pattern GP so as to be electrically connected to the first gate electrode GE1. The gate contact GC may be provided on the device isolation layer ST between the first PMOSFET region PR1 and the first NMOSFET region NR1, and may have a bar shape extending in the second direction D2 when viewed in a plan view (see FIG. 1). The gate contact GC may include a conductive pattern FM and a barrier pattern BM surrounding the conductive pattern FM, like the active contact AC.

A third interlayer insulating layer 130 may be provided on the second interlayer insulating layer 120. A first metal layer may be provided in the third interlayer insulating layer 130.

For example, the third interlayer insulating layer 130 may include a silicon oxide ($SiO_2$) layer. The first metal layer may include first interconnection lines M1, a first via V1, and a second via V2. The first and second vias V1 and V2 may be provided under the first interconnection lines M1.

The first interconnection lines M1 may extend in the second direction D2 in parallel with each other, and may be arranged in the first direction D1. The first via V1 may be disposed between the active contact AC and a corresponding one of the first interconnection lines M1 to electrically connect the active contact AC to the corresponding one of the first interconnection lines M1. The second via V2 may be disposed between the gate contact GC and a corresponding one of the first interconnection lines M1 to electrically connect the gate contact GC to the corresponding one of the first interconnection lines M1.

The first interconnection line M1 and the first or second via V1 or V2 disposed thereunder may be connected to each other in a single unitary body to constitute a single conductive structure. In other words, the first interconnection line M1 and the first or second via V1 or V2 may be formed together. The first interconnection line M1 and the first or second via V1 or V2 may be formed as the single conductive structure by a dual damascene process. For example, the single conductive structure formed from the first interconnection line M1 and the first or second via V1 or V2 may include at least one metal of, for example, aluminum (Al), copper (Cu), tungsten (W), molybdenum (Mo), or cobalt (Co). Stacked metal layers (e.g., M2, M3, M4, etc.) may be additionally disposed on the third interlayer insulating layer 130.

Hereinafter, the transistors of the logic cell region LGC will be described in detail with reference to FIGS. 1 and 2E to 2H. The descriptions to the same technical features as the transistors of the peripheral region PER mentioned with reference to FIGS. 1 and 2A to 2D will be omitted for the purpose of ease and convenience in explanation. In other words, differences between the transistors of the logic cell region LGC and the transistors of the peripheral region PER will be mainly described.

The logic cell region LGC may include a second PMOSFET region PR2 and a second NMOSFET region NR2. The second PMOSFET region PR2 and the second NMOSFET region NR2 may be defined by a fourth trench TR4 formed in the upper portion of the substrate 100. In other words, the fourth trench TR4 may be disposed between the second PMOSFET region PR2 and the second NMOSFET region NR2, and may separate the second PMOSFET region PR2 and the second NMOSFET region NR2. A third active pattern AP3 and a fourth active pattern AP4 may be defined by a third trench TR3 formed in the upper portion of the substrate 100. The third active pattern AP3 and the fourth active pattern AP4 may be provided on the second PMOSFET region PR2 and the second NMOSFET region NR2, respectively. The device isolation layer ST may also be disposed in the third and fourth trenches TR3 and TR4. Upper portions of the third and fourth active patterns AP3 and AP4 may vertically protrude upward from the device isolation layer ST (see FIG. 2G).

An upper portion of each of the third and fourth active patterns AP3 and AP4 may include first semiconductor patterns SP1 which are stacked and are spaced apart from each other. The stacked first semiconductor patterns SP1 may be spaced apart from each other in the third direction D3. Unlike the transistors of the peripheral region PER described above, the third and fourth active patterns AP3 and AP4 may not include the second semiconductor patterns SP2. For example, without the second semiconductor patterns SP2 formed between the first semiconductor patterns SP1, the first semiconductor patterns SP1 may be electrically insulated from each other in the third direction D3.

Third source/drain patterns SD3 may be provided in the upper portion of the third active pattern AP3. Fourth source/drain patterns SD4 may be provided in the upper portion of the fourth active pattern AP4. A third channel pattern CH3 may be defined between a pair of the third source/drain patterns SD3, and connected to the pair of the third source/drain patterns SD3. A fourth channel pattern CH4 may be defined between a pair of the fourth source/drain patterns SD4, and connected to the pair of the fourth source/drain patterns SD4. Each of the third and fourth channel patterns CH3 and CH4 may include the first semiconductor patterns SP1 which are stacked and are spaced apart from each other.

Each of the third source/drain patterns SD3 may be an epitaxial pattern containing dopants of the first conductivity type (e.g., the P-type). Each of the fourth source/drain patterns SD4 may be an epitaxial pattern containing dopants of the second conductivity type (e.g., the N-type). In an exemplary embodiment of the present inventive concept, a top surface of each of the third and fourth source/drain patterns SD3 and SD4 may be disposed at a level substantially the same as that of a top surface of the uppermost one of the first semiconductor patterns SP1.

Second gate electrodes GE2 may extend in parallel with each other in the first direction D1, and may intersect the third and fourth channel patterns CH3 and CH4 of the third and fourth active patterns AP3 and AP4 extending in the second direction D2 (see FIG. 1). The second gate electrode GE2 may vertically overlap with the third and fourth channel patterns CH3 and CH4. A pair of gate spacers GS may be disposed on both sidewalls of the second gate electrode GE2, respectively, and may extend along the second gate electrode GE2 in the first direction D1. A gate capping pattern GP may be provided on the second gate electrode GE2.

Referring again to FIG. 2G, the second gate electrode GE2 may surround each of the first semiconductor patterns SP1. The second gate electrode GE2 may be provided on a top surface TS, both sidewalls SW and a bottom surface BS of the first semiconductor pattern SP1, and may surround the first semiconductor pattern SP1 constituting a channel. In other words, the transistors of the logic cell region LGC according to the present exemplary embodiment may be 3D field effect transistors (e.g., gate-all-around multi-bridge-channel MOSFETs, MBCFETs) in which the second gate electrode GE2 three-dimensionally surrounds channels. Since the second gate electrode GE2 may wrap around the plurality of first semiconductor patterns SP1 (the channels), the transistor of the logic cell region LGC may have a gate all around (GAA) transistor structure.

Referring again to FIGS. 1 and 2E to 2H, a second gate insulating layer GI2 may be disposed between the second gate electrode GE2 and the third channel pattern CH3, between the second gate electrode GE2 and the gate spacer GS, and between the second gate electrode GE2 and the fourth channel pattern CH4. The second gate insulating layer GI2 may include a second insulating layer IL directly covering each of the first semiconductor patterns SP1, and may further include a high-k dielectric layer HK formed on the second insulating layer IL. Unlike the first gate insulating layer GI1 described above, the second gate insulating layer GI2 may not include the first insulating layer EG. In other words, the first insulating layer EG may be omitted in the transistors of the logic cell region LGC. The second gate electrode GE2 and the second gate insulating layer GI2 may fill a space between the first semiconductor patterns SP1 vertically adjacent to each other. For example, the second gate electrode GE2 and the second gate insulating layer GI2 may surround each of the first semiconductor patterns SP1, while covering the third and fourth channel patterns CH3 and CH4 of the third and fourth active patterns AP3 and AP4, respectively.

An insulating pattern IP may be disposed between the second gate insulating layer GI2 and the fourth source/drain pattern SD4 on the second NMOSFET region NR2. The second gate electrode GE2 may be spaced apart from the fourth source/drain pattern SD4 by the second gate insulating layer GI2 and the insulating pattern IP. In an exemplary embodiment of the present inventive concept, the insulating pattern IP may include, for example, silicon nitride ($Si_3N_4$), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), silicon oxide ($SiO_2$), or a combination thereof. In an exemplary embodiment of the present inventive concept, the insulating pattern IP may include an air gap. On the other hand, the insulating pattern IP may be omitted on the second PMOSFET region PR2.

The first interlayer insulating layer 110 and the second interlayer insulating layer 120 may be provided on an entire top surface of the substrate 100. Active contacts AC may penetrate the second and first interlayer insulating layers 120 and 110 so as to be electrically connected to the third and fourth source/drain patterns SD3 and SD4, respectively. A gate contact GC may penetrate the second interlayer insulating layer 120 and the gate capping pattern GP so as to be electrically connected to the second gate electrode GE2. The active contacts AC and the gate contact GC may be substantially the same as described above with reference to FIGS. 1 and 2A to 2D.

The third interlayer insulating layer 130 may be provided on the second interlayer insulating layer 120. A first metal layer may be provided in the third interlayer insulating layer 130. The first metal layer may include first interconnection lines M1, first vias V1, and second vias V2. Stacked metal layers (e.g., M2, M3, M4, etc.) may be additionally disposed on the third interlayer insulating layer 130. The first via V1 may electrically connect the active contact AC to a corresponding one of the first interconnection lines M1. The second via V2 may electrically connect the gate contact GC to a corresponding one of the first interconnection lines M1.

The first gate insulating layer GI1 of the transistor of the peripheral region PER and the second gate insulating layer GI2 of the transistor of the logic cell region LGC will be described hereinafter in more detail.

Referring again to FIG. 2A, the first gate insulating layer GI1 may include a dipole element. Thus, the threshold voltage of the transistor of the peripheral region PER may be adjusted using the dipole element included in the first gate insulating layer GI1. The dipole element may include, for example, lanthanum (La), aluminum (Al), or a combination thereof. In other words, the first gate insulating layer GI1 may contain, for example, lanthanum (La), aluminum (Al), or a combination thereof, as impurities.

The first gate insulating layer GI1 may include a dipole-interface which is formed in or near the second insulating layer IL by the dipole element. When the first gate insulating layer GI1 contains lanthanum (La), an effective work function of the first gate electrode GE1 may be reduced. When the first gate insulating layer GI1 contains aluminum (Al), the effective work function of the first gate electrode GE1 may be increased. By controlling the effective work function of the first gate electrode GE1, the threshold voltage of the transistor of the peripheral region PER may be controlled. As a result, the semiconductor device according to the present exemplary embodiment may have high reliability and excellent electrical characteristics.

The first gate insulating layer GI1 may contain the same dipole element on both the first PMOSFET region PR1 and the first NMOSFET region NR1. However, the present inventive concept is not limited thereto. To set lower threshold voltage of the transistor of the peripheral region PER, lower work function may be required for NMOSFET, or higher work function may be required for PMOSFET. In an exemplary embodiment of the present inventive concept, the first gate insulating layer GI1 may contain aluminum (Al) on the first PMOSFET region PR1 and may contain lanthanum (La) on the first NMOSFET region NR1 for obtaining lower threshold voltages for the transistors of the peripheral region PER. In an exemplary embodiment of the present inventive concept, the first gate insulating layer GI1 may contain lanthanum (La) on the first PMOSFET region PR1 and may contain aluminum (Al) on the first NMOSFET region NR1 for obtaining higher threshold voltages for the transistors of the peripheral region PER.

Figure 2A:
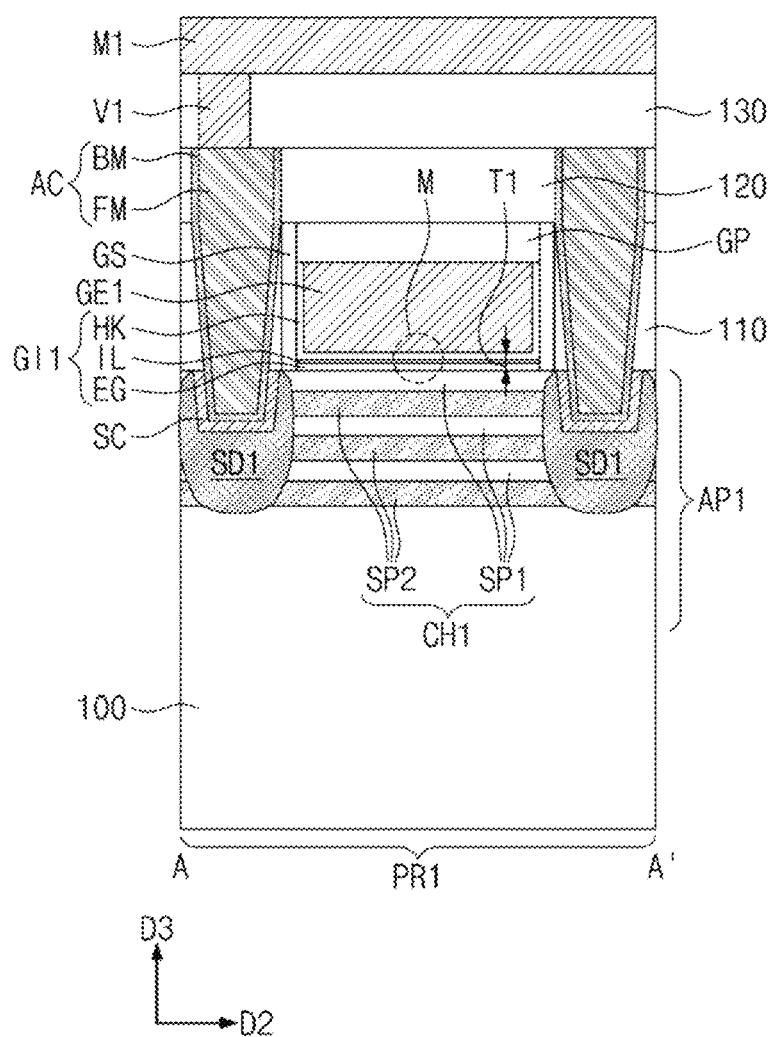
FIGS. 2A to 2H are cross-sectional views taken along lines A-A', B-B', C-C', D-D', E-E', F-F', G-G' and H-H' of FIG. 1, respectively.
Figure 2B:
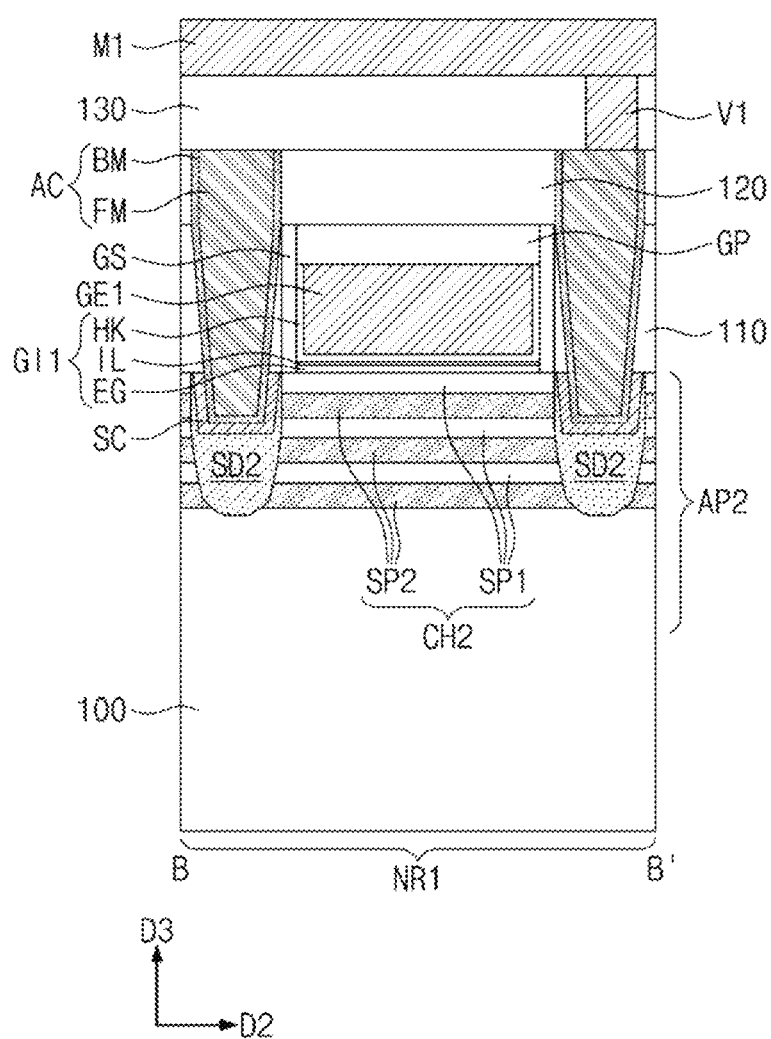
Figure 2C:
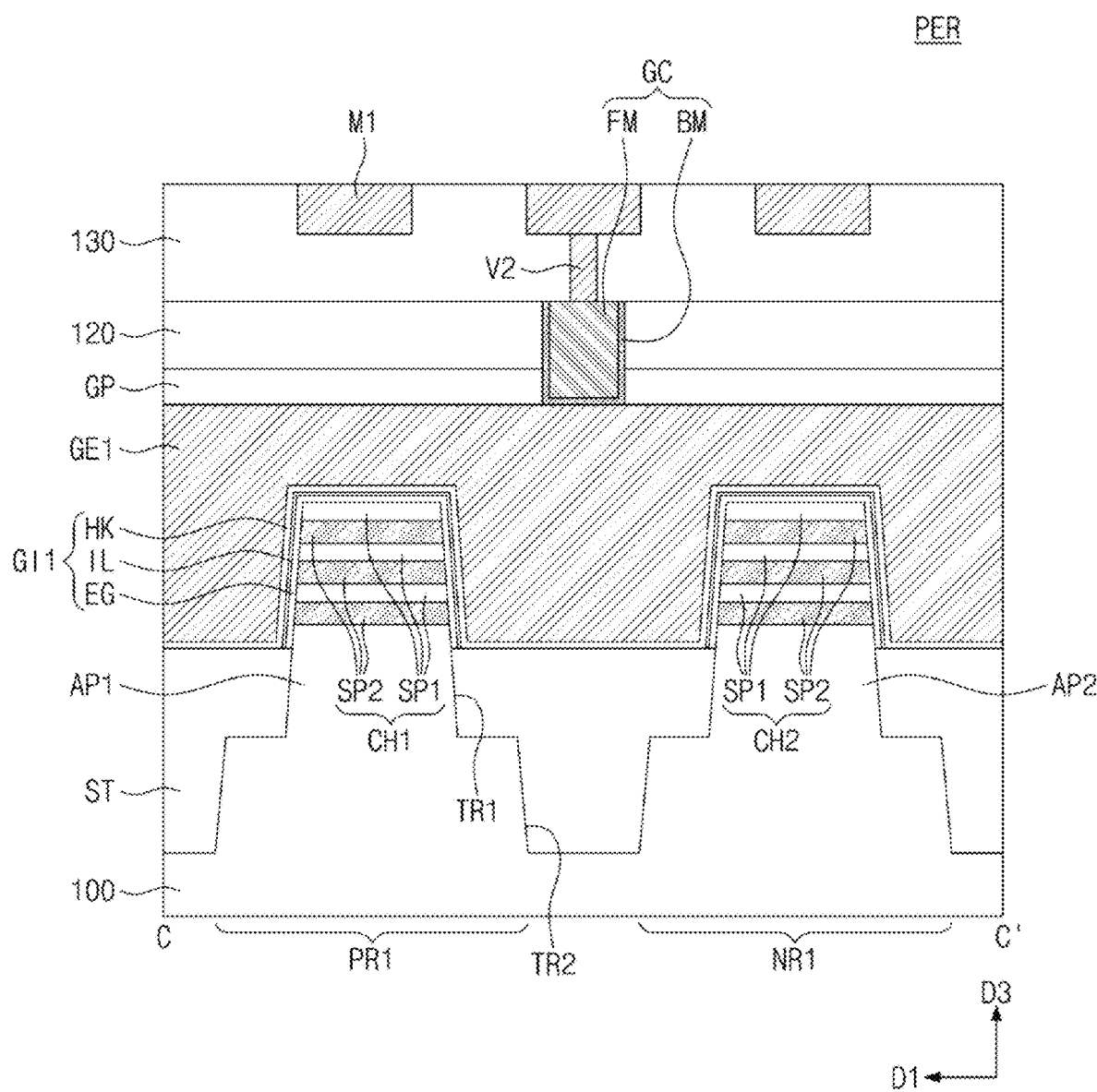
Figure 2D:
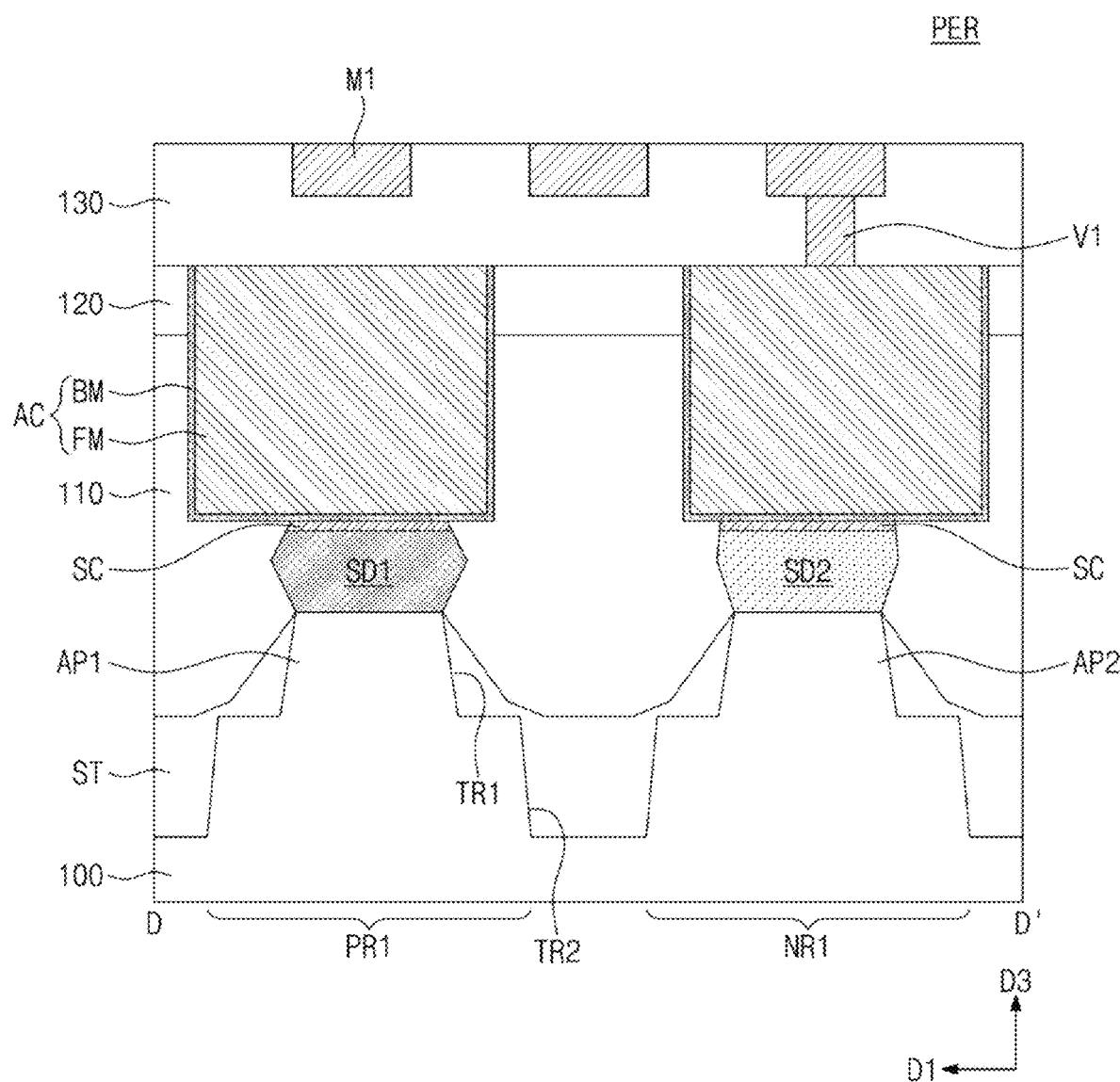
Figure 3:
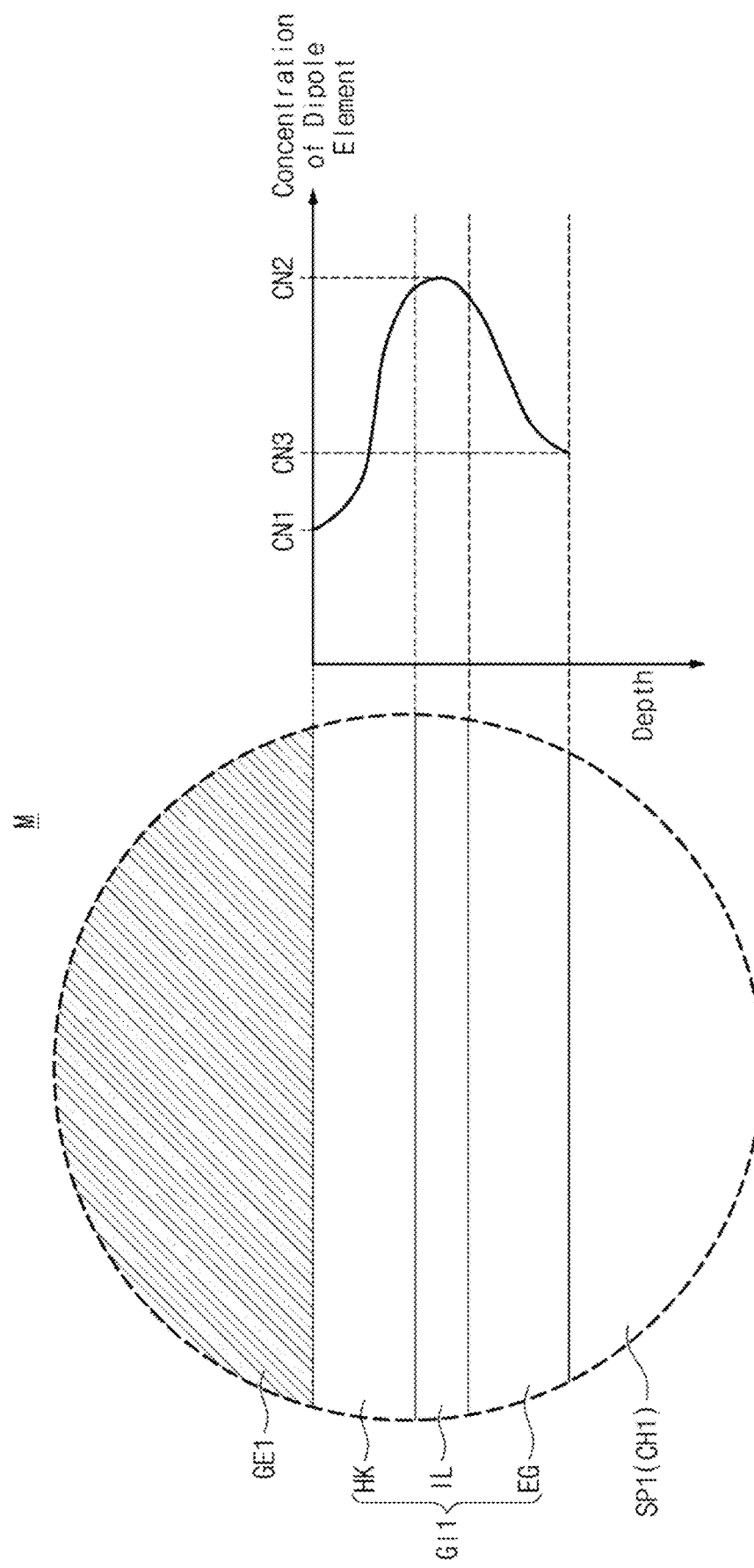
FIG. 3 is an enlarged cross-sectional view of region 'M' of FIG. 2A.
Figure 4:
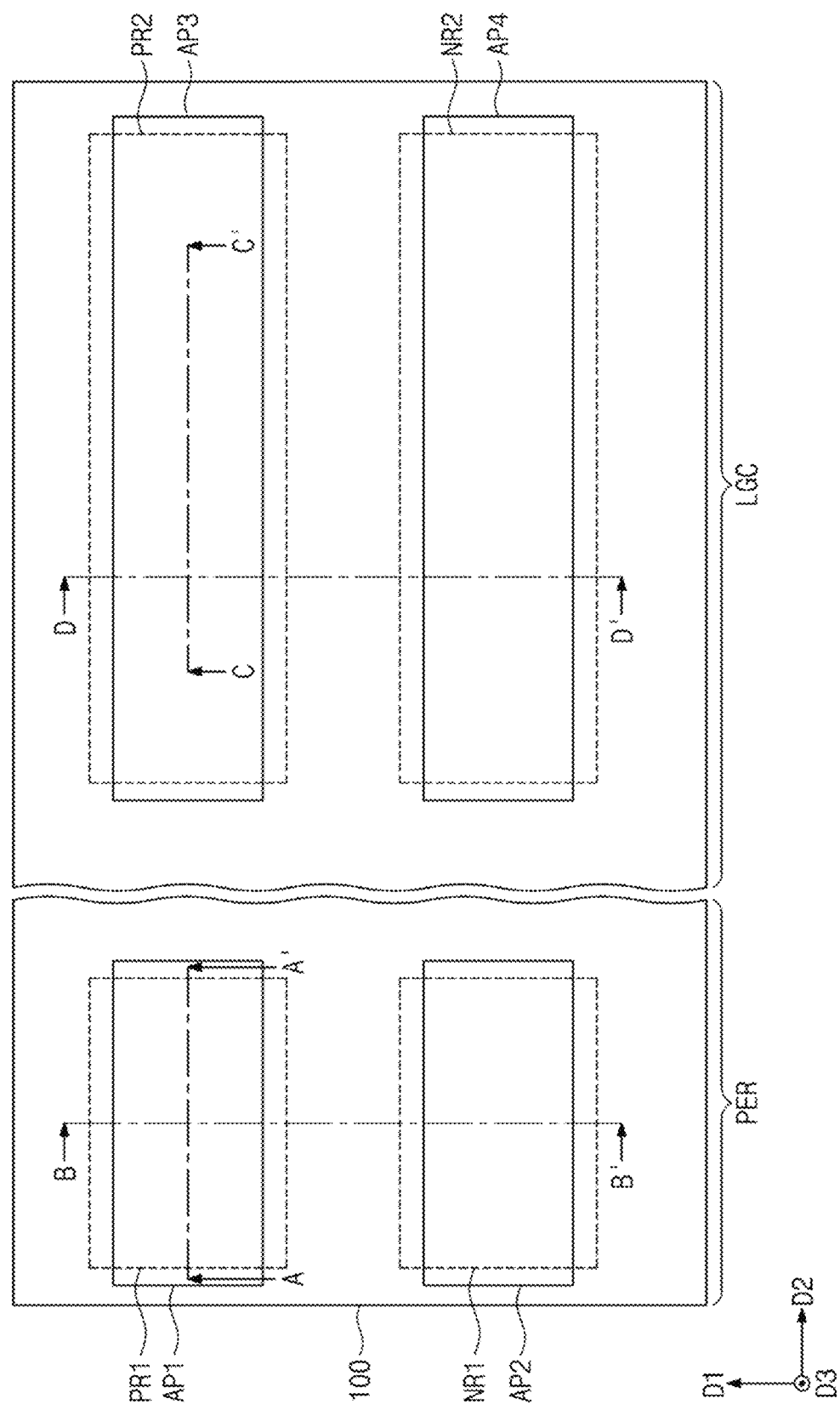
FIGS. 4, 6, 8, 10, 12 and 14 are plan views illustrating a method for manufacturing a semiconductor device, according to an exemplary embodiment of the present inventive concept.
Figure 5A:
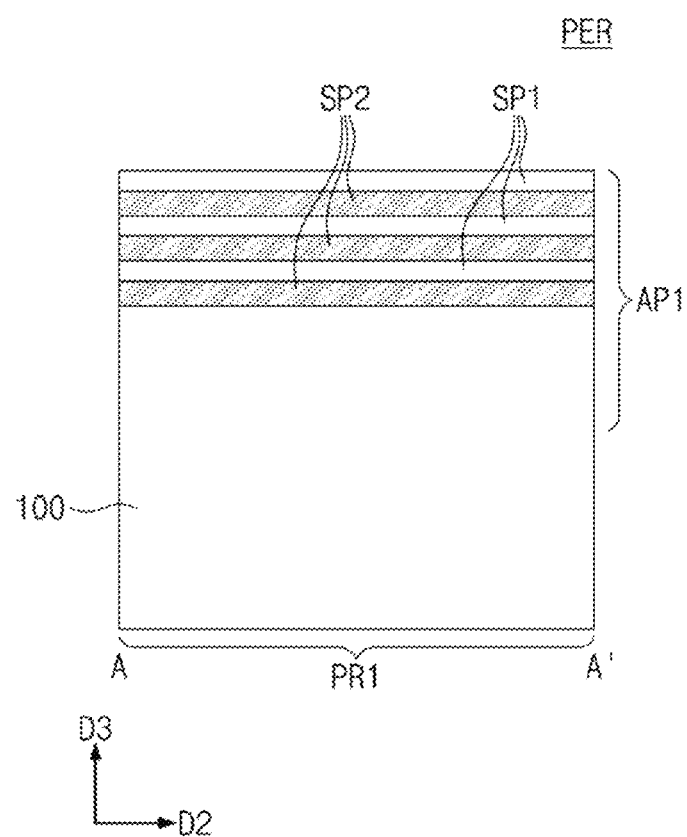
FIGS. 5A, 7A, 9A, 11A, 13A and 15A are cross-sectional views taken along lines A-A' of FIGS. 4, 6, 8, 10, 12 and 14, respectively.
Figure 5B:
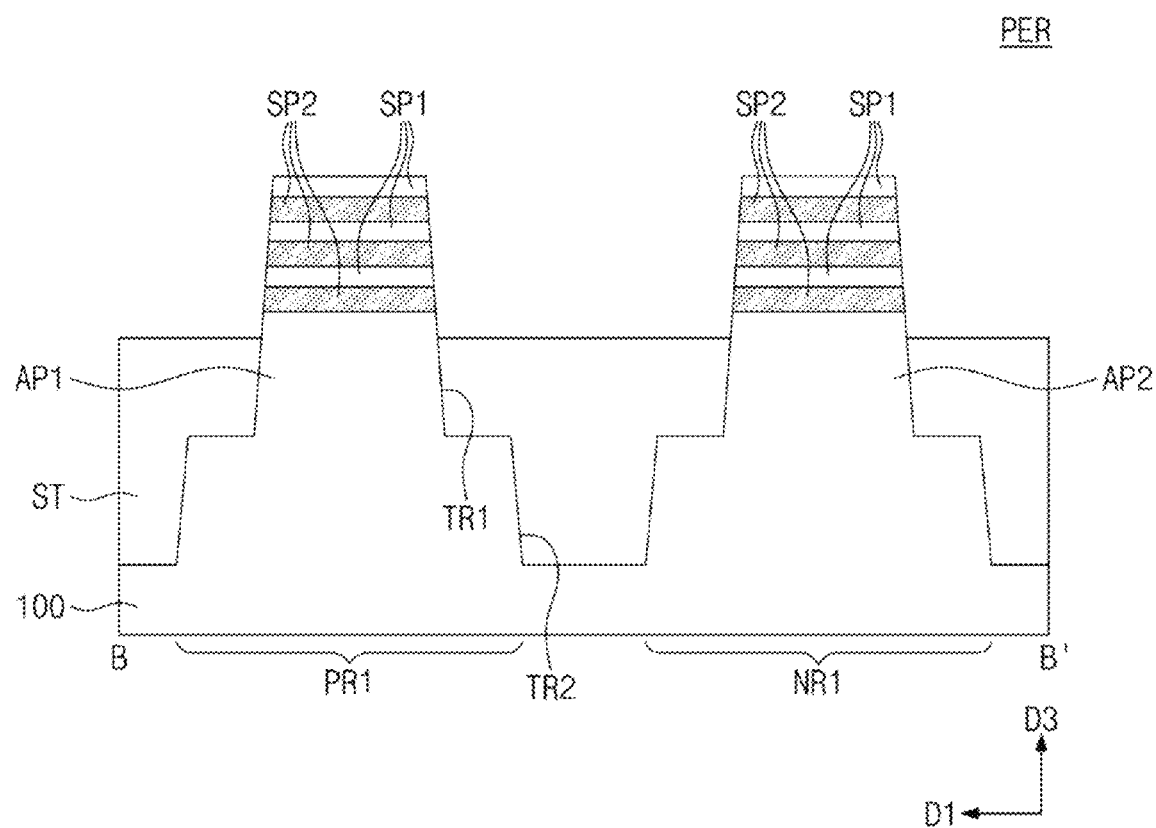
FIGS. 5B, 7B, 9B, 11B, 13B and 15B are cross-sectional views taken along lines B-B' of FIGS. 4, 6, 8, 10, 12 and 14, respectively.
Figure 5C:
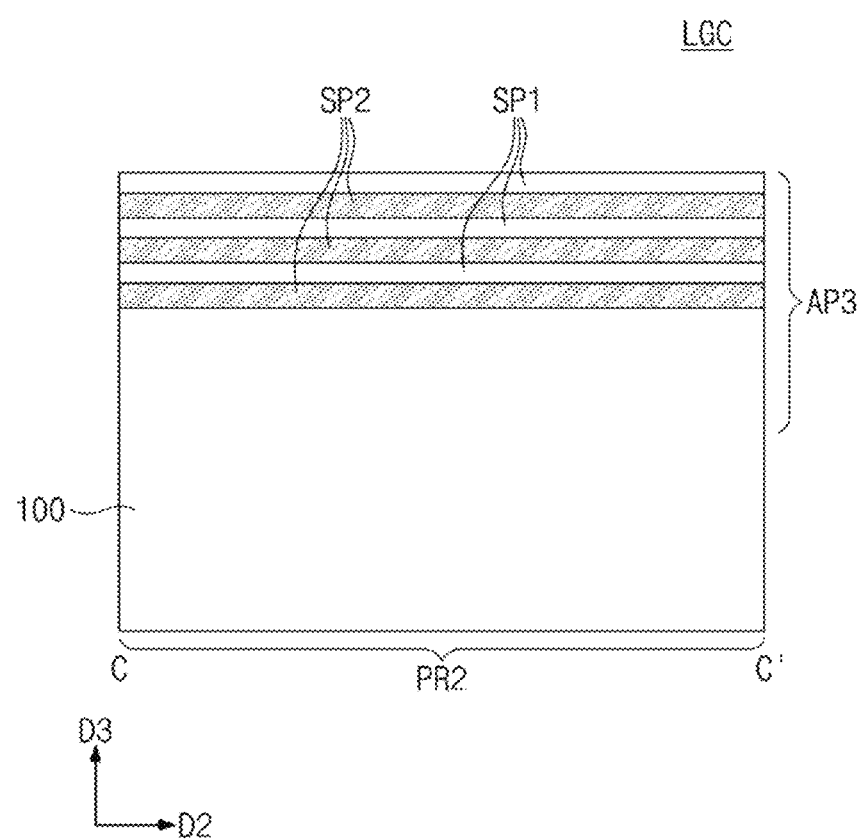
FIGS. 5C, 7C, 9C, 11C, 13C and 15C are cross-sectional views taken along lines C-C' of FIGS. 4, 6, 8, 10, 12 and 14, respectively.
Figure 5D:
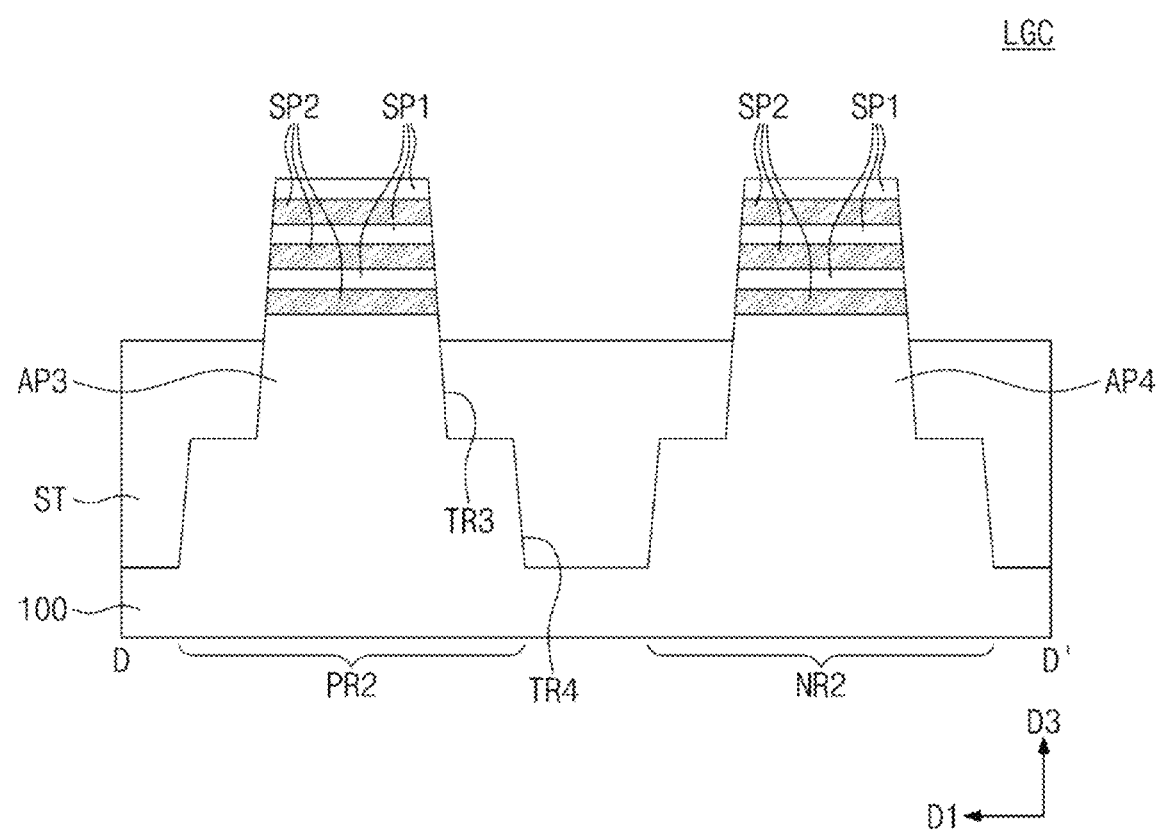
FIGS. 5D, 7D, 9D, 11D, 13D and 15D are cross-sectional views taken along lines D-D' of FIGS. 4, 6, 8, 10, 12 and 14, respectively.
Figure 6:
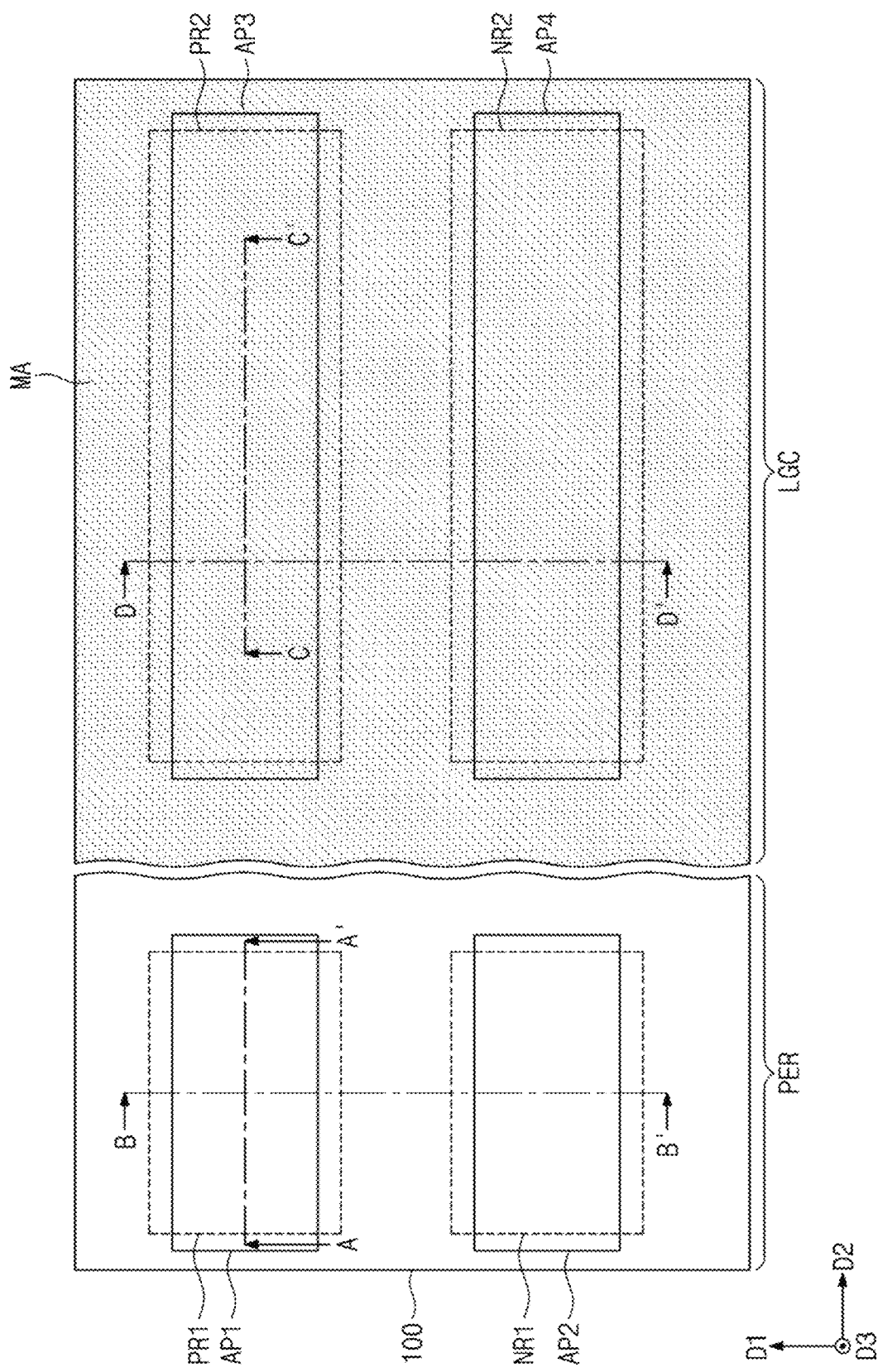
Figure 7A:
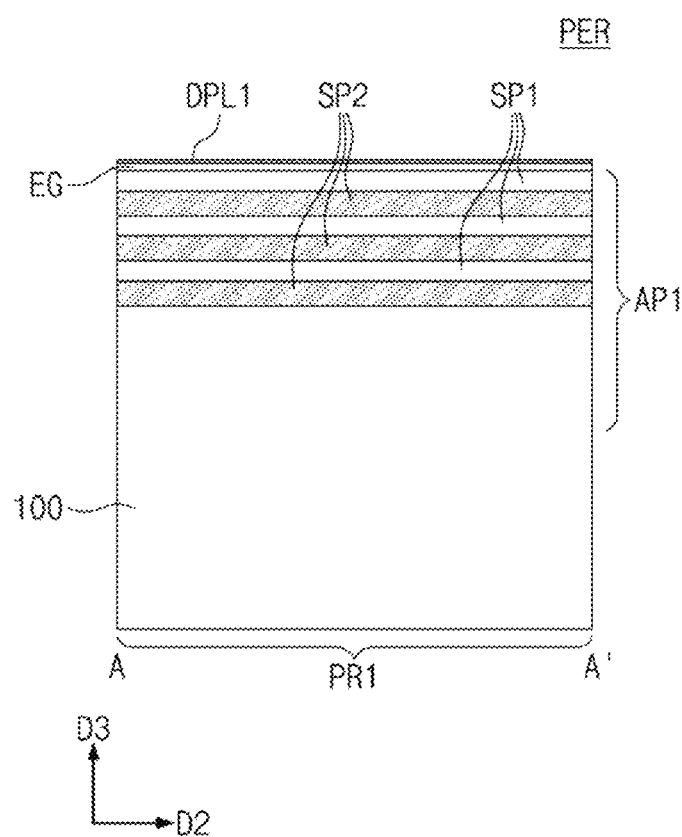
Figure 7B:
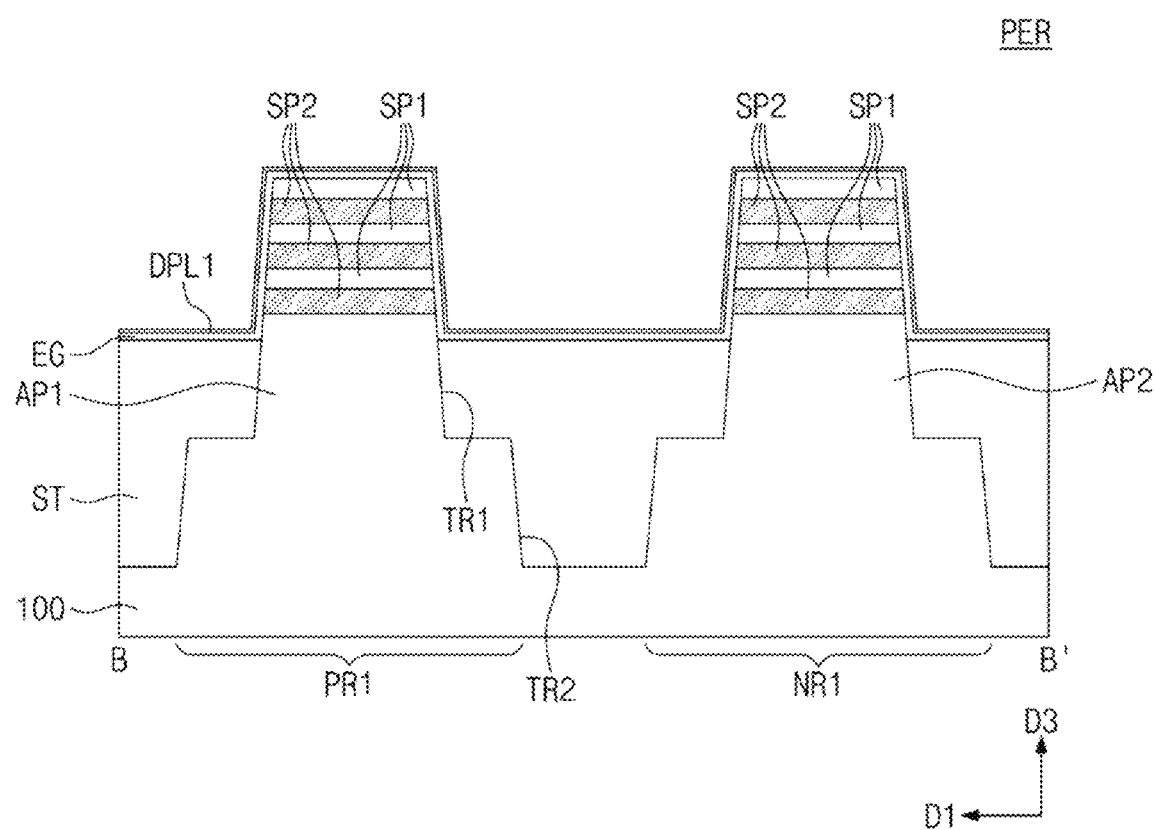
Figure 7C:
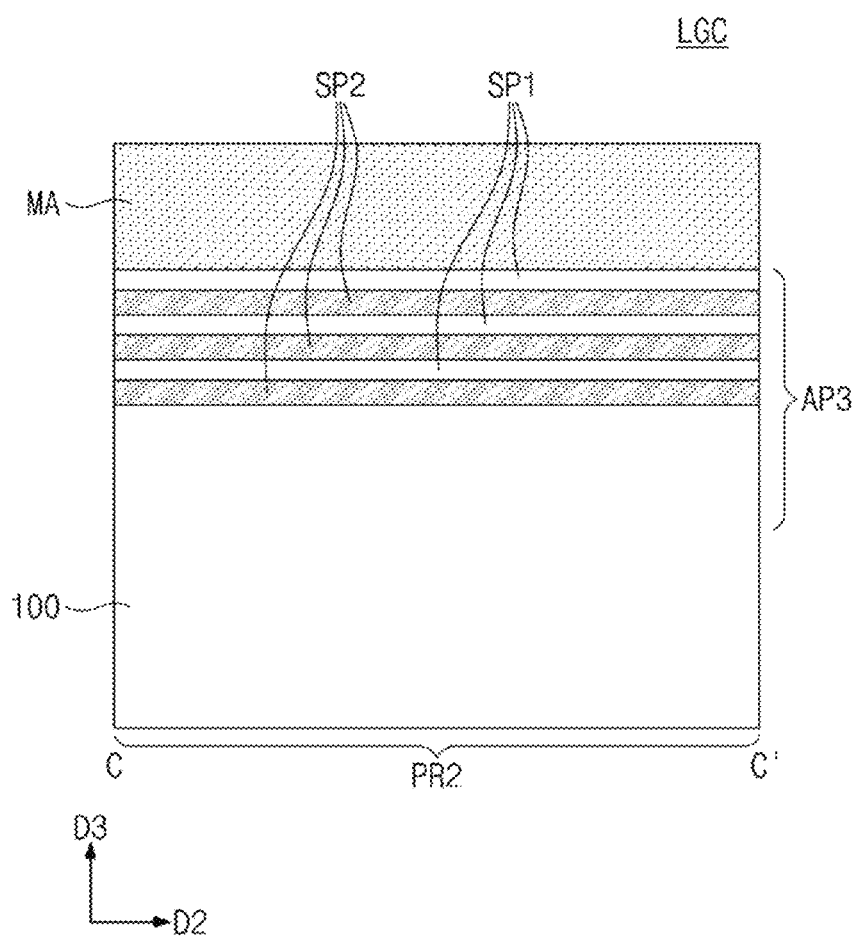
Figure 7D:
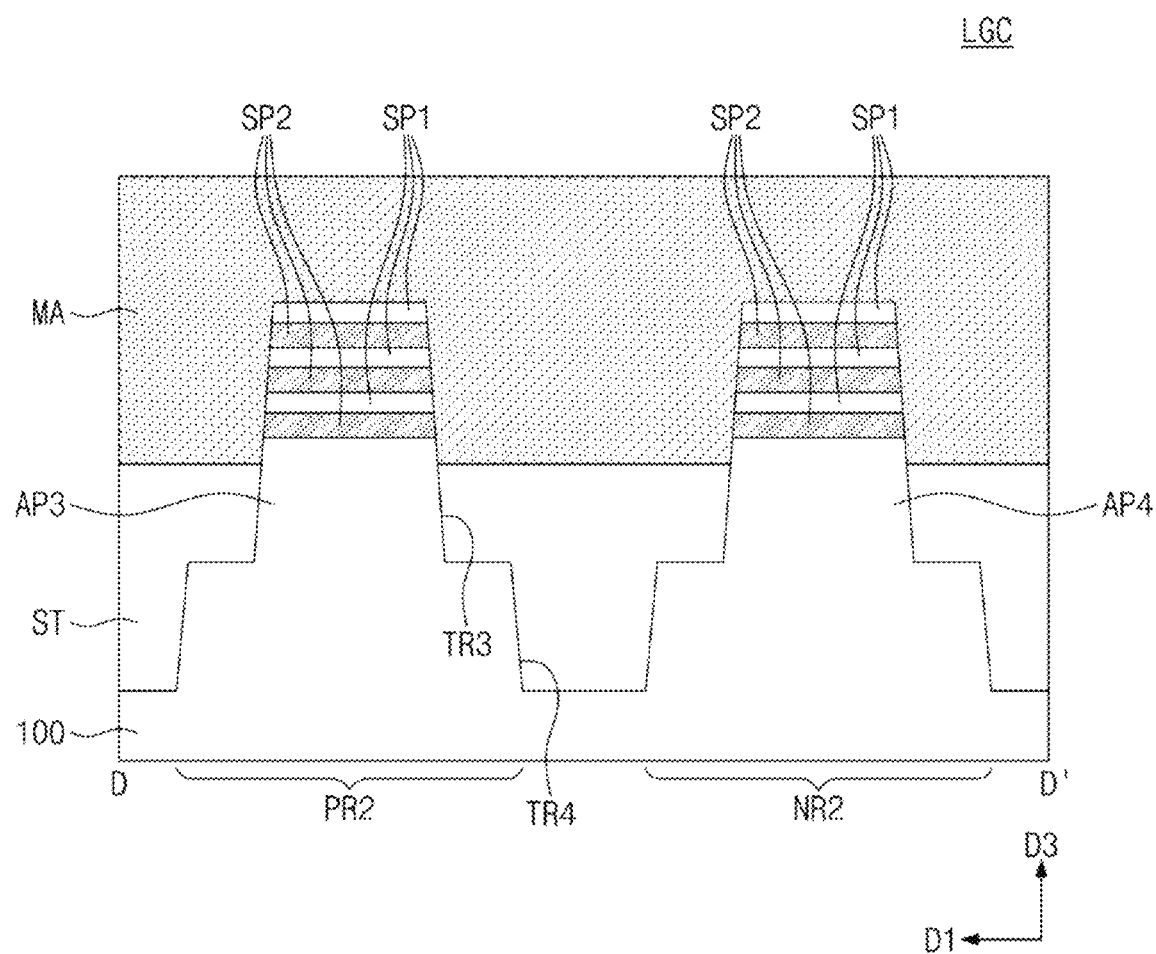
Figure 8:
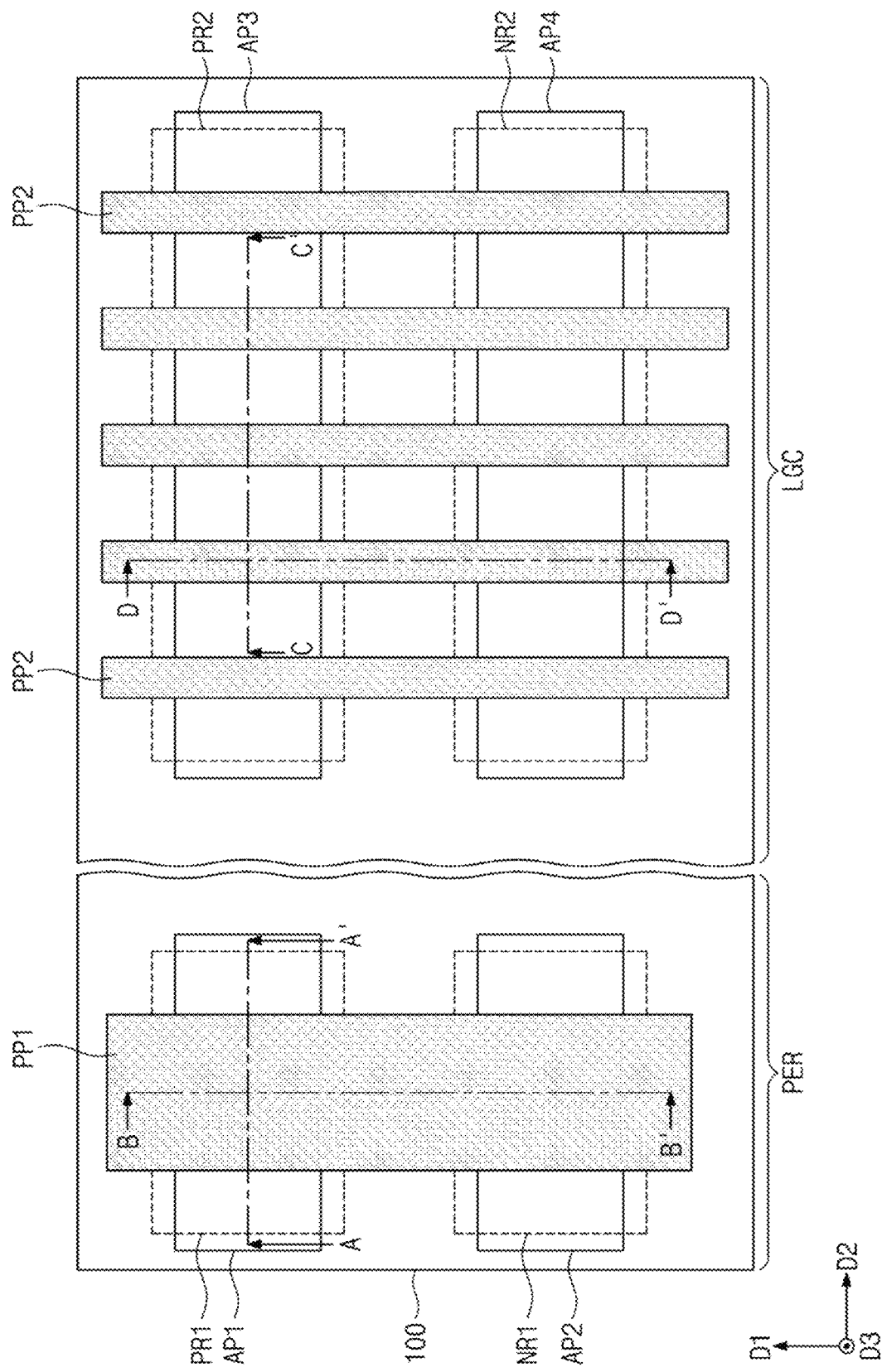
Figure 9A:
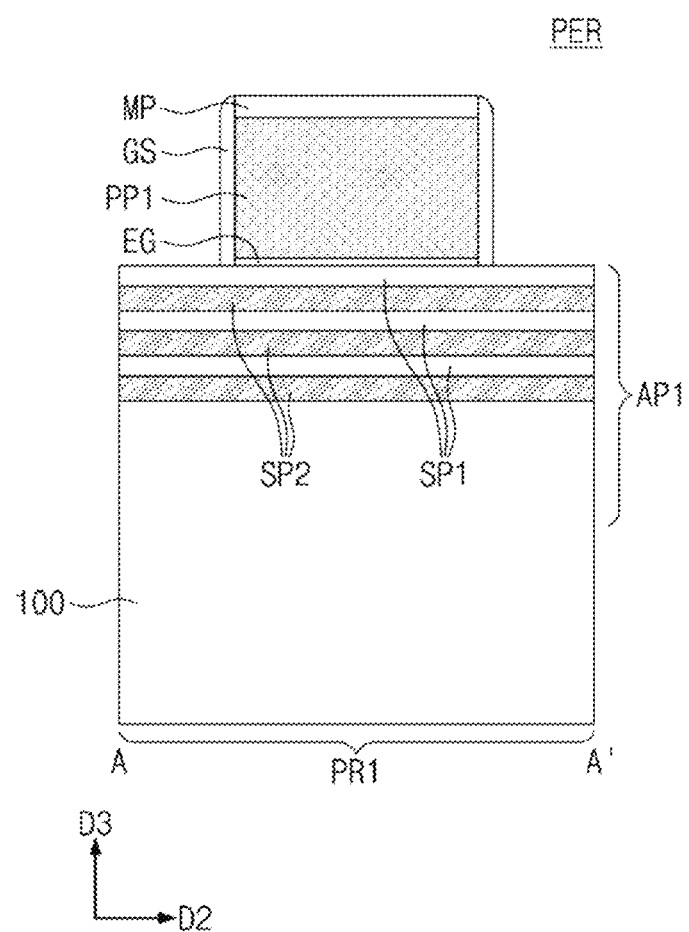
Figure 9B:
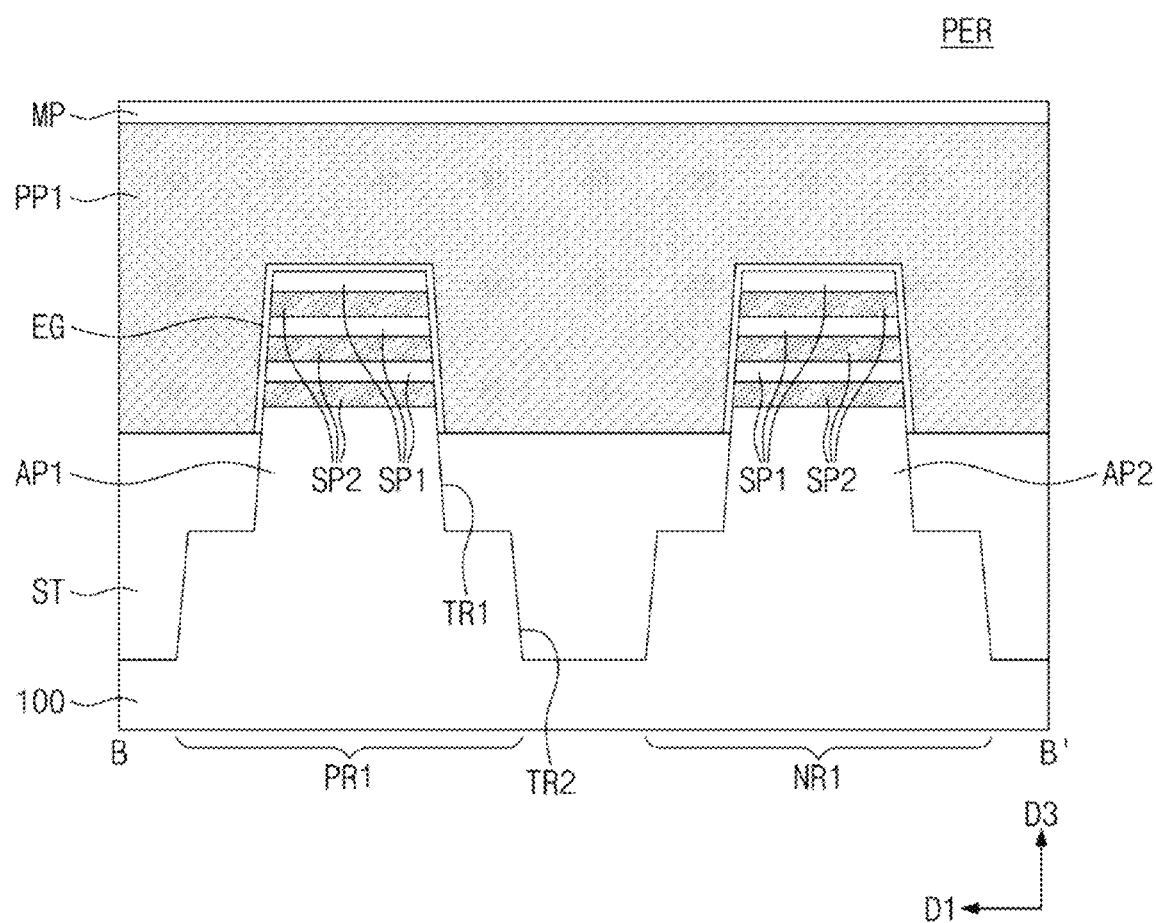
Figure 9C:
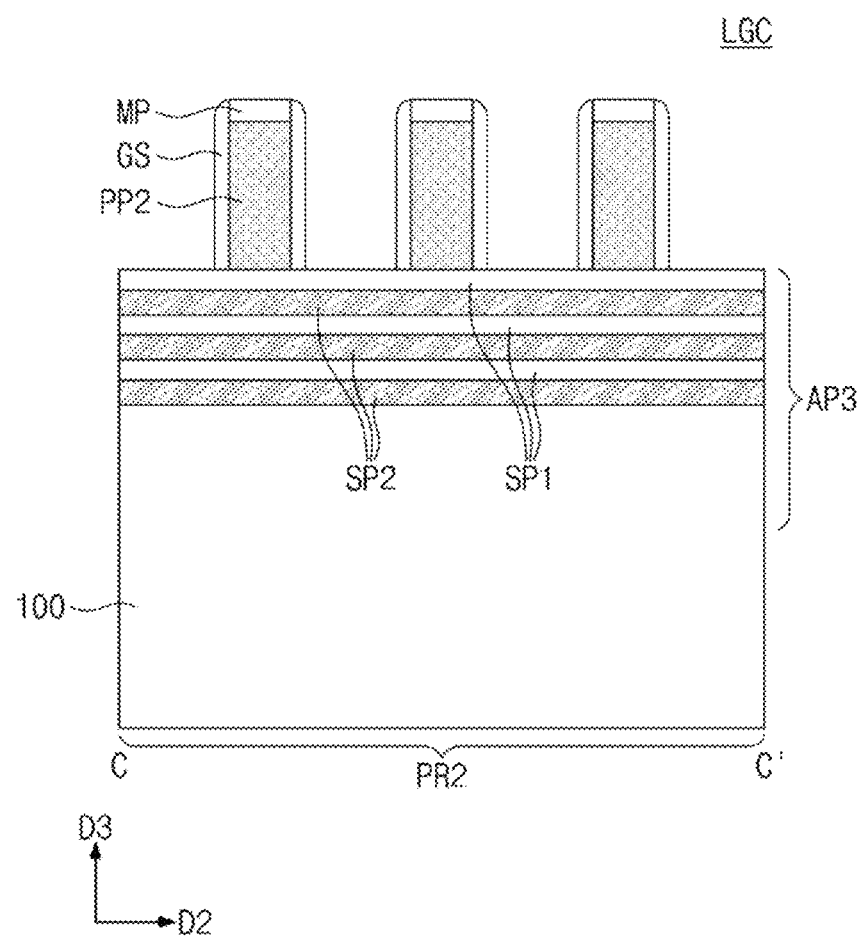
Figure 9D:
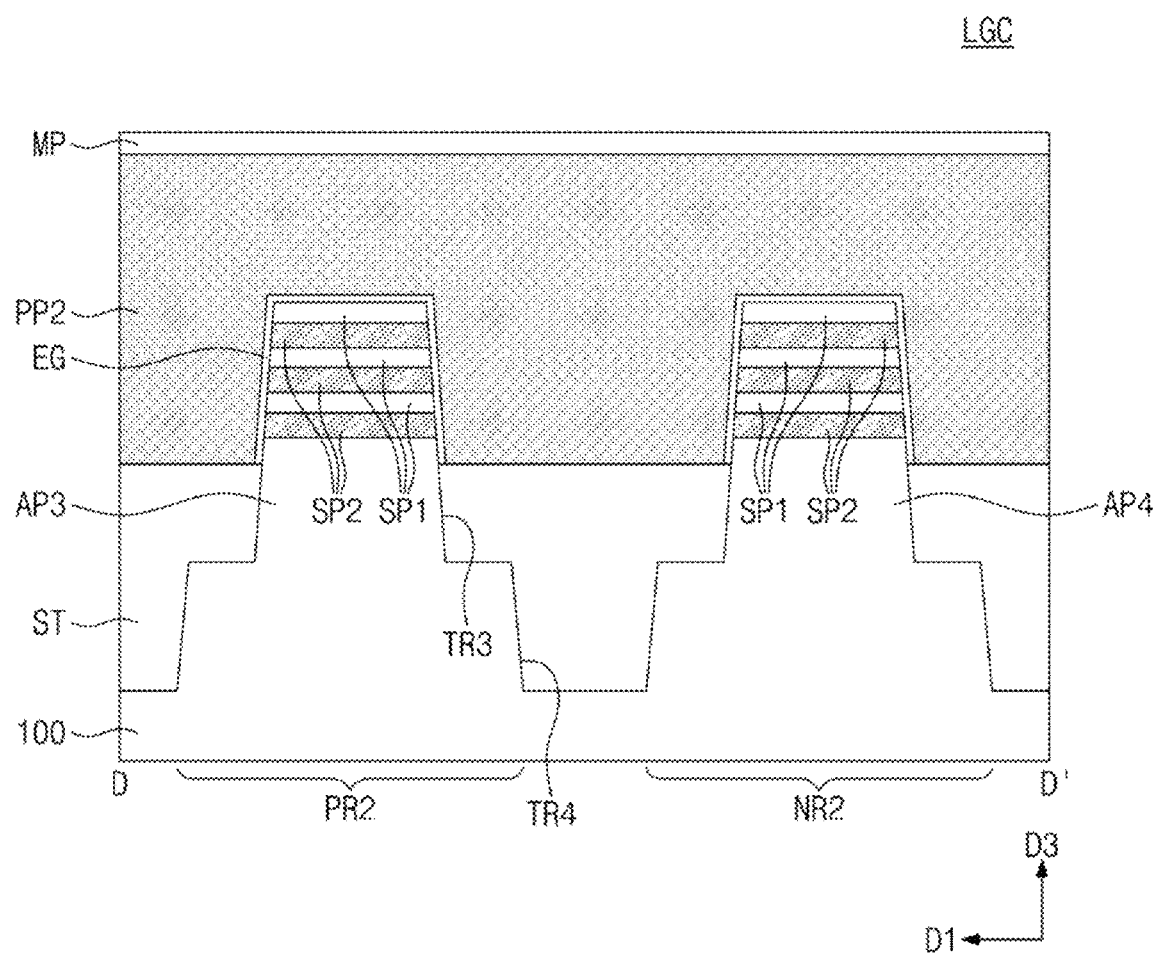
Figure 10:
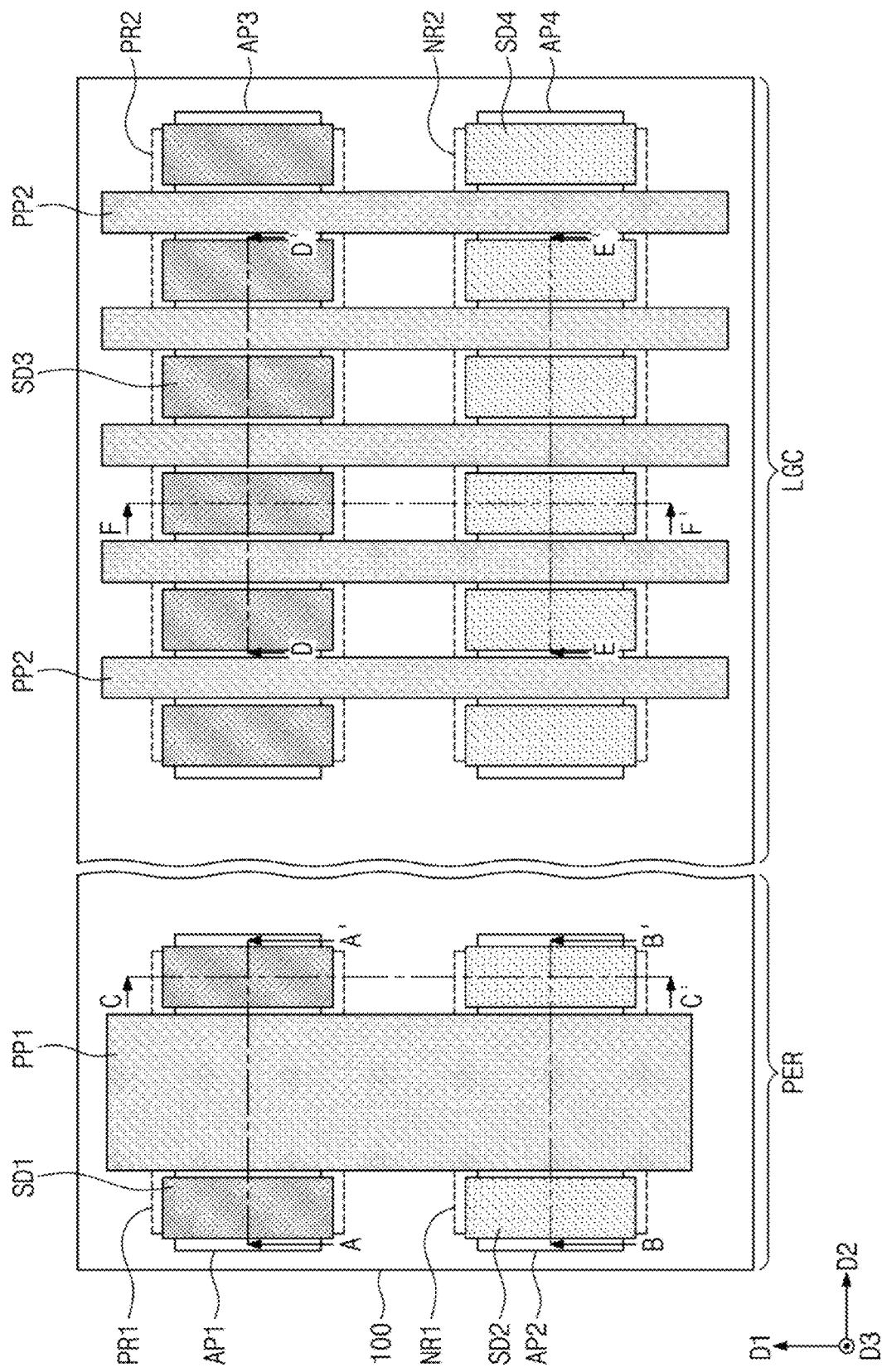

FIG. 3 is an enlarged cross-sectional view of region 'M' of FIG. 2A. A concentration profile of the dipole element of the first gate insulating layer GI1 is illustrated in FIG. 3. Referring to FIG. 3, a concentration of the dipole element may increase from an interface between the first gate electrode GE1 and the high-k dielectric layer HK toward the second insulating layer IL, may reach the maximum value, and then may decrease toward an interface between the first insulating layer EG and the first semiconductor pattern SP1. The first semiconductor pattern SP1 here is one (e.g. top one as shown in FIG. 2A) of the first semiconductor patterns SP1 adjacent to the first insulating layer EG and in direct contact with the first insulating layer EG.

The dipole element may have a first concentration CN1 at the interface between the first gate electrode GE1 and the high-k dielectric layer HK, a second concentration CN2 in the second insulating layer IL, and a third concentration CN3 at the interface between the first insulating layer EG and the first semiconductor pattern SP1. The second concentration CN2 may be the maximum value of the concentration of the dipole element in the first gate insulating layer GI1. The third concentration CN3 may be greater than the first concentration CN1.

Referring again to FIG. 2E, the second gate insulating layer GI2 of the transistor of the logic cell region LGC may also include the dipole element. Thus, the threshold voltage of the transistor of the logic cell region LGC may be adjusted using the dipole element included in the second gate insulating layer GI2. In other words, the second gate insulating layer GI2 may contain, for example, lanthanum (La) or aluminum (Al) as impurities. However, in an exemplary embodiment of the present inventive concept, the second gate insulating layer GI2 may not include the dipole element. When the second gate insulating layer GI2 contains the dipole element, the second gate insulating layer GI2 may include a dipole-interface formed between the high-k dielectric layer HK and the second insulating layer IL. An effective work function of the second gate electrode GE2 may be adjusted using the dipole element. By controlling the effective work function of the second gate electrode GE2, the threshold voltage of the transistor of the logic cell region LGC may be controlled. As a result, the semiconductor device according to the present exemplary embodiment may have high reliability and excellent electrical characteristics.

The second gate insulating layer GI2 may contain the same dipole element on both the second PMOSFET region PR2 and the second NMOSFET region NR2. However, the present inventive concept is not limited thereto. To set lower threshold voltage of the transistor of the logic cell region LGC, lower work function may be required for NMOSFET, or higher work function may be required for PMOSFET. In an exemplary embodiment of the present inventive concept, the second gate insulating layer GI2 may contain aluminum (Al) on the second PMOSFET region PR2 and may contain lanthanum (La) on the second NMOSFET region NR2 for obtaining lower threshold voltages for the transistors of the logic cell region LGC. In an exemplary embodiment of the present inventive concept, the second gate insulating layer GI2 may contain lanthanum (La) on the second PMOSFET region PR2 and may contain aluminum (Al) on the second NMOSFET region NR2 for obtaining higher threshold voltages for the transistors of the logic cell region LGC.

In an exemplary embodiment of the present inventive concept, the maximum concentration (i.e., CN2) of the dipole element in the first gate insulating layer GI1 may be greater than the maximum concentration of the dipole element in the second gate insulating layer GI2. The dipole element in the first gate insulating layer GI1 may be the same as or different from the dipole element in the second gate insulating layer GI2.

Figure 2E:
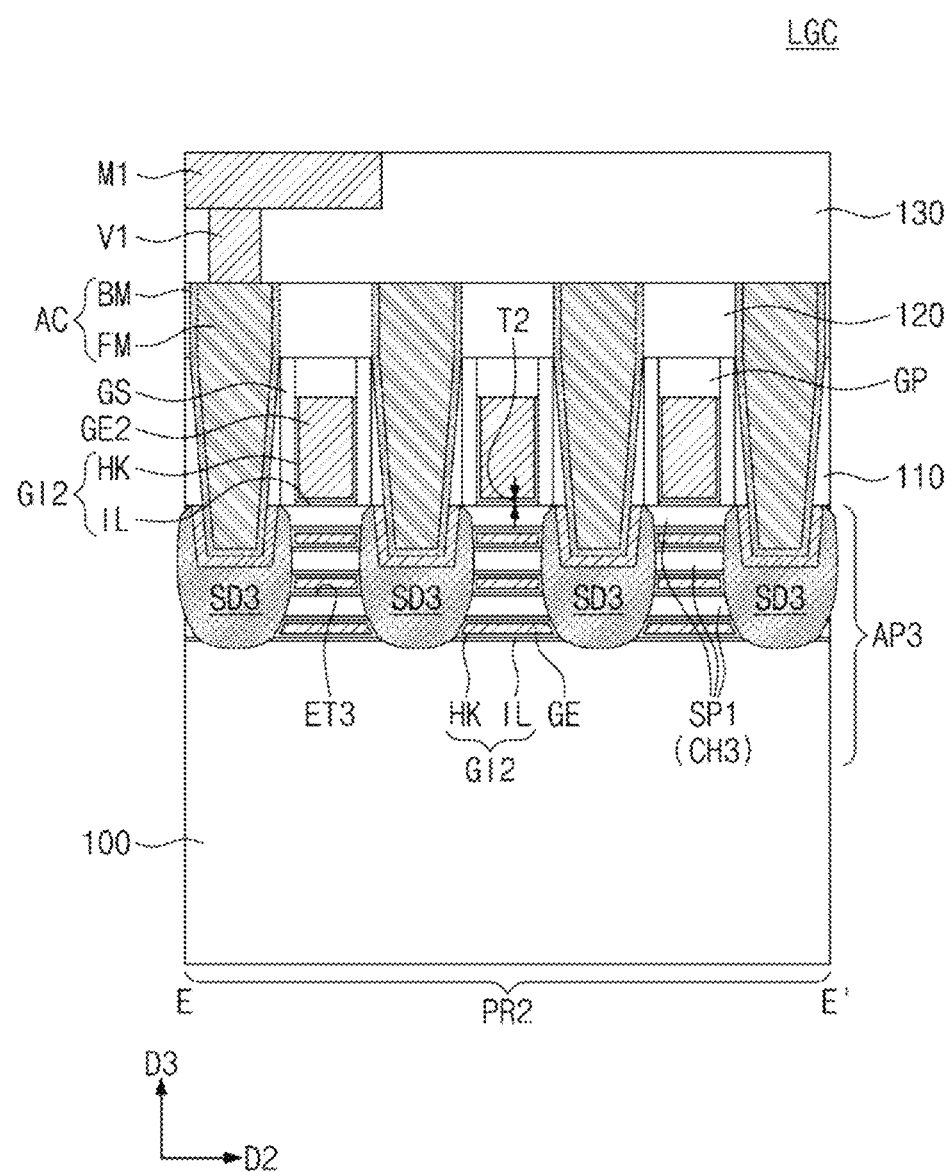
Figure 2F:
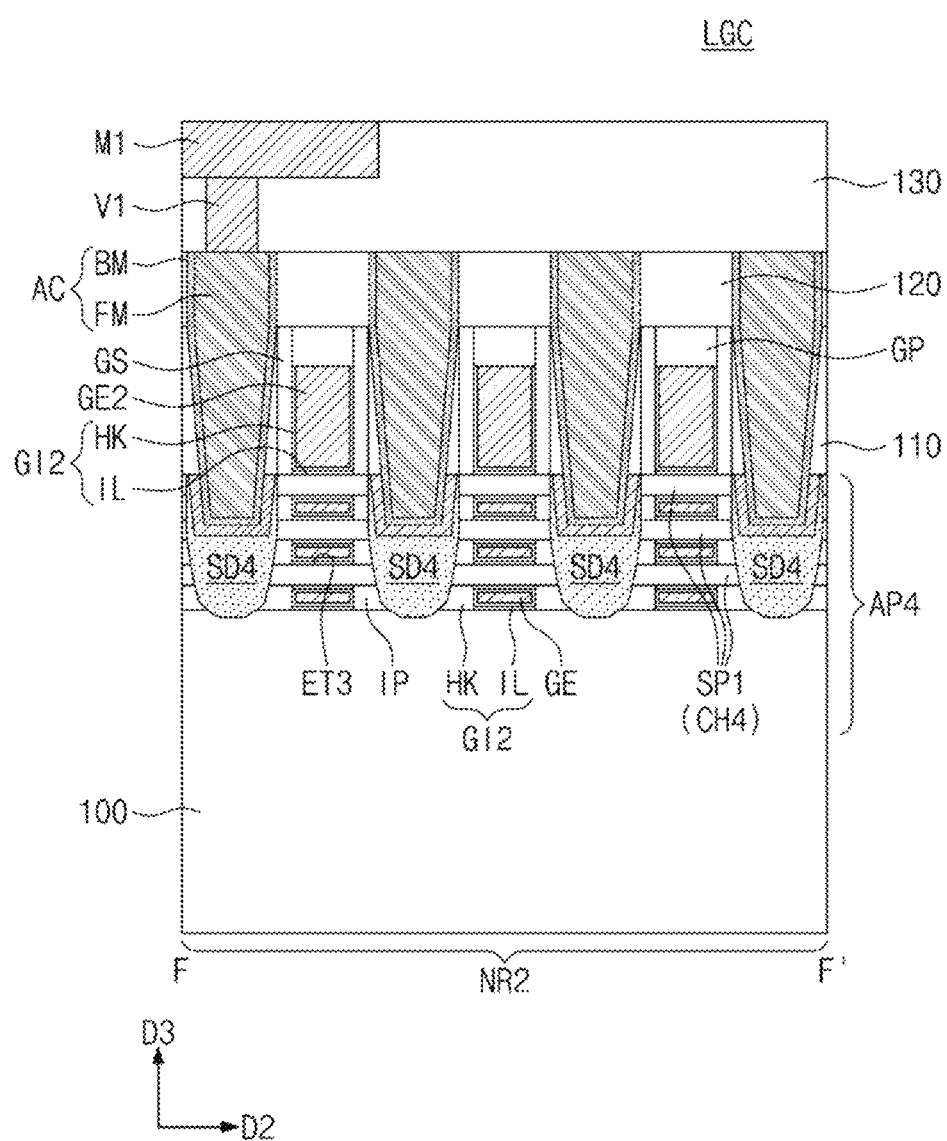
Figure 2G:
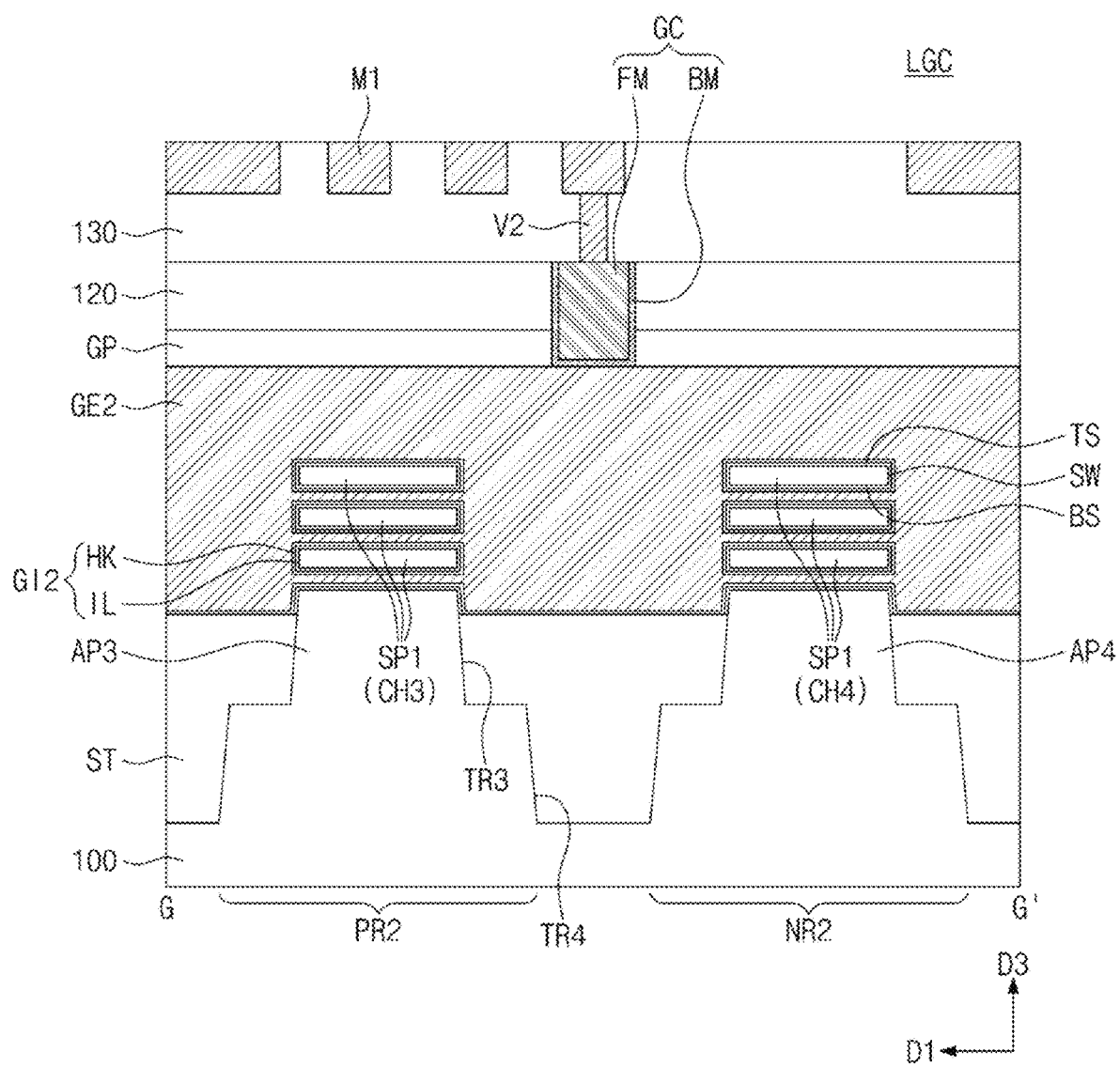
Figure 2H:
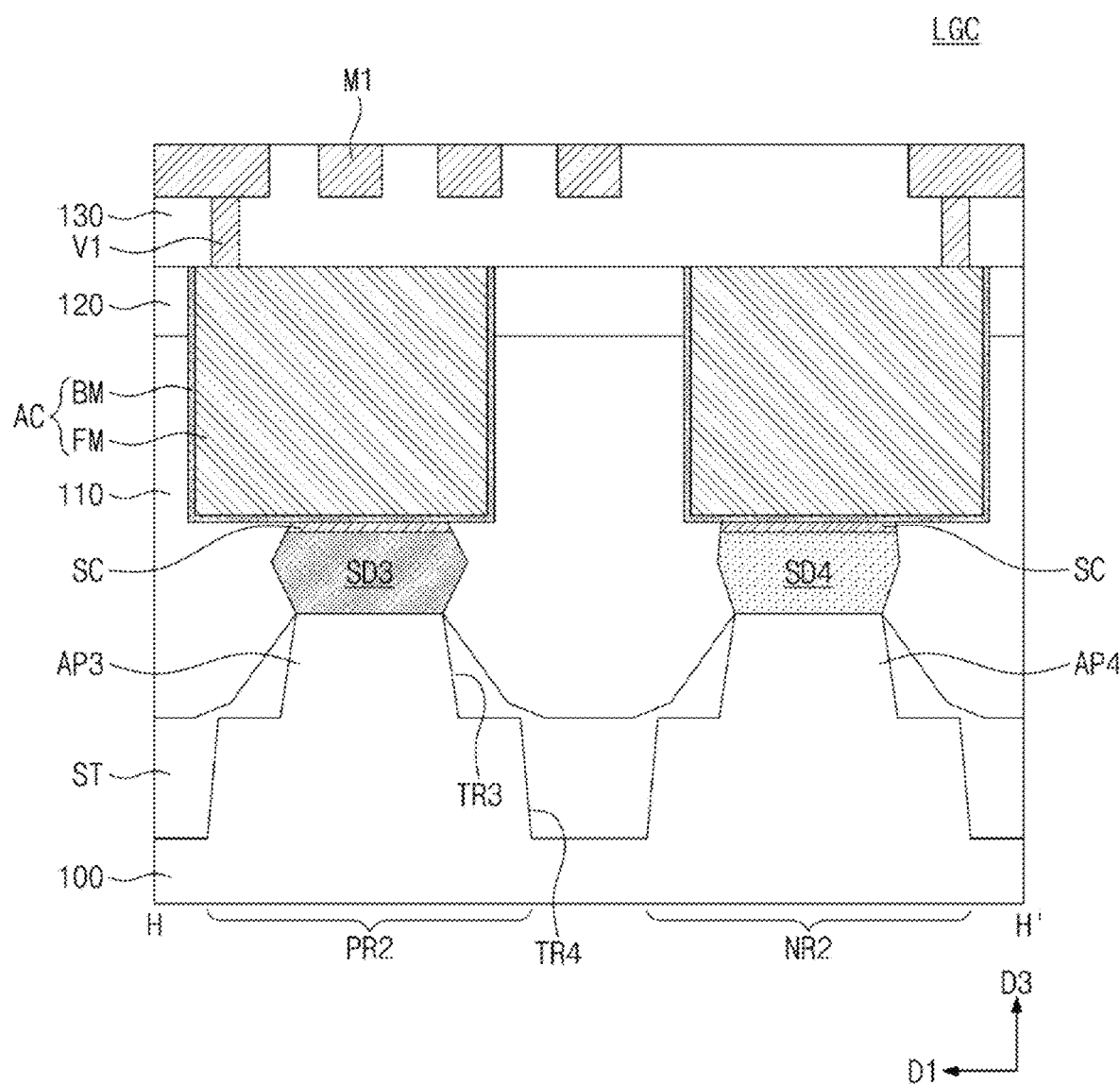

As described above, the operating power of the transistors of the peripheral region PER may be higher than the operating power of the transistors of the logic cell region LGC. The transistors of the peripheral region PER may control the functions of, for example, the transistors of the logic cell region LGC. The first gate insulating layer GI1 may be thicker than the second gate insulating layer GI2. This may be because the first gate insulating layer GI1 further includes the first insulating layer EG as compared with the second gate insulating layer GI2. In detail, as illustrated in FIG. 2A, the first gate insulating layer GI1 may have a first thickness T1 on the top surface of the first semiconductor pattern SP1. Referring to FIG. 2E, the second gate insulating layer GI2 may have a second thickness T2 less than the first thickness T1 on the top surface of the first semiconductor pattern SP1. In addition, referring again to FIG. 1, a first width W1 of the first gate electrode GE1 in the second direction D2 may be greater than a second width W2 of the second gate electrode GE2 in the second direction D2.

Figure 11A:
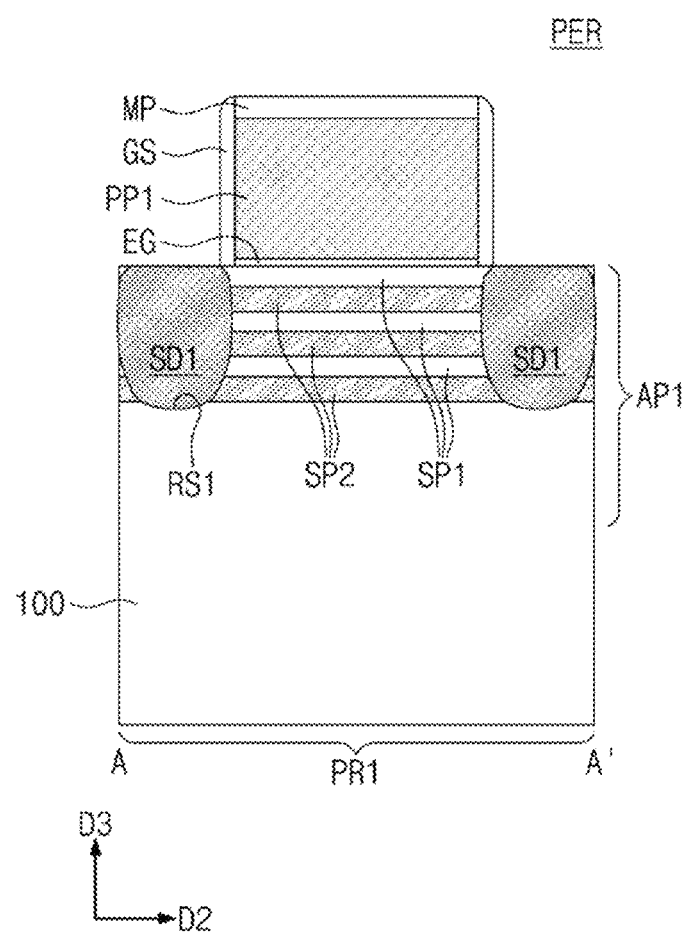
Figure 11B:
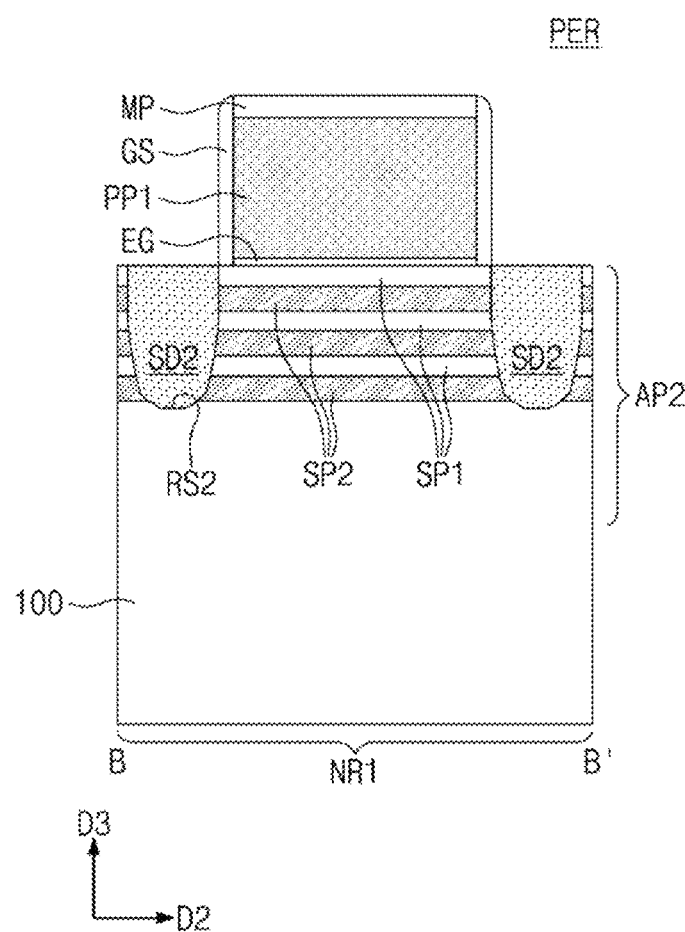
Figure 11C:
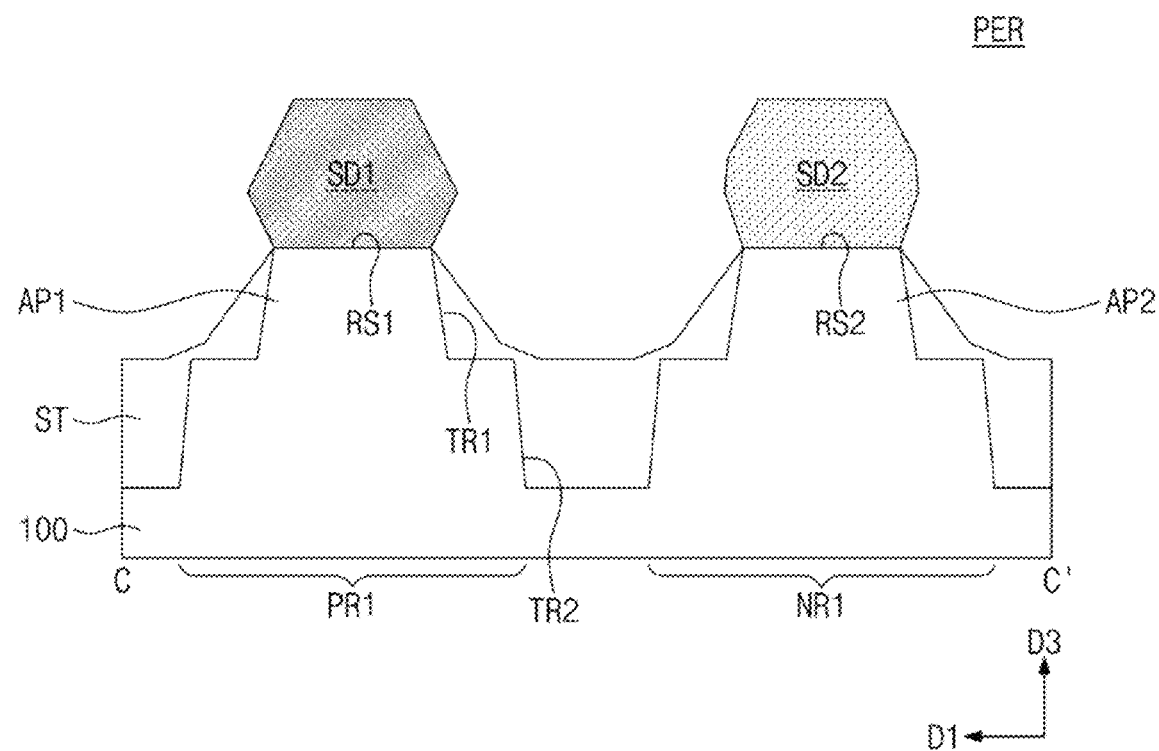
Figure 11D:
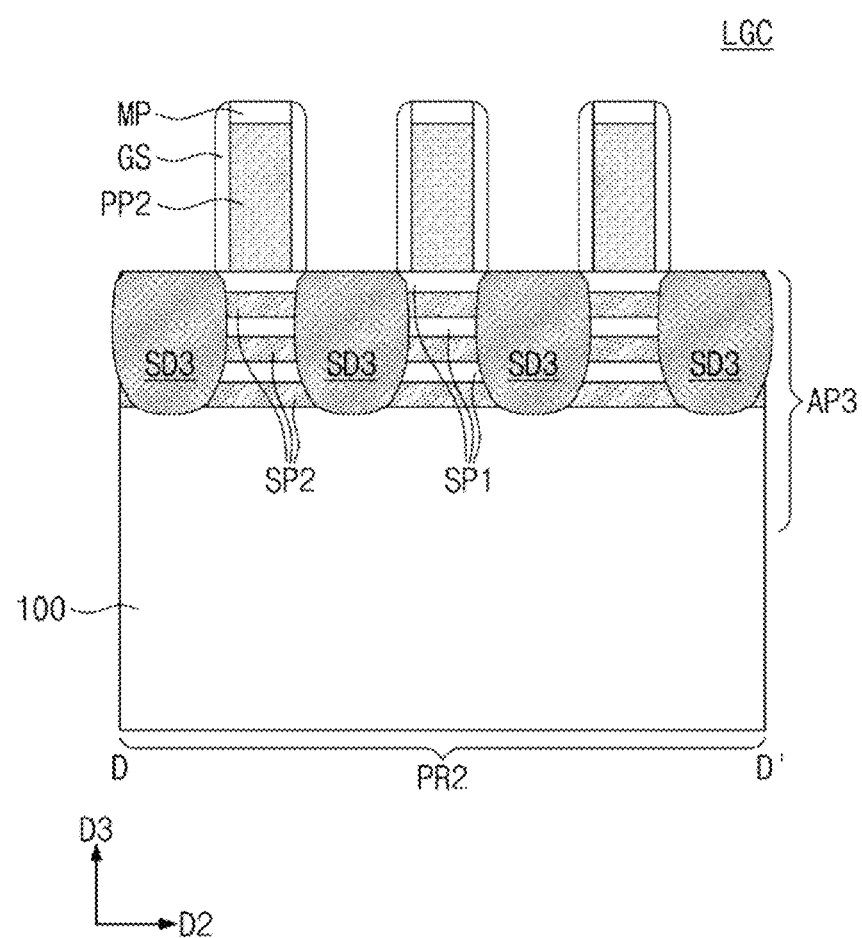
Figure 11E:
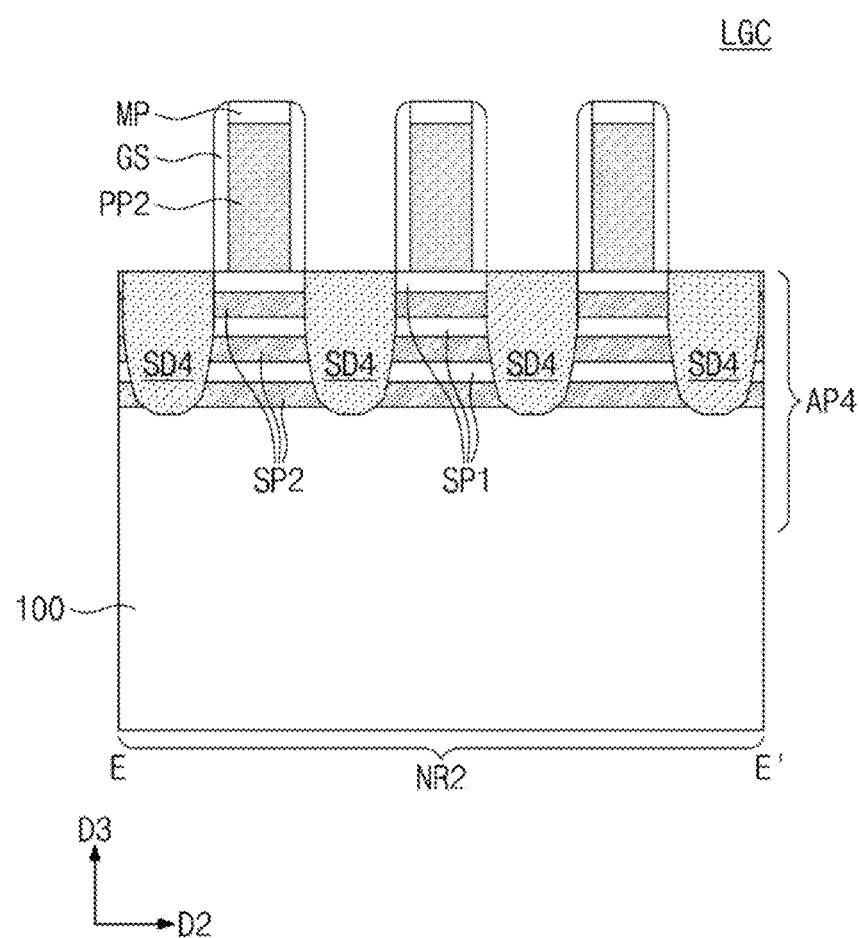
FIGS. 11E, 13E and 15E are cross-sectional views taken along lines E-E' of FIGS. 10, 12 and 14, respectively.
Figure 11F:
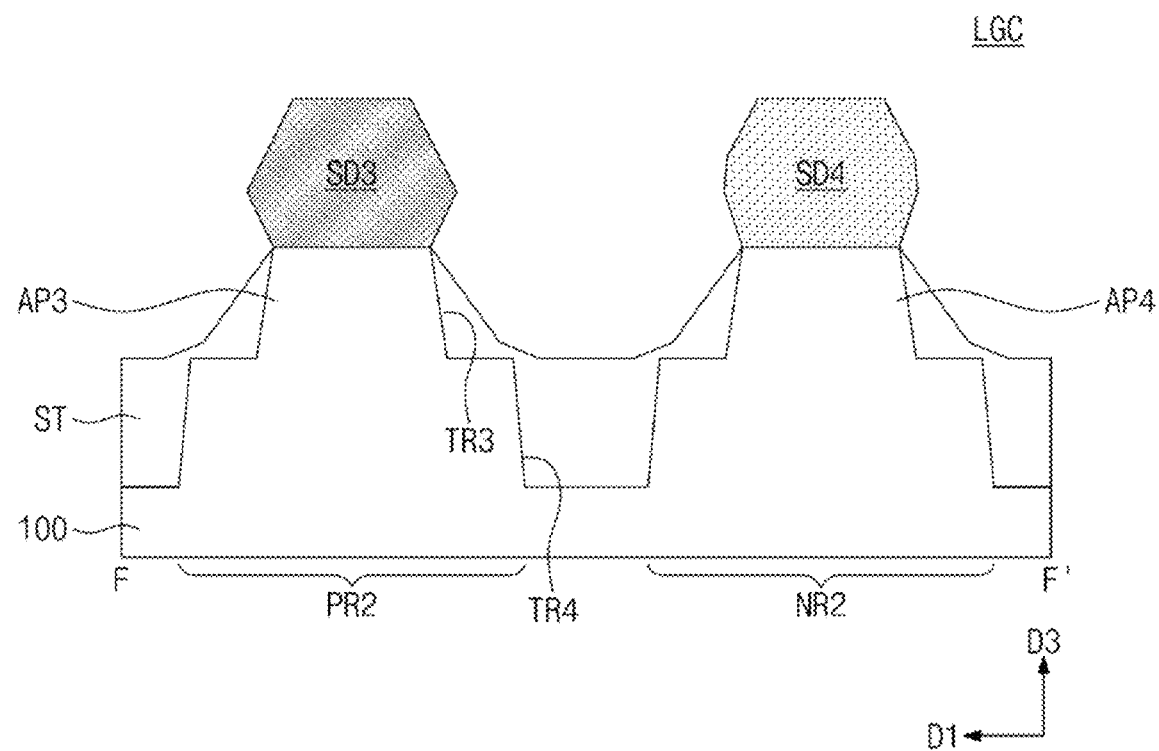
FIGS. 11F, 13F and 15F are cross-sectional views taken along lines F-F' of FIGS. 10, 12 and 14, respectively.
Figure 15A:
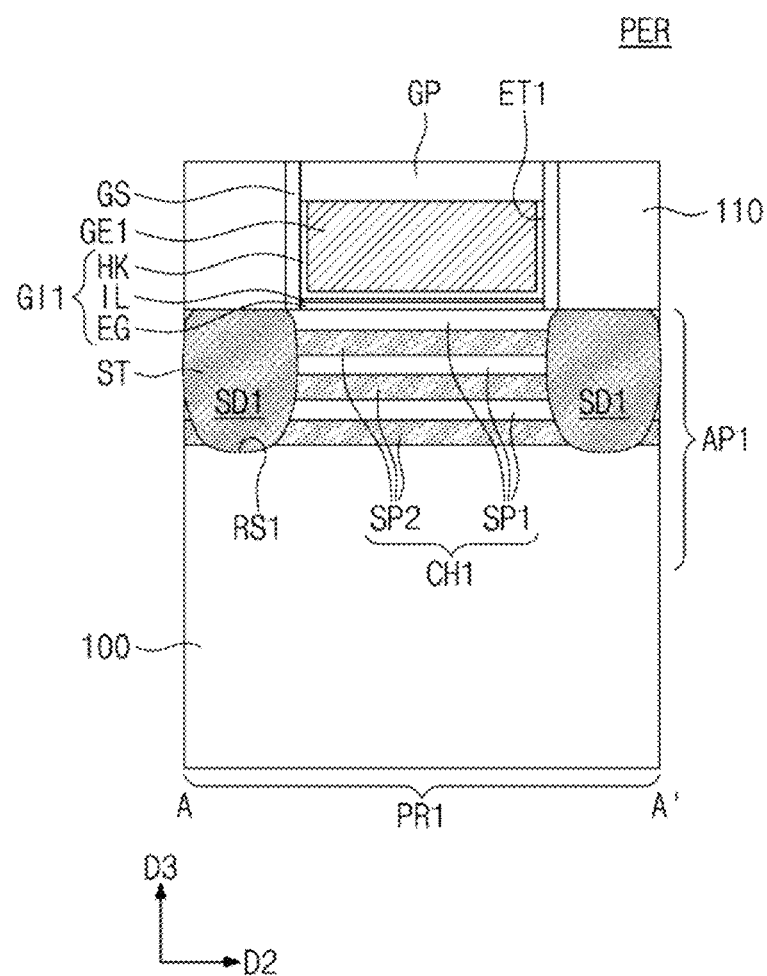
Figure 15B:
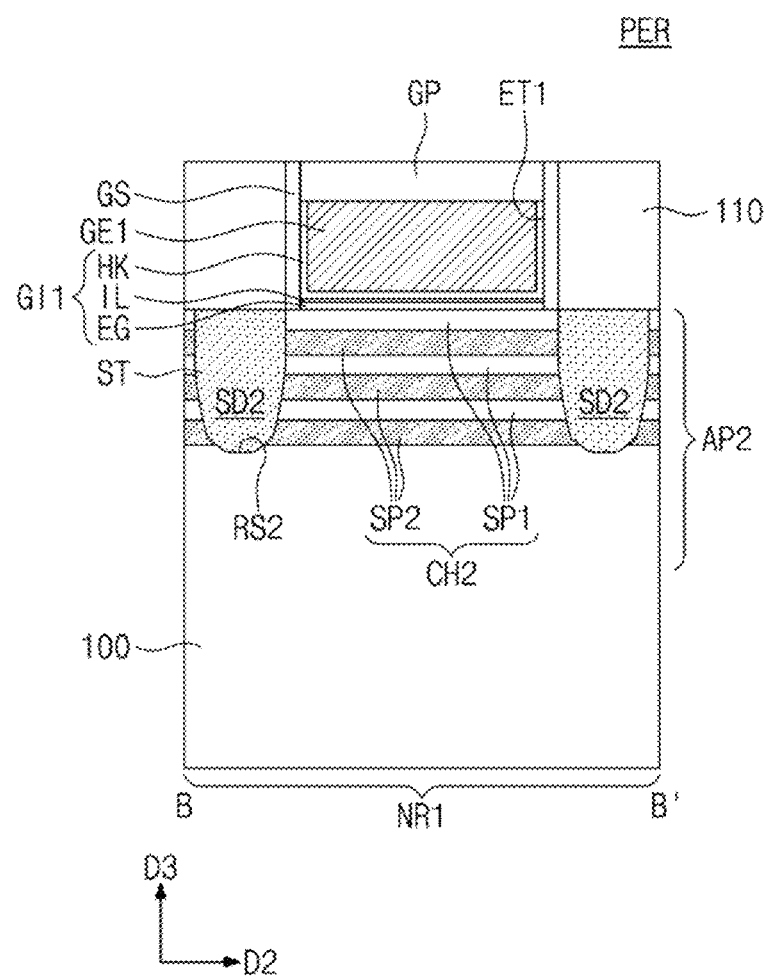
Figure 15C:
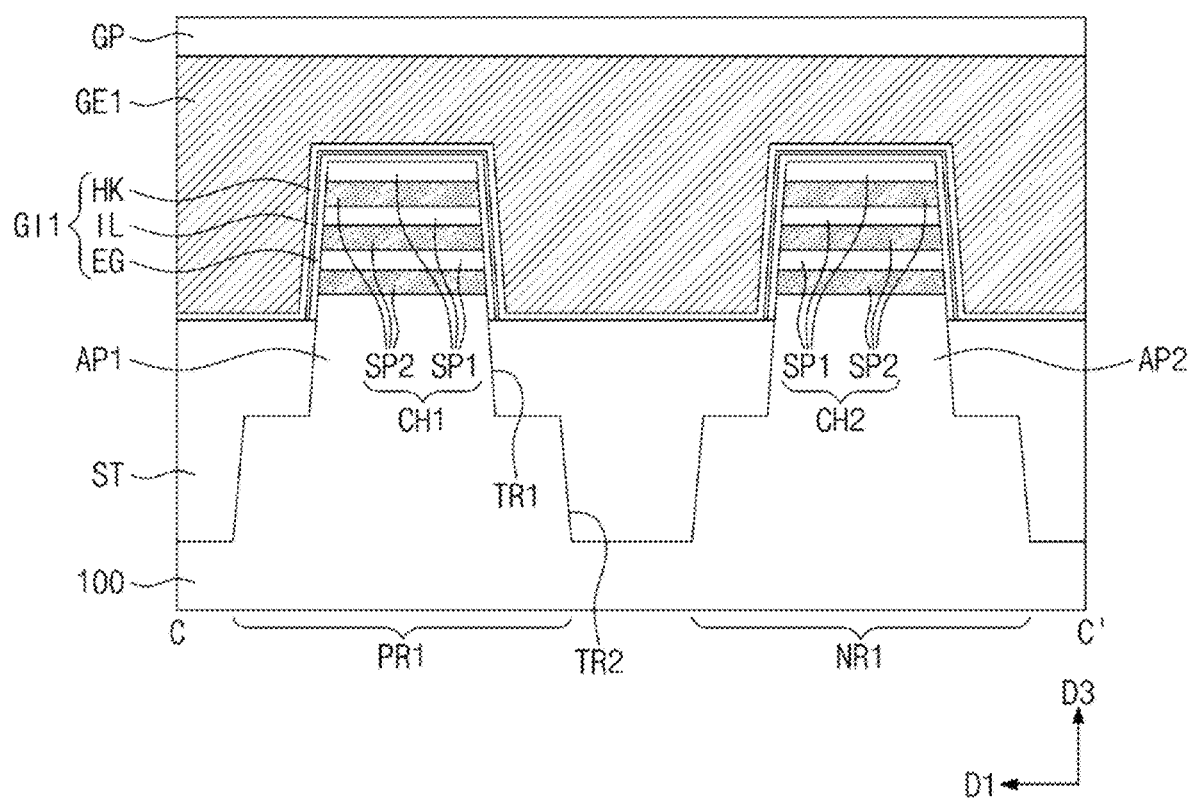
Figure 15D:
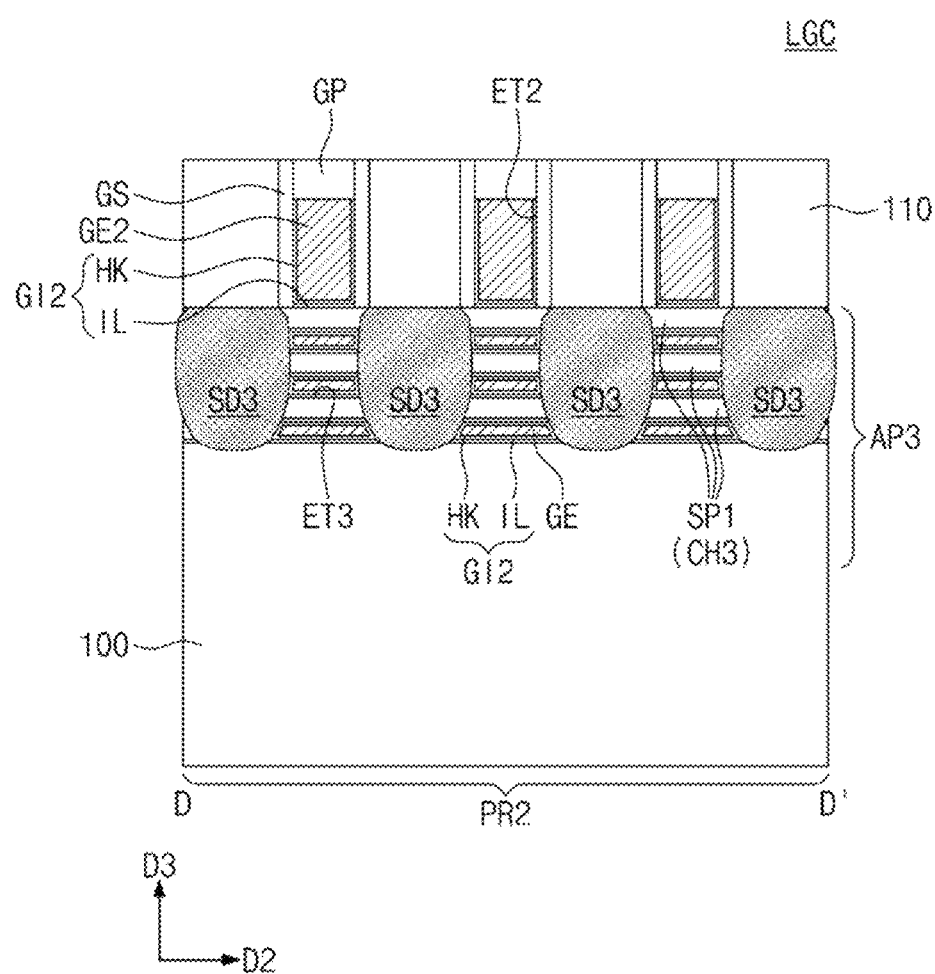
Figure 15E:
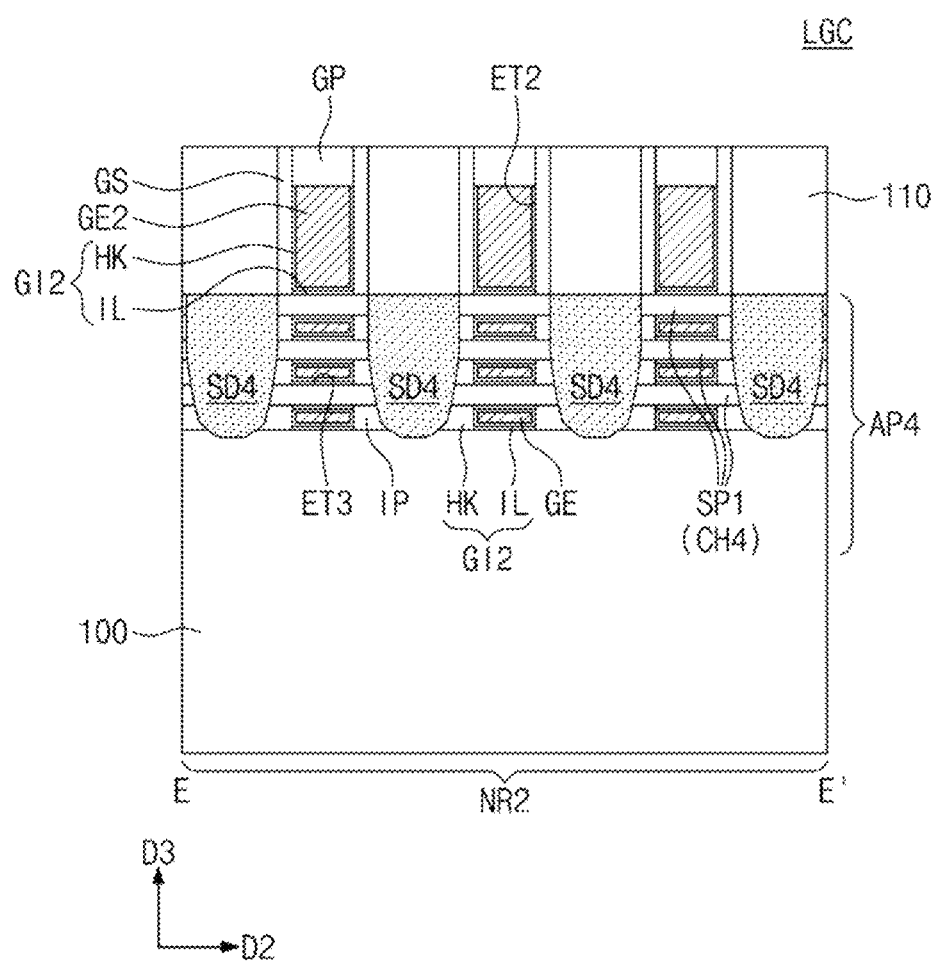
Figure 15F:
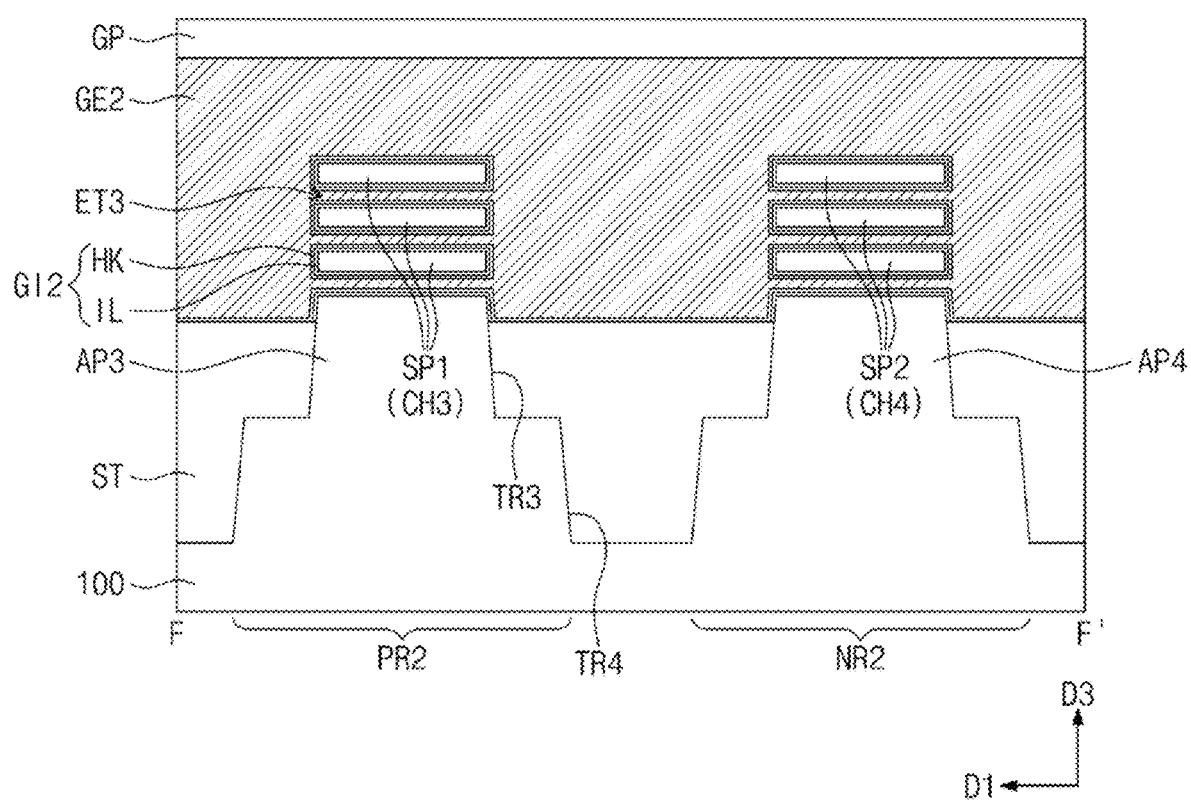

FIGS. 4, 6, 8, 10, 12 and 14 are plan views illustrating a method for manufacturing a semiconductor device, according to an exemplary embodiment of the present inventive concept. FIGS. 5A, 7A, 9A, 11A, 13A and 15A are cross-sectional views taken along lines A-A' of FIGS. 4, 6, 8, 10, 12 and 14, respectively. FIGS. 5B, 7B, 9B, 11B, 13B and 15B are cross-sectional views taken along lines B-B' of FIGS. 4, 6, 8, 10, 12 and 14, respectively. FIGS. 5C, 7C, 9C, 11C, 13C and 15C are cross-sectional views taken along lines C-C' of FIGS. 4, 6, 8, 10, 12 and 14, respectively. FIGS. 5D, 7D, 9D, 11D, 13D and 15D are cross-sectional views taken along lines D-D' of FIGS. 4, 6, 8, 10, 12 and 14, respectively. FIGS. 11E, 13E and 15E are cross-sectional views taken along lines E-E' of FIGS. 10, 12 and 14, respectively. FIGS. 11F, 13F and 15F are cross-sectional views taken along lines F-F' of FIGS. 10, 12 and 14, respectively.

Referring to FIGS. 4 and 5A to 5D, a substrate 100 including a peripheral region PER and a logic cell region LGC may be provided. First semiconductor layers and second semiconductor layers may be alternately formed on the substrate 100. The first semiconductor layers may include one of silicon (Si), germanium (Ge), and silicon-germanium (SiGe), and the second semiconductor layers may include another of silicon (Si), germanium (Ge), and silicon-germanium (SiGe) different from the one included in the first semiconductor layers. For example, the first semiconductor layers may include silicon (Si), and the second semiconductor layers may include silicon-germanium (SiGe).

A first patterning process may be performed on the substrate 100 to form first and third trenches TR1 and TR3 defining first to fourth active patterns AP1 to AP4. The first patterning process may include a photolithography process and an etch process. In the first patterning process, the first and second semiconductor layers may be patterned to form first and second semiconductor patterns SP1 and SP2. The first and second semiconductor patterns SP1 and SP2 may be alternately stacked on each of the first to fourth active patterns AP1 to AP4.

A second patterning process may be performed on the substrate 100 to form second and fourth trenches TR2 and TR4 defining a first PMOSFET region PR1, a first NMOSFET region NR1, a second PMOSFET region PR2, and a second NMOSFET region NR2. The second patterning process may include a photolithography process and an etch process. The second and fourth trenches TR2 and TR4 may be deeper than the first and third trenches TR1 and TR3. The second trench TR2 may be formed between the first PMOSFET region PR1 and the first NMOSFET region NR1 and may separate the first PMOSFET region PR1 and the first NMOSFET region NR1. The fourth trench TR4 may be formed between the second PMOSFET region PR2 and the second NMOSFET region NR2 and may separate the second PMOSFET region PR2 and the second NMOSFET region NR2.

The first PMOSFET region PR1 and the first NMOSFET region NR1 may be disposed in the peripheral region PER. The first active pattern AP1 and the second active pattern AP2 may be formed on the first PMOSFET region PR1 and the first NMOSFET region NR1, respectively. The second PMOSFET region PR2 and the second NMOSFET region NR2 may be disposed in the logic cell region LGC. The third active pattern AP3 and the fourth active pattern AP4 may be formed on the second PMOSFET region PR2 and the second NMOSFET region NR2, respectively.

A device isolation layer ST may be formed on the substrate 100 to fill the first to fourth trenches TR1 to TR4, and may include an insulating material such as a silicon oxide ($SiO_2$) layer. The device isolation layer ST may be recessed until upper portions of the first to fourth active patterns AP1 to AP4 are exposed. Thus, the upper portions of the first to fourth active patterns AP1 to AP4 may vertically protrude upward from the device isolation layer ST.

Referring to FIGS. 6 and 7A to 7D, a mask layer MA may be formed on the logic cell region LGC. The mask layer MA may cover the logic cell region LGC but may expose the peripheral region PER.

A first insulating layer EG may be formed on the first and second active patterns AP1 and AP2 of the peripheral region PER, and may not be formed on the logic cell region. The first insulating layer EG may include, for example, a silicon oxide ($SiO_2$) layer or a silicon oxynitride (SiON) layer. For example, the first insulating layer EG may be formed using an oxidation process.

A first metal oxide layer DPL1 may be formed on the first insulating layer EG of the peripheral region PER. The first metal oxide layer DPL1 may contain, for example, lanthanum (La) or aluminum (Al), which is a dipole element. For example, the first metal oxide layer DPL1 may include a lanthanum oxide ($La_2O_3$) layer or an aluminum oxide ($Al_2O_3$) layer.

Due to the mask layer MA, the first insulating layer EG and the first metal oxide layer DPL1 may not be formed on the third and fourth active patterns AP3 and AP4 of the logic cell region LGC.

After the formation of the first metal oxide layer DPL1, an annealing process may be performed on the peripheral region PER to diffuse the dipole element of the first metal oxide layer DPL1 into the first insulating layer EG. In other words, the dipole element diffused from the first metal oxide layer DPL1 may be injected into the first insulating layer EG as impurities. For example, since the first metal oxide layer DPL1 may contain, for example, lanthanum (La) or aluminum (Al) as the dipole element, the first insulating layer EG of the peripheral region PER may include lanthanum (La) or aluminum (Al) as impurities after the annealing process. Thereafter, the first metal oxide layer DPL1 may be selectively removed.

Referring to FIGS. 8 and 9A to 9D, the mask layer MA may be removed. A first sacrificial pattern PP1 intersecting the first and second active patterns AP1 and AP2 may be formed on the peripheral region PER. Second sacrificial patterns PP2 intersecting the third and fourth active patterns AP3 and AP4 may be formed on the logic cell region LGC. Each of the first and second sacrificial patterns PP1 and PP2 may have a line or bar shape extending in the first direction D1. The second sacrificial patterns PP2 may extend in parallel with each other in the first direction D1, and may be arranged and spaced apart from each other in the second direction D2. A width of the first sacrificial pattern PP1 may be greater than a width of the second sacrificial pattern PP2.

The formation of the first and second sacrificial patterns PP1 and PP2 may include forming a sacrificial layer on an entire top surface of the substrate 100, forming hard mask patterns MP on the sacrificial layer, and patterning the sacrificial layer using the hard mask patterns MP as etch masks. The sacrificial layer may include poly-silicon (p-Si).

Referring again to FIG. 9A, on the peripheral region PER, a portion of the first insulating layer EG covered by the first sacrificial pattern PP1 may remain, but the other portion of the first insulating layer EG not covered by the first sacrificial pattern PP1 may be removed. For example, the other portion of the first insulating layer EG not covered by the first sacrificial pattern PP1 may be removed during the process of patterning the sacrificial layer to form the first sacrificial pattern PP1.

A pair of gate spacers GS may be formed on both sidewalls of each of the first and second sacrificial patterns PP1 and PP2, respectively. The formation of the gate spacers GS may include conformally forming a gate spacer layer on an entire top surface of the substrate 100 and anisotropically etching the gate spacer layer. To form the gate spacer layer, a process such as, for example, an atomic layer deposition (ALD) process, a chemical vapor deposition (CVD) process, or a combination thereof may be used. For example, the gate spacer layer may include at least one of, for example, silicon carbonitride (SiCN), silicon carbon oxynitride (SiCON), or silicon nitride ($Si_3N_4$). In an exemplary embodiment of the present inventive concept, the gate spacer layer may be formed of a multi-layer including at least two of silicon carbonitride (SiCN), silicon carbon oxynitride (SiCON), or silicon nitride ($Si_3N_4$).

Referring to FIGS. 10 and 11A to 11F, first to fourth source/drain patterns SD1 to SD4 may be formed in upper portions of the first to fourth active patterns AP1 to AP4, respectively.

The first source/drain patterns SD1 may be formed in the upper portion of the first active pattern AP1. A pair of the first source/drain patterns SD1 may be formed at both sides of the first sacrificial pattern PP1, respectively. In detail, the upper portion of the first active pattern AP1 may be etched using the hard mask pattern MP and the gate spacers GS as etch masks to form first recess regions RS1. The device isolation layer ST at both sides of the first active pattern AP1 may be recessed while the upper portion of the first active pattern AP1 is etched (see FIG. 11C).

The first source/drain patterns SD1 may be formed by performing a selective epitaxial growth (SEG) process using inner surfaces of the first recess regions RS1 of the first active pattern AP1 as a seed layer. For example, the SEG process may include a chemical vapor deposition (CVD) process or a molecular beam epitaxy (MBE) process. The first source/drain patterns SD1 may include a semiconductor element (e.g., SiGe) of which a lattice constant is greater than that of a semiconductor element (e.g. Si) of the substrate 100. In an exemplary embodiment of the present inventive concept, each of the first source/drain patterns SD1 may be formed of a plurality of stacked semiconductor layers.

In an exemplary embodiment of the present inventive concept, dopants may be injected in-situ into the first source/drain patterns SD1 during the SEG process for forming the first source/drain patterns SD1. In an exemplary embodiment of the present inventive concept, the dopants may be injected or implanted into the first source/drain patterns SD1 after the SEG process for forming the first source/drain patterns SD1. For example, an ion implantation process may be used to inject the dopants into the first source/drain patterns SD1 after the SEG process. The first source/drain patterns SD1 may be doped with dopants of a first conductivity type (e.g., a P-type). In an exemplary embodiment of the present inventive concept, each of the first source/drain patterns SD1 may include a silicon germanium (SiGe) layer doped with P-type dopants such as, for example, boron (B), aluminum (Al), gallium (Ga), or indium (In).

Second source/drain patterns SD2 may be formed in the upper portion of the second active pattern AP2. A pair of the second source/drain patterns SD2 may be formed at both sides of the first sacrificial pattern PP1, respectively.

The upper portion of the second active pattern AP2 may be etched using the hard mask pattern MP and the gate spacers GS as etch masks to form second recess regions RS2. The second source/drain patterns SD2 may be formed by performing a SEG process using inner surfaces of the second recess regions RS2 of the second active pattern AP2 as a seed layer. For example, the second source/drain patterns SD2 may include a semiconductor element (e.g., silicon) the same as that of the substrate 100. The second source/drain patterns SD2 may be doped with dopants of a second conductivity type (e.g., an N-type). In an exemplary embodiment of the present inventive concept, each of the second source/drain patterns SD2 may include a silicon (Si) layer doped with N-type dopants such as, for example, phosphorus (P), arsenic (As), antimony (Sb) or bismuth (Bi).

A method of forming the third source/drain patterns SD3 in the upper portion of the third active pattern AP3 may be substantially the same as the aforementioned method of forming the first source/drain patterns SD1. The first source/drain patterns SD1 and the third source/drain patterns SD3 may be formed at the same time. A method of forming the fourth source/drain patterns SD4 in the upper portion of the fourth active pattern AP4 may be substantially the same as the aforementioned method of forming the second source/drain patterns SD2. The second source/drain patterns SD2 and the fourth source/drain patterns SD4 may be formed at the same time.

Referring to FIGS. 12 and 13A to 13F, a first interlayer insulating layer 110 may be formed to cover the first to fourth source/drain patterns SD1 to SD4, the hard mask patterns MP, and the gate spacers GS. For example, the first interlayer insulating layer 110 may include a silicon oxide ($SiO_2$) layer.

The first interlayer insulating layer 110 may be planarized until top surfaces of the first and second sacrificial patterns PP1 and PP2 are exposed. The planarization process of the first interlayer insulating layer 110 may be performed using an etch-back process or a chemical mechanical polishing (CMP) process. The hard mask patterns MP may be completely removed during the planarization process. As a result, a top surface of the first interlayer insulating layer 110 may be substantially coplanar with the top surfaces of the first and second sacrificial patterns PP1 and PP2 and top surfaces of the gate spacers GS.

The first and second sacrificial patterns PP1 and PP2 may be selectively removed. A first empty space ET1 exposing the first and second active patterns AP1 and AP2 may be formed by the removal of the first sacrificial pattern PP1 (see FIG. 13C). Second empty spaces ET2 exposing the third and fourth active patterns AP3 and AP4 may be formed by the removal of the second sacrificial patterns PP2 (see FIG. 13F).

The second semiconductor patterns SP2 on the logic cell region LGC may be selectively removed, while the second semiconductor patterns SP2 on the peripheral region PER may not be removed. For example, during the process of removing the second semiconductor patterns SP2 on the logic cell region LGC, the second semiconductor patterns SP2 on the peripheral region PER may be covered and not exposed to the etchant. In detail, referring again to FIG. 13F, the second semiconductor patterns SP2 may be exposed by the second empty space ET2, and may be removed by performing an etching process for selectively removing the second semiconductor patterns SP2. The first semiconductor patterns SP1 may not be removed but may remain. Third empty spaces ET3 may be formed by the removal of the second semiconductor patterns SP2. For example, to form the third empty spaces ET3, the second semiconductor patterns SP2 may be selectively etched by using an etching selectivity difference between the second semiconductor patterns SP2 and the first semiconductor patterns SP1. In an exemplary embodiment of the present inventive concept, the third empty spaces ET3 may be formed by a wet etching process. Each of the third empty spaces ET3 may be defined between the first semiconductor patterns SP1 vertically adjacent to each other.

Referring again to FIG. 13E, an insulating pattern IP may be formed in the third empty space ET3 on the second NMOSFET region NR2, and may partially fill the third empty space ET3. The insulating pattern IP may be in contact with the fourth source/drain pattern SD4.

Referring to FIGS. 14 and 15A to 15F, first and second gate insulating layers GI1 and GI2 may be formed in the first and second empty spaces ET1 and ET2, respectively. In detail, a second insulating layer IL may be formed in the first and second empty spaces ET1 and ET2. The second insulating layer IL formed on the peripheral region PER may cover the first insulating layer EG. The second insulating layer IL formed on the logic cell region LGC may surround each of the first semiconductor patterns SP1. The second insulating layer IL formed on the logic cell region LGC may also be formed in the third empty space ET3.

Thereafter, a high-k dielectric layer HK may be conformally formed on the peripheral region PER and the logic cell region LGC, and may cover the second insulating layer IL. The high-k dielectric layer HK on the logic cell region LGC may also be formed in the third empty space ET3.

The first insulating layer EG, the second insulating layer IL and the high-k dielectric layer HK on the peripheral region PER may constitute the first gate insulating layer GI1. The dipole element diffused in the first insulating layer EG may be diffused into the second insulating layer IL, and thus the first gate insulating layer GI1 may have the concentration profile of the dipole element of FIG. 3. For example, as shown in FIG. 3, the second concentration CN2 in the second insulating layer IL may be the maximum value of the concentration of the dipole element in the first gate insulating layer GI1.

The second insulating layer IL and the high-k dielectric layer HK on the logic cell region LGC may constitute the second gate insulating layer GI2. The second gate insulating layer GI2 may be thinner than the first gate insulating layer GI1. This may be because the first gate insulating layer GI1 further includes the first insulating layer EG as compared with the second gate insulating layer GI2.

First and second gate electrodes GE1 and GE2 may be formed in the first and second empty spaces ET1 and ET2, respectively. A gate capping pattern GP may be formed on each of the first and second gate electrodes GE1 and GE2. The second gate electrode GE2 on the logic cell region LGC may completely fill the third empty space ET3.

Referring again to FIGS. 1 and 2A to 2H, a second interlayer insulating layer 120 may be formed on the first interlayer insulating layer 110. The second interlayer insulating layer 120 may include a silicon oxide ($SiO_2$) layer. Active contacts AC may be formed in the second and first interlayer insulating layers 120 and 110, and may penetrate the second and first interlayer insulating layers 120 and 110 so as to be electrically connected to the first to fourth source/drain patterns SD1 to SD4. Gate contacts GC may be formed to penetrate the second interlayer insulating layer 120 and the gate capping patterns GP, and may be electrically connected to the first and second gate electrodes GE1 and GE2.

A third interlayer insulating layer 130 may be formed on the active contacts AC and the gate contacts GC. A first metal layer may be formed in the third interlayer insulating layer 130, and may include first interconnection lines M1, first vias V1, and second vias V2. The first via V1 may electrically connect the active contact AC to a corresponding one of the first interconnection lines M1. The second via V2 may electrically connect the gate contact GC to a corresponding one of the first interconnection lines M1.

An annealing process performed at a high temperature may be required to diffuse a dipole element contained in a metal oxide layer into a gate insulating layer thereunder. A source/drain pattern and a channel pattern may be deteriorated by the annealing process. This may reduce performance of a semiconductor device. However, according to the exemplary embodiments of the present inventive concept, the dipole element may be diffused from the first metal oxide layer DPL1 into the first insulating layer EG before forming the first to fourth source/drain patterns SD1 to SD4, as described above with reference to FIGS. 6 and 7A to 7D. Thus, deterioration of the semiconductor device by the annealing process may be prevented.

Figure 12:
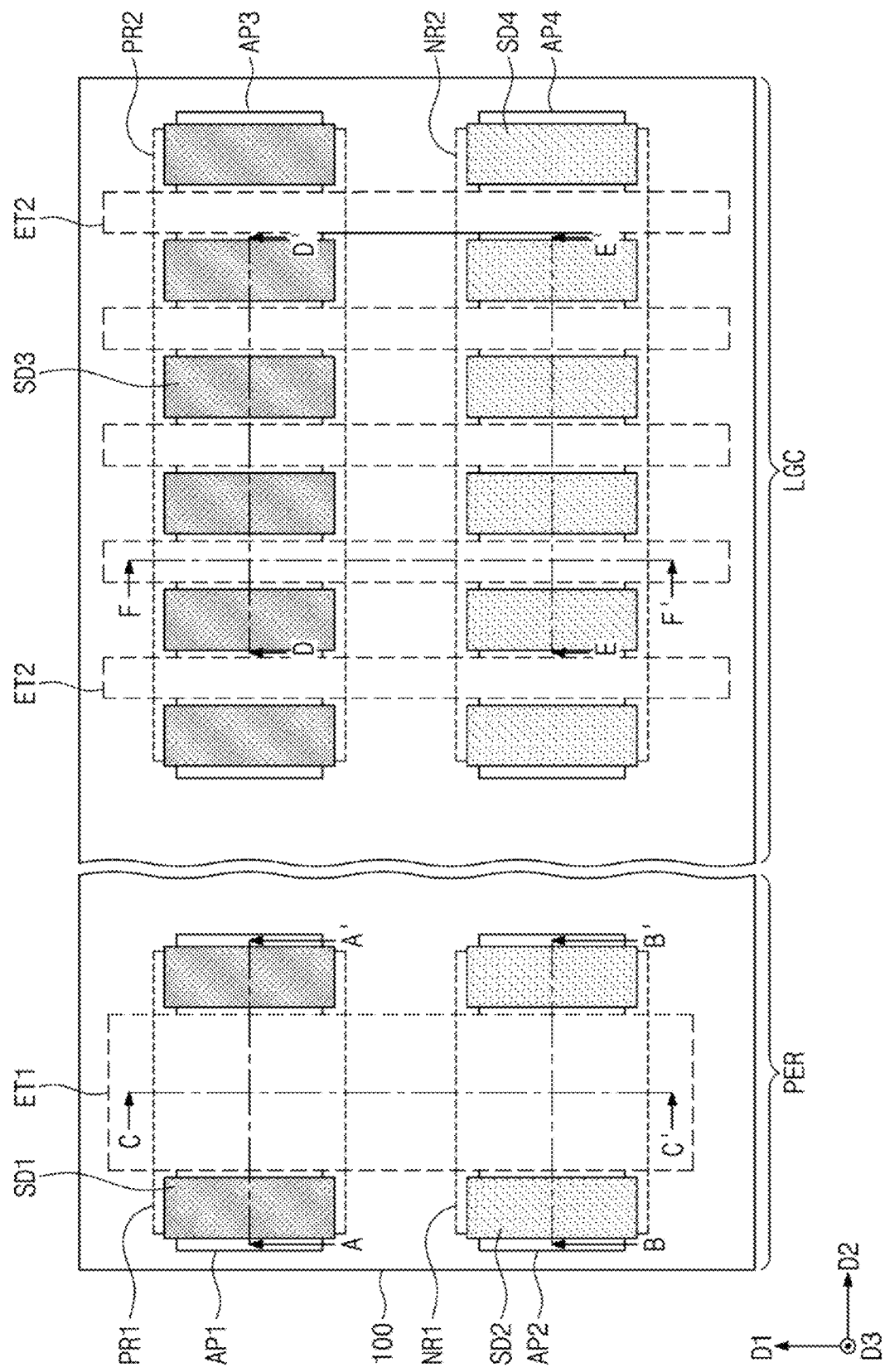
Figure 13A:
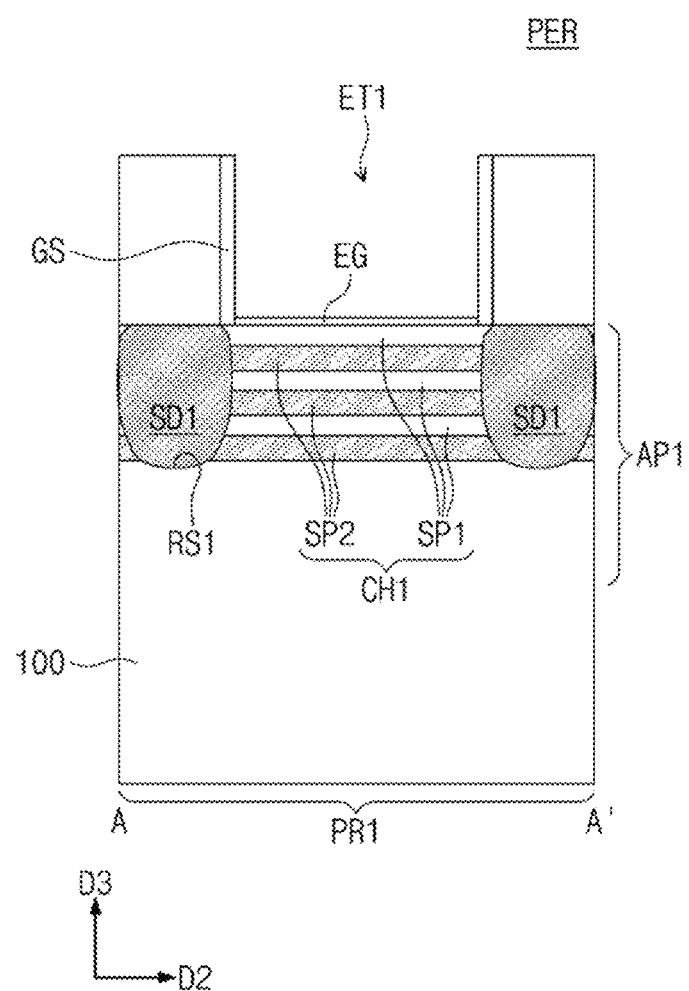
Figure 13B:
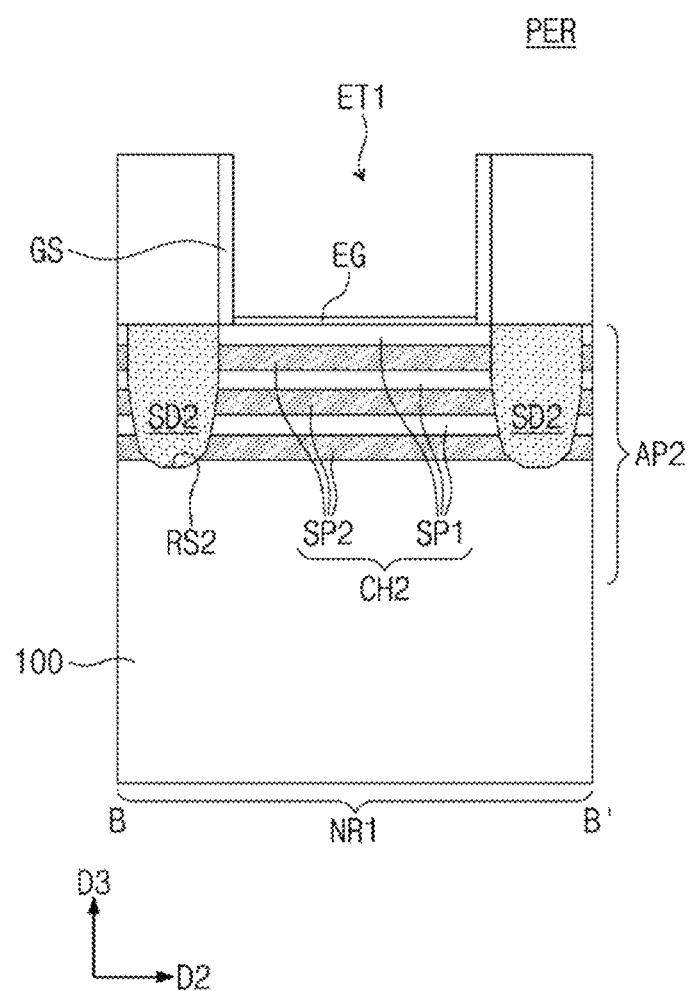
Figure 13C:
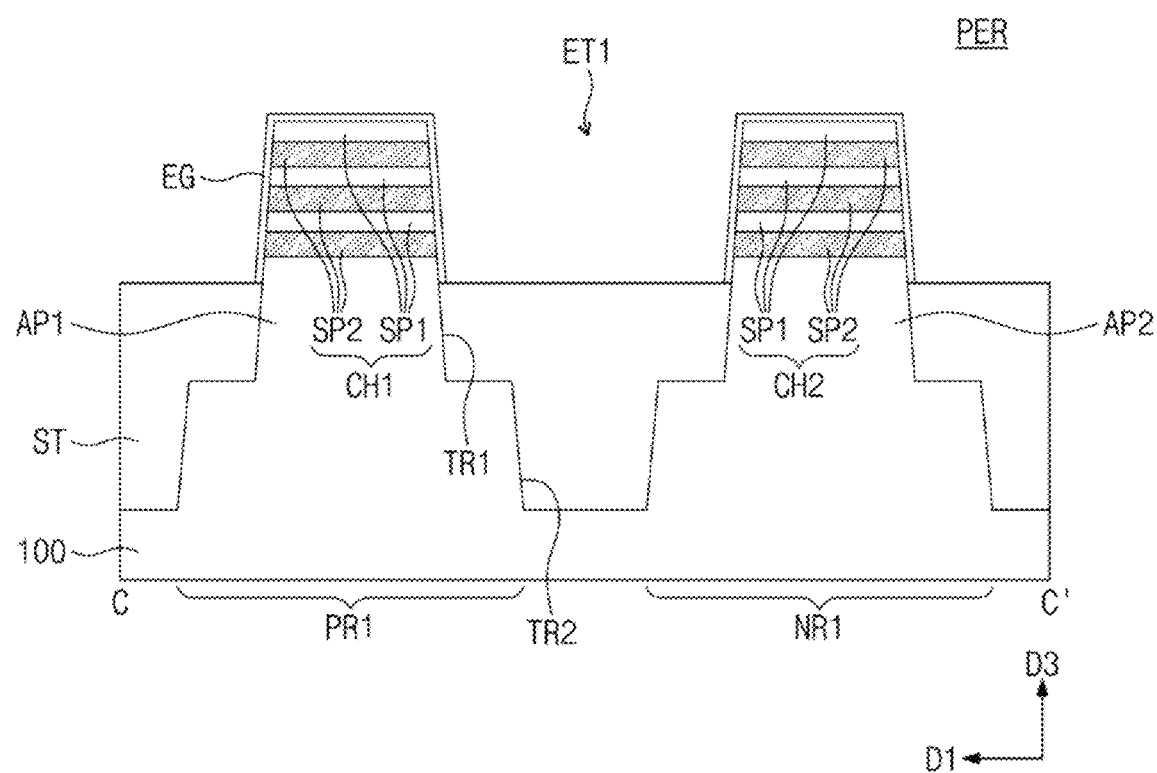
Figure 13D:
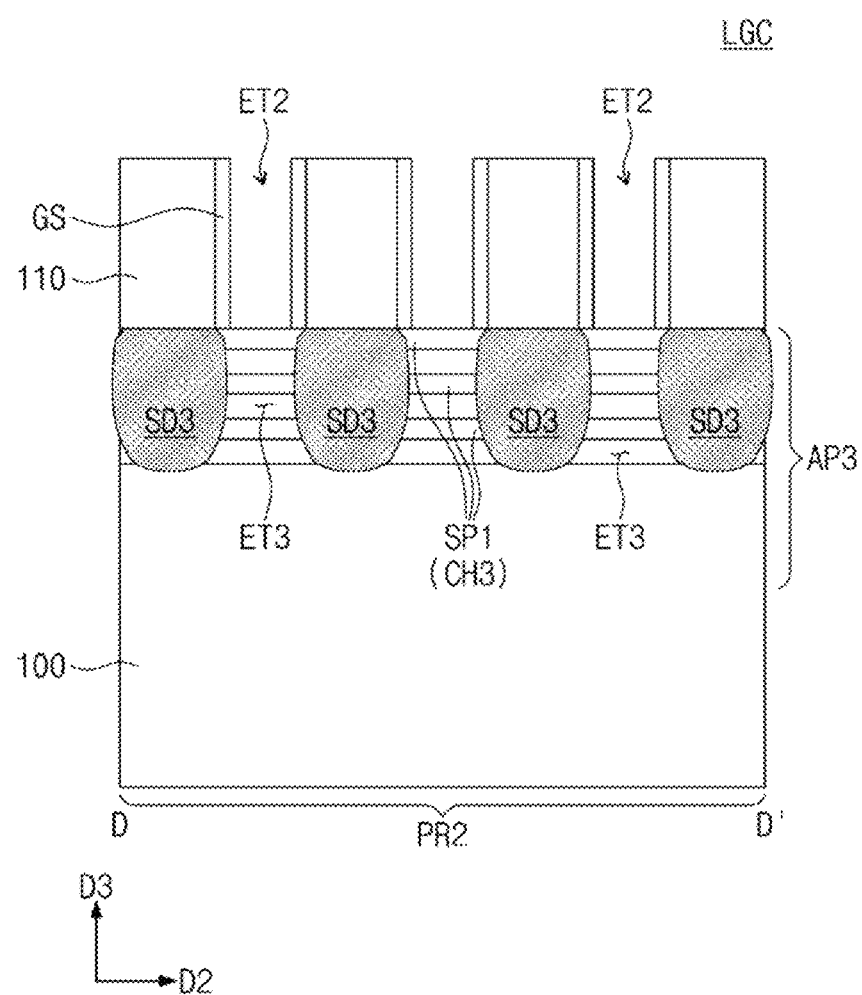
Figure 13E:
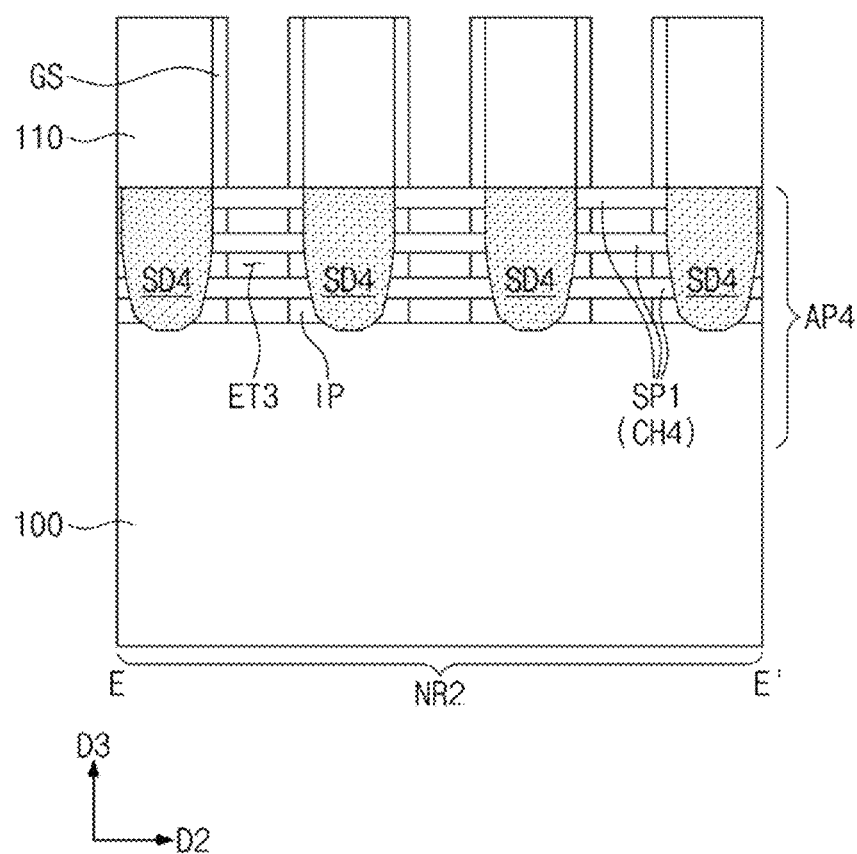
Figure 13F:
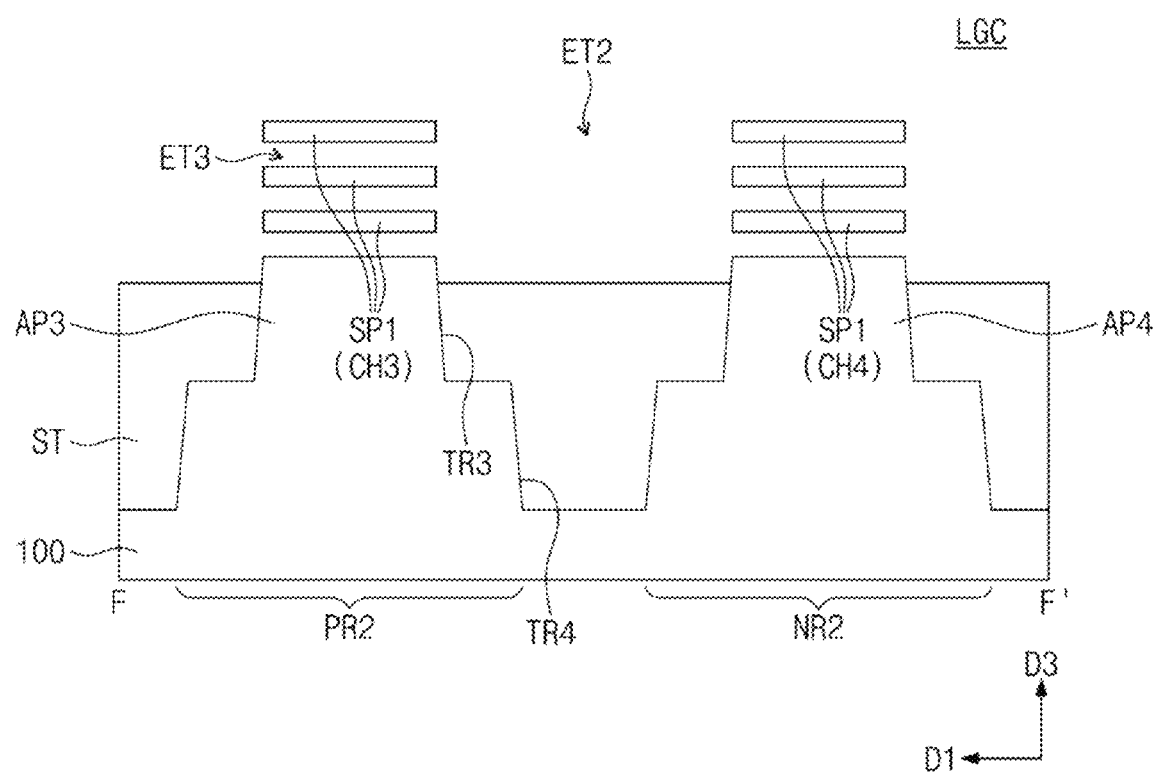
Figure 14:
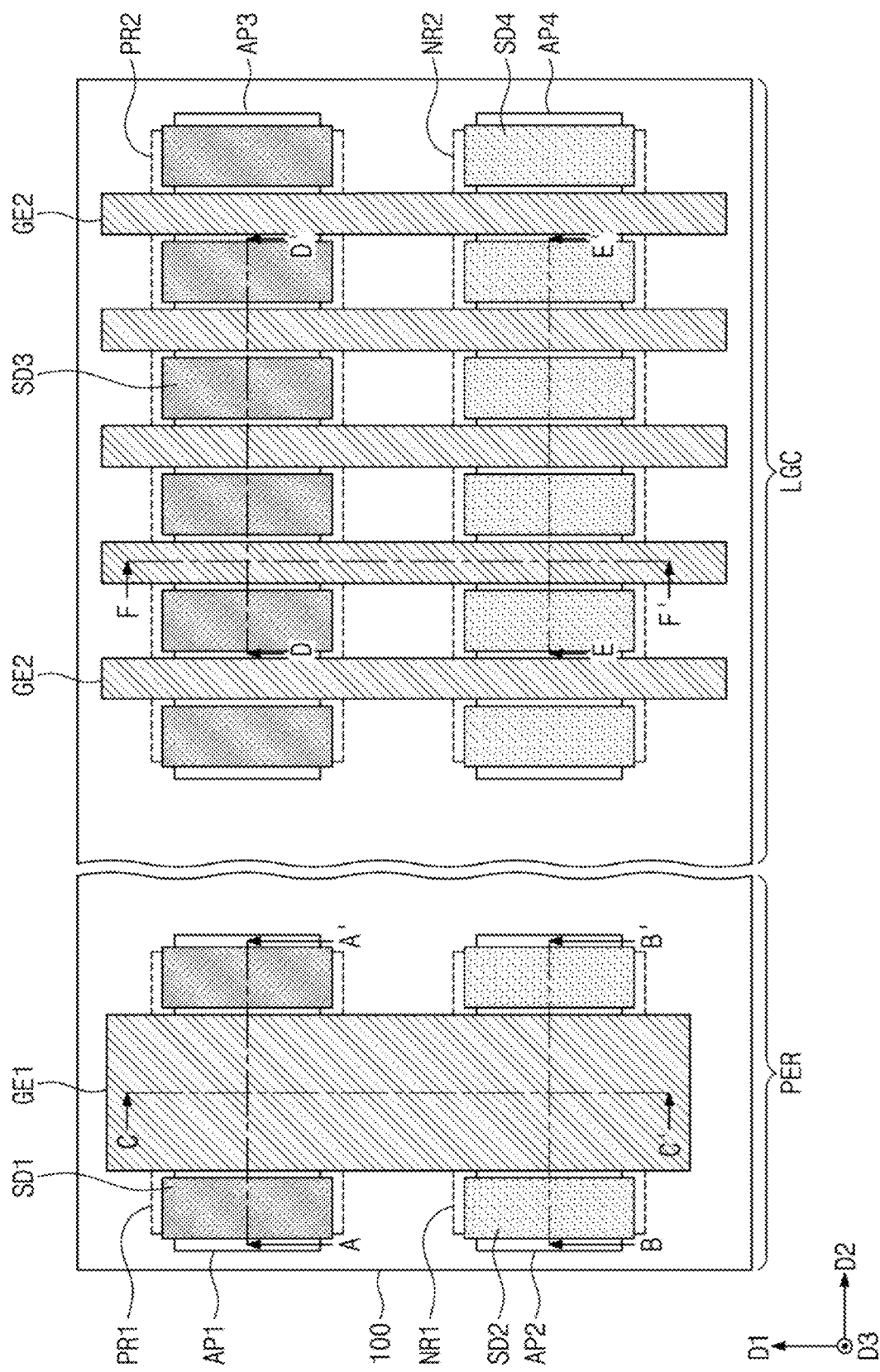
Figure 16A:
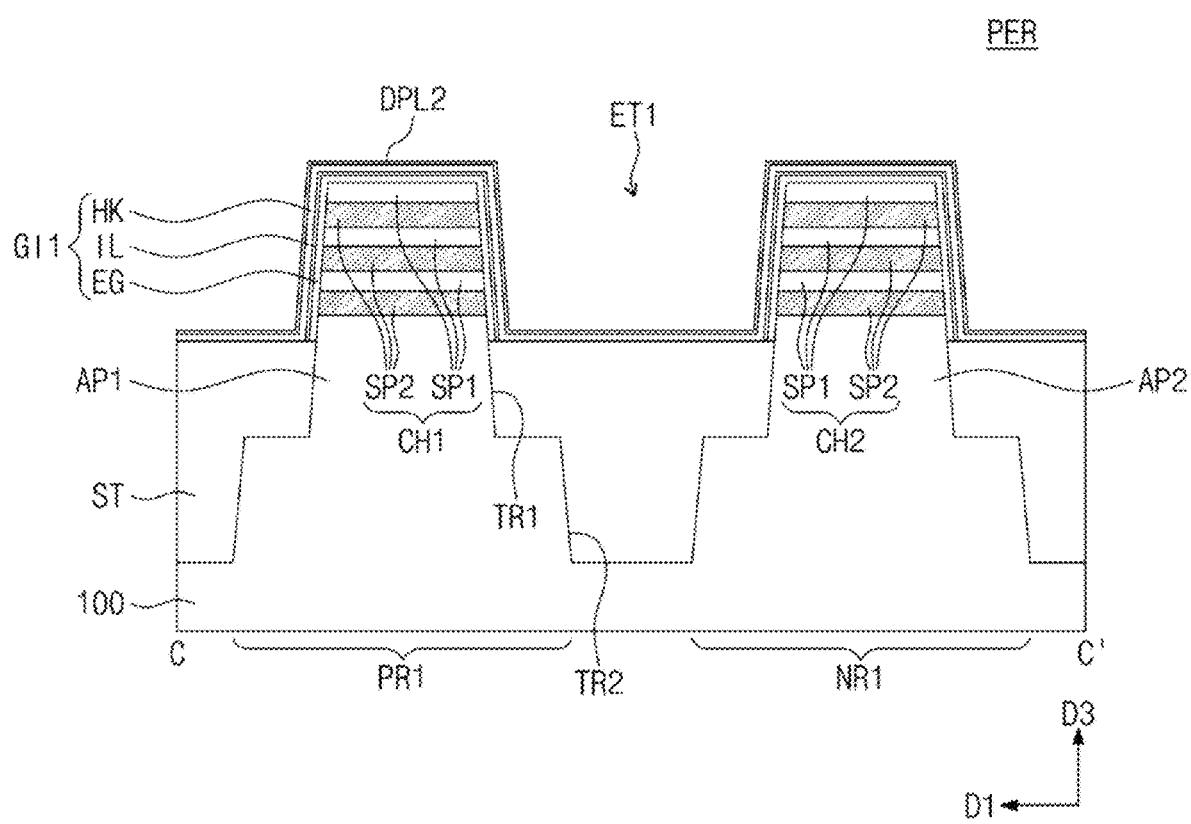
FIGS. 16A and 16B are cross-sectional views taken along lines C-C' and F-F' of FIG. 12, respectively, to illustrate a method for manufacturing a semiconductor device according to an exemplary embodiment of the present inventive concept.
Figure 16B:
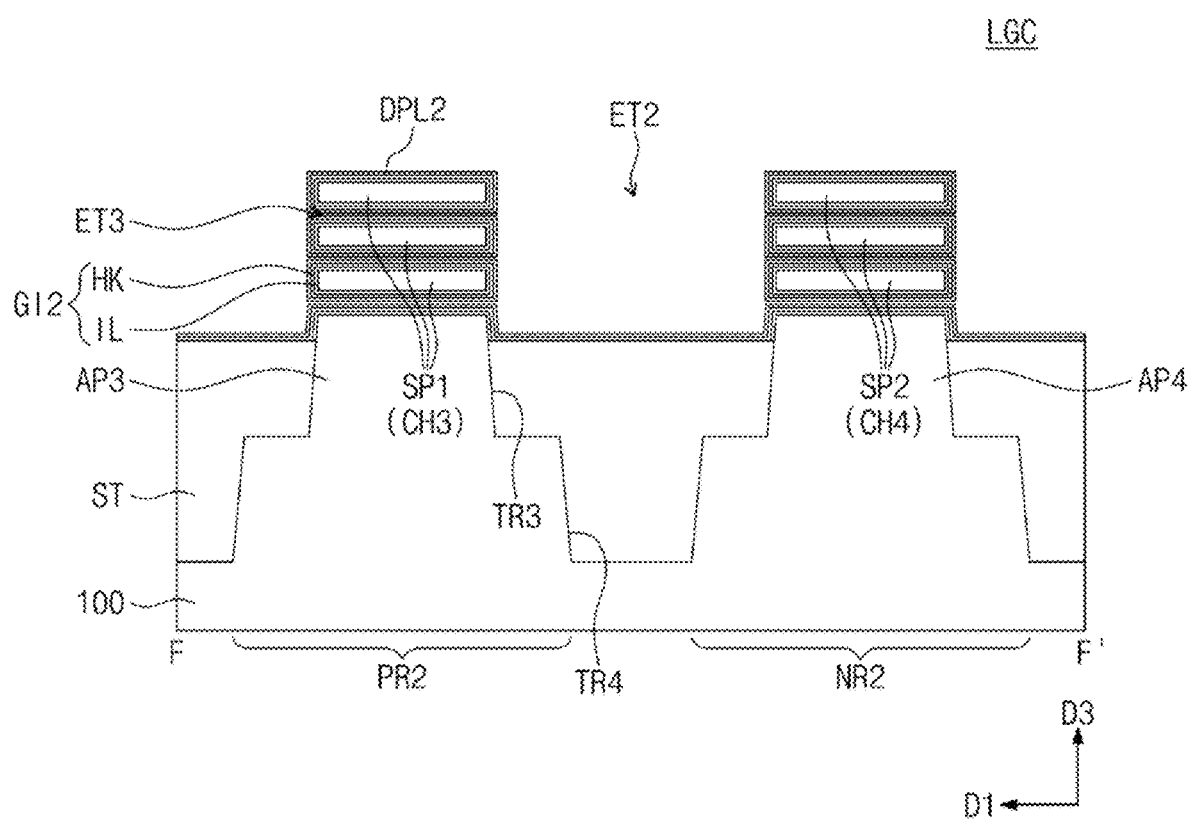

FIGS. 16A and 16B are cross-sectional views taken along lines C-C' and F-F' of FIG. 12, respectively, to illustrate a method for manufacturing a semiconductor device according to an exemplary embodiment of the present inventive concept. In the present exemplary embodiment, the descriptions to the same technical features as in the exemplary embodiments of FIGS. 4 to 15F will be omitted for the purpose of ease and convenience in explanation. In other words, differences between the present exemplary embodiments and the exemplary embodiments of FIGS. 4 to 15F will be mainly described hereinafter.

Referring to FIGS. 16A and 16B, the first gate insulating layer GI1 and the second gate insulating layer GI2 may be formed on the resultant structure of FIGS. 12 and 13A to 13F. A second metal oxide layer DPL2 may be formed on the high-k dielectric layer HK of each of the first and second gate insulating layers GI1 and GI2. The second metal oxide layer DPL2 may contain, for example, lanthanum (La) or aluminum (Al), which is a dipole element. For example, the second metal oxide layer DPL2 may include a lanthanum oxide ($La_2O_3$) layer or an aluminum oxide ($Al_2O_3$) layer.

After the formation of the second metal oxide layer DPL2, an annealing process may be performed to diffuse the dipole element contained in the second metal oxide layer DPL2 into the first and second gate insulating layers GI1 and GI2. In other words, the dipole element diffused from the second metal oxide layer DPL2 may be injected into the first and second gate insulating layers GI1 and GI2 as impurities. For example, since the second metal oxide layer DPL1 may contain, for example, lanthanum (La) or aluminum (Al) as the dipole element, the first and second gate insulating layers GI1 and GI2 may include lanthanum (La) or aluminum (Al) as impurities after the annealing process.

According to the present exemplary embodiment, the dipole element may be injected into the first and second gate insulating layers GI1 and GI2 by using the second metal oxide layer DPL2. Thus, threshold voltages of the transistors of the peripheral region PER and threshold voltages of the transistors of the logic cell region LGC may be adjusted. As a result, the semiconductor device according to the present exemplary embodiment may have high reliability and excellent electrical characteristics.

A concentration of the dipole element in the first gate insulating layer GI1 on the peripheral region PER may be relatively high by the injection of the dipole element by the first metal oxide layer DPL1 of FIGS. 6 and 7A to 7D and the injection of the dipole element by the second metal oxide layer DPL2 of FIGS. 16A and 16B. Thus, the concentration of the dipole element in the first gate insulating layer GI1 may be higher than a concentration of the dipole element in the second gate insulating layer GI2.

The first gate insulating layer GI1 and the second gate insulating layer GI2 may include different dipole elements from each other. For example, the first gate insulating layer GI1 may include lanthanum (La) and aluminum (Al). On the other hand, the second gate insulating layer GI2 may include a single dipole element (i.e., lanthanum (La) or aluminum (Al)). This may be because the first gate insulating layer GI1 receives different dipole elements from the first and second metal oxide layers DPL1 and DPL2, respectively. However, the present inventive concept is not limited thereto. For example, in an exemplary embodiment of the present inventive concept, the first and second gate insulating layers GI1 and GI2 may each include a single dipole element (i.e., lanthanum (La) or aluminum (Al)), with a concentration of the single dipole element included in the first gate insulating layer GI1 higher than that of the second gate insulating layer GI2.

As described above, according to the present exemplary embodiment, the threshold voltage of the transistor on the peripheral region PER may be adjusted using the concentration and the combination of the dipole elements in the first gate insulating layer GI1. As a result, the semiconductor device according to the present exemplary embodiment may have high reliability and excellent electrical characteristics.

Figure 17A:
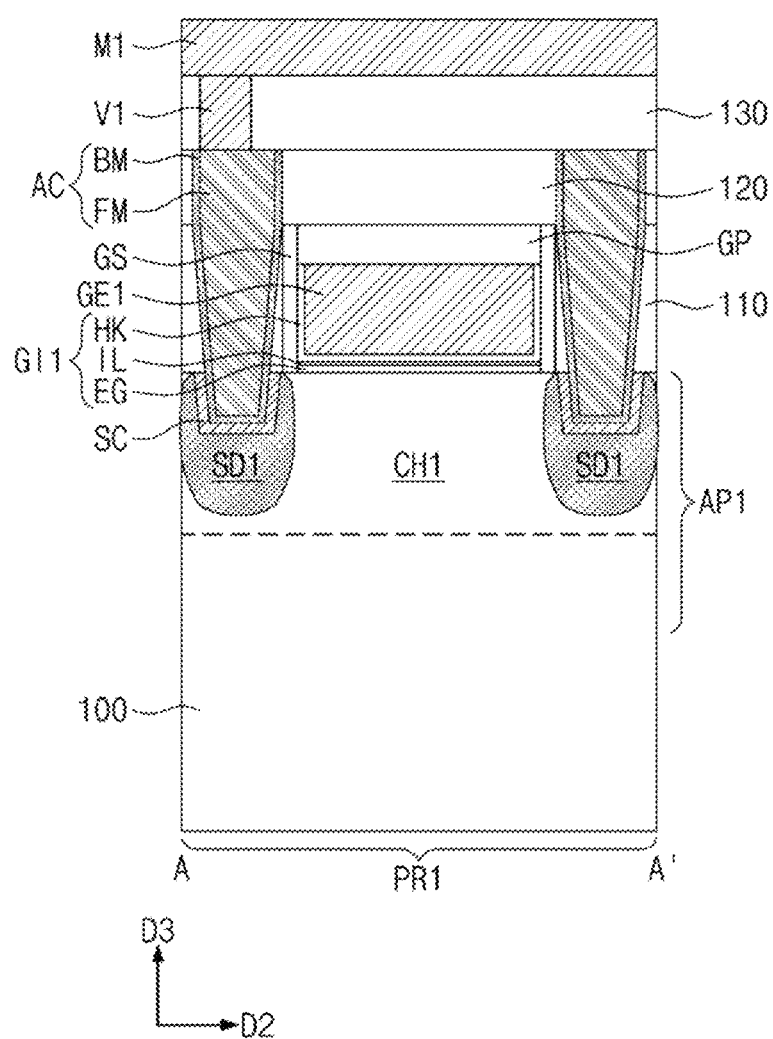
FIGS. 17A, 17B and 17C are cross-sectional views taken along lines A-A', B-B' and C-C' of FIG. 1, respectively, to illustrate a semiconductor device according to an exemplary embodiment of the present inventive concept.
Figure 17B:
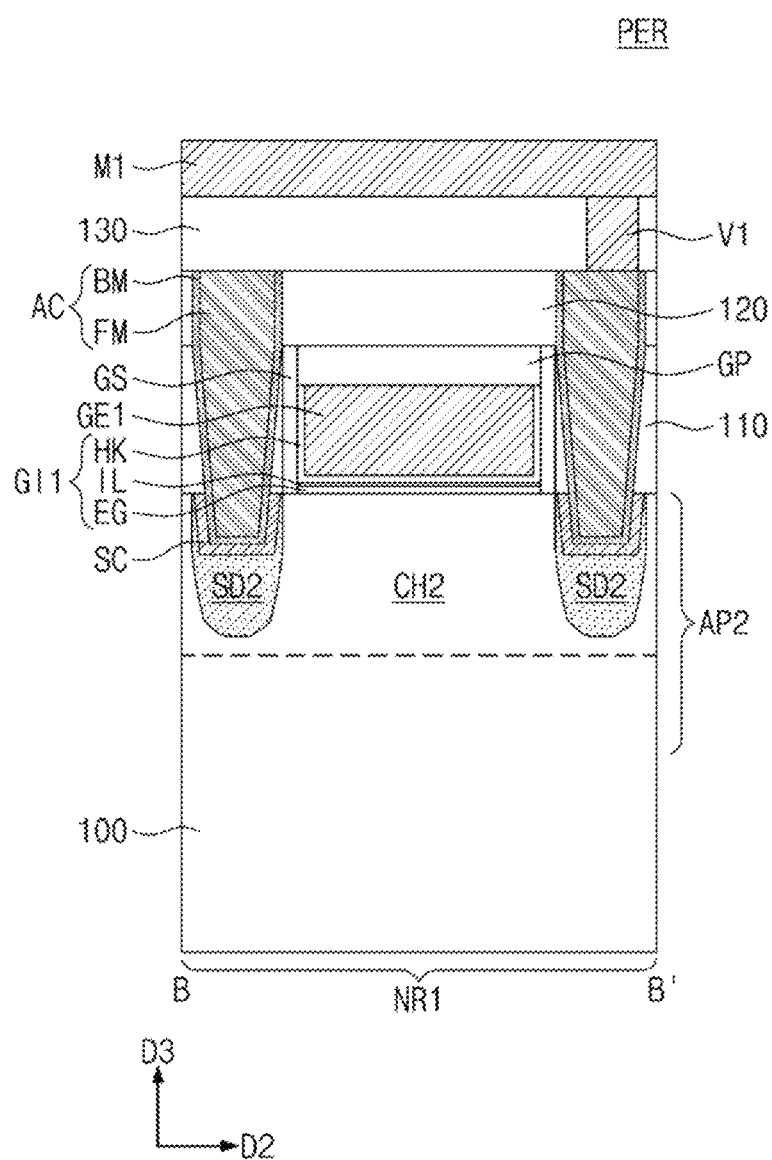
Figure 17C:
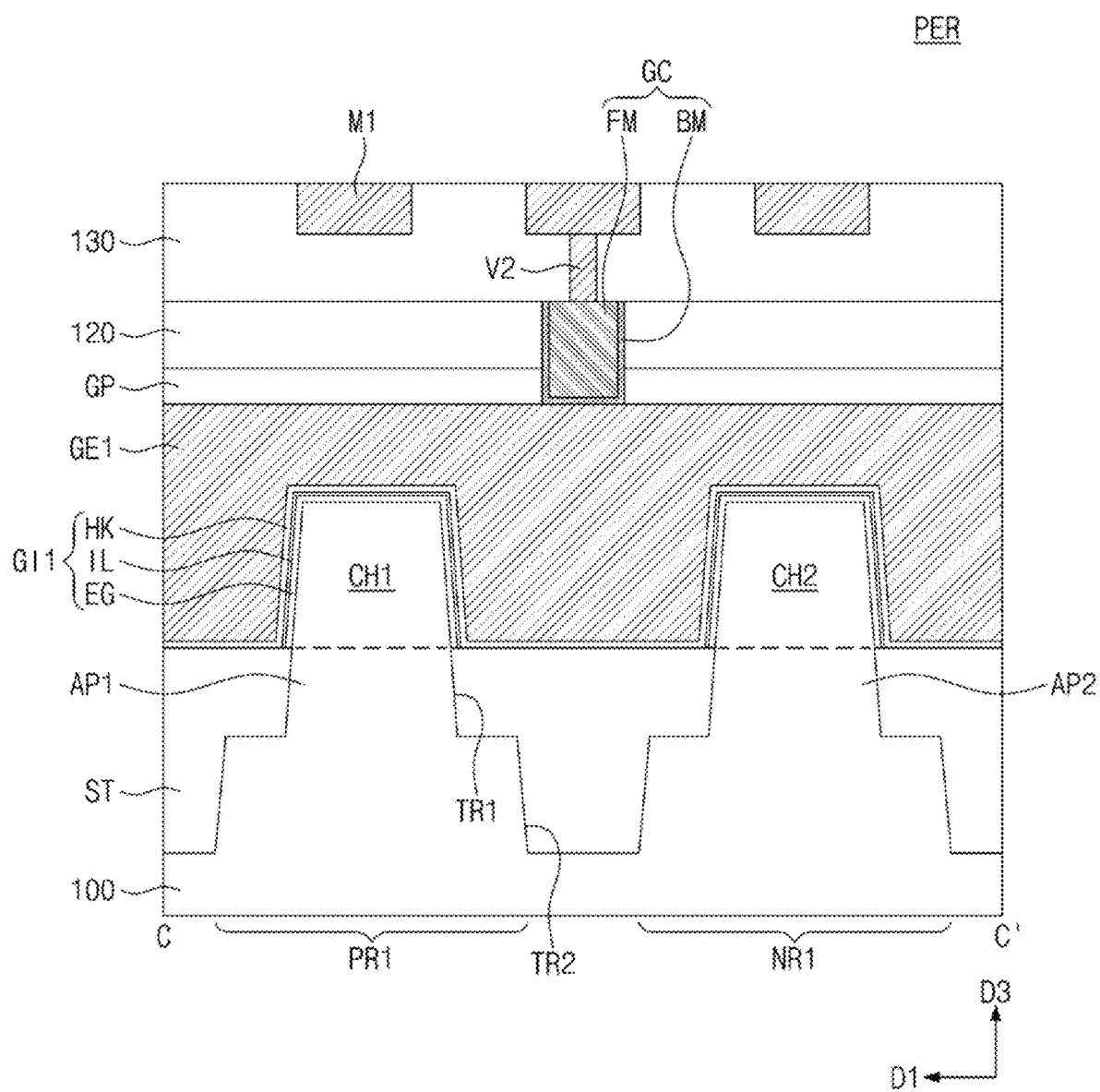

FIGS. 17A, 17B and 17C are cross-sectional views taken along lines A-A', B-B' and C-C' of FIG. 1, respectively, to illustrate a semiconductor device according to an exemplary embodiment of the present inventive concept. In the present exemplary embodiment, the descriptions of the same technical features as those in the exemplary embodiment of FIGS. 1 and 2A to 2H will be omitted for the purpose of ease and convenience in explanation. In other words, differences between the present exemplary embodiment and the exemplary embodiment of FIGS. 1 and 2A to 2H will be mainly described hereinafter.

Referring to FIGS. 1 and 17A to 17C, first and second active patterns AP1 and AP2 may not include the first and second semiconductor patterns SP1 and SP2 alternately stacked, unlike the first and second active patterns AP1 and AP2 of FIGS. 1 and 2A to 2C. In other words, each of upper portions of the first and second active patterns AP1 and AP2 may have a single fin shape protruding upward from the device isolation layer ST. That is, transistors of the peripheral region PER according to the present exemplary embodiment may be fin field-effect transistors (FinFETs).

Although transistors of the peripheral region PER may be FinFETs without having the first and second semiconductor patterns SP1 and SP2, transistors on the logic cell region LGC may be MBCFETs in which the second gate electrode GE2 three-dimensionally surrounds each of the first semiconductor patterns SP1 (i.e., channels) as described above with reference to FIGS. 1 and 2E to 2H. According to the present exemplary embodiment, the first gate insulating layers GI1 of the FinFETs and the second gate insulating layers GI2 of the MBCFETs may include one or more dipole elements as impurities. Thus, threshold voltages of the FinFETs of the peripheral region PER and threshold voltages of the MBCFETs of the logic cell region LGC may be adjusted.

According to the exemplary embodiments of the present inventive concept, the dipole element may be stably injected into the gate insulating layer without deterioration of the device by the annealing process. The threshold voltage of the transistor may be adjusted using the dipole element. As a result, the semiconductor device according to the exemplary embodiments of the present inventive concept may have high reliability and excellent electrical characteristics.

While the present inventive concept has been described with reference to the preferred exemplary embodiments, it will be apparent to those skilled in the art that various changes and modifications may be made without departing from the spirits and scopes of the present inventive concept. Therefore, it should be understood that the above exemplary embodiment are not limiting, but illustrative. Thus, the scopes of the present inventive concept are to be determined by the broadest permissible interpretation of the following claims and their equivalents, and shall not be restricted or limited by the foregoing description.

What is claimed is:

1. A semiconductor device comprising:
a substrate including a peripheral region;
a first active pattern provided on the peripheral region of the substrate, the first active pattern having an upper portion including first semiconductor patterns and second semiconductor patterns which are alternately stacked;
a first gate electrode intersecting the first active pattern;
a pair of first source/drain patterns provided at both sides of the first gate electrode, respectively; and
a first gate insulating layer disposed between the first gate electrode and the first active pattern,
wherein the first gate insulating layer comprises:
a first insulating layer formed on the first active pattern;
a second insulating layer formed on the first insulating layer; and
a high-k dielectric layer formed on the second insulating layer,
wherein the first gate insulating layer contains a first dipole element including lanthanum (La), aluminum (Al), or a combination thereof, and
wherein a concentration of the first dipole element in the first gate insulating layer increases from an interface between the first gate electrode and the high-k dielectric layer toward the second insulating layer, reaches a maximum value, and then, decreases toward an interface between the first insulating layer and an adjacent one of the first semiconductor patterns.

2. The semiconductor device of claim 1, further comprising:
a second active pattern provided on a logic cell region of the substrate, wherein an upper portion of the second active pattern includes third semiconductor patterns stacked and spaced apart from each other;
a second gate electrode intersecting the second active pattern;
a pair of second source/drain patterns provided at both sides of the second gate electrode, respectively; and
a second gate insulating layer disposed between the second gate electrode and the second active pattern,
wherein the first semiconductor patterns and the third semiconductor patterns include a same semiconductor material, and
wherein a thickness of the first gate insulating layer is greater than a thickness of the second gate insulating layer.

3. The semiconductor device of claim 2, wherein the second gate electrode and the second gate insulating layer fill a space between the third semiconductor patterns vertically adjacent to each other.

4. The semiconductor device of claim 2, wherein a width of the first gate electrode is greater than a width of the second gate electrode.

5. The semiconductor device of claim 2, wherein
the second gate insulating layer contains a second dipole element including lanthanum (La) or aluminum (Al), and
a maximum concentration of the first dipole element in the first gate insulating layer is greater than a maximum concentration of the second dipole element in the second gate insulating layer.

6. The semiconductor device of claim 1, wherein a concentration of the first dipole element at the interface between the first gate electrode and the high-k dielectric layer is less than a concentration of the first dipole element at the interface between the first insulating layer and the adjacent one of the first semiconductor patterns.

7. The semiconductor device of claim 1, wherein the first dipole element includes the combination of lanthanum (La) and aluminum (Al).

8. The semiconductor device of claim 1, wherein the first and second semiconductor patterns constitute a channel pattern connecting the pair of first source/drain patterns.

9. The semiconductor device of claim 1, further comprising:
a first interlayer insulating layer disposed on the first gate electrode;
an active contact penetrating the first interlayer insulating layer and being electrically connected to at least one of the first source/drain patterns;
a second interlayer insulating layer disposed on the first interlayer insulating layer; and
a first metal layer provided in the second interlayer insulating layer and electrically connected to the active contact.

10. A semiconductor device comprising:
a substrate including a first region and a second region;
a first active pattern and a second active pattern provided on the first region and the second region of the substrate, respectively;
a first gate electrode and a second gate electrode intersecting the first active pattern and the second active pattern, respectively;
a first gate insulating layer disposed between the first gate electrode and the first active pattern; and
a second gate insulating layer disposed between the second gate electrode and the second active pattern,
wherein the first gate insulating layer contains a first dipole element including lanthanum (La), aluminum (Al), or a combination thereof,
wherein the second gate insulating layer contains a second dipole element including lanthanum (La) or aluminum (Al),
wherein a thickness of the first gate insulating layer is greater than a thickness of the second gate insulating layer, and
wherein a maximum concentration of the first dipole element in the first gate insulating layer is greater than a maximum concentration of the second dipole element in the second gate insulating layer.

11. The semiconductor device of claim 10, wherein a width of the first gate electrode is greater than a width of the second gate electrode.

12. The semiconductor device of claim 10, wherein
an upper portion of the first active pattern includes first semiconductor patterns and second semiconductor patterns which are alternately stacked,
an upper portion of the second active pattern includes third semiconductor patterns stacked and spaced apart from each other, and
the first semiconductor patterns and the third semiconductor patterns include a same semiconductor material.

13. The semiconductor device of claim 12, wherein the second gate electrode and the second gate insulating layer fill a space between the third semiconductor patterns vertically adjacent to each other.

14. The semiconductor device of claim 10, wherein
the first region is a peripheral region, and
the second region is a logic cell region.

15. The semiconductor device of claim 10, wherein the first gate insulating layer comprises:
a first insulating layer formed on the first active pattern;
a second insulating layer formed on the first insulating layer; and a high-k dielectric layer formed on the second insulating layer, wherein a concentration of the first dipole element in the first gate insulating layer increases from an interface between the first gate electrode and the high-k dielectric layer toward the second insulating layer, reaches a maximum value, and then, decreases toward an interface between the first insulating layer and the first active pattern.

16. The semiconductor device of claim 15, wherein a concentration of the first dipole element at the interface between the first gate electrode and the high-k dielectric layer is less than a concentration of the first dipole element at the interface between the first insulating layer and the first active pattern.

17. A semiconductor device comprising:
a substrate including a peripheral region;
a device isolation layer provided on the peripheral region of the substrate to define a first active pattern;
a pair of first source/drain patterns provided on the first active pattern;
first semiconductor patterns and second semiconductor patterns provided between the first source/drain patterns, wherein the first semiconductor patterns and the second semiconductor patterns are alternately stacked on the first active pattern, and a bottom surface of a lowermost one of the second semiconductor patterns is higher than a top surface of the device isolation layer;
a first gate electrode intersecting the first semiconductor patterns and second semiconductor patterns on the first active pattern;
a first gate insulating layer disposed between the first gate electrode and the first and second semiconductor patterns;
a pair of gate spacers provided on both sidewalls of the first gate electrode, respectively;
a gate capping pattern disposed on the first gate electrode;
a first interlayer insulating layer disposed on the gate capping pattern;
an active contact penetrating the first interlayer insulating layer and being electrically connected to at least one of the first source/drain patterns;
a second interlayer insulating layer disposed on the first interlayer insulating layer; and
a first metal layer provided in the second interlayer insulating layer and electrically connected to the active contact,
wherein the first gate insulating layer comprises:
a first insulating layer formed on the first and second semiconductor patterns; a second insulating layer formed on the first insulating layer; and
a high-k dielectric layer formed on the second insulating layer,
wherein the high-k dielectric layer is disposed between the second insulating layer and the first gate electrode,
wherein the first gate insulating layer contains a dipole element, and
wherein a concentration of the dipole element at an interface between the first gate electrode and the high-k dielectric layer is less than a concentration of the dipole element at an interface between the first insulating layer and an adjacent one of the first semiconductor patterns.

18. The semiconductor device of claim 17, wherein the dipole element includes lanthanum (La), aluminum (Al), or a combination thereof.

19. The semiconductor device of claim 17, wherein a concentration of the dipole element in the first gate insulating layer increases from the interface between the first gate electrode and the high-k dielectric layer toward the second insulating layer, reaches a maximum value, and then, decreases toward the interface between the first insulating layer and the adjacent one of the first semiconductor patterns.

20. The semiconductor device of claim 17, wherein the substrate further includes a logic cell region, and the device isolation layer also defines a second active pattern on the logic cell region, with the semiconductor device further comprising:
a pair of second source/drain patterns provided on the second active pattern;
third semiconductor patterns provided between the pair of second source/drain patterns, the third semiconductor patterns stacked on the second active pattern and spaced apart from each other;
a second gate electrode intersecting the third semiconductor patterns and surrounding each of the third semiconductor patterns; and
a second gate insulating layer disposed between the second gate electrode and the third semiconductor patterns,
wherein the first semiconductor patterns and the third semiconductor patterns include a same semiconductor material, and
wherein a thickness of the first gate insulating layer is greater than a thickness of the second gate insulating layer.

* * * * *